United States Patent
Chiruvolu et al.

(10) Patent No.: US 9,006,720 B2
(45) Date of Patent: Apr. 14, 2015

(54) SILICON/GERMANIUM NANOPARTICLES AND INKS HAVING LOW METAL CONTAMINATION

(71) Applicant: NanoGram Corporation, Milpitas, CA (US)

(72) Inventors: Shivkumar Chiruvolu, San Jose, CA (US); Igor Altman, Fremont, CA (US); Bernard M. Frey, Livermore, CA (US); Weidong Li, San Jose, CA (US); Guojun Liu, San Jose, CA (US); Robert B. Lynch, Livermore, CA (US); Gina Elizabeth Pengra-Leung, San Jose, CA (US); Uma Srinivasan, Mountain View, CA (US)

(73) Assignee: NanoGram Corporation, Milpitas, CA (US)

( * ) Notice: Subject to any disclaimer, the term of this patent is extended or adjusted under 35 U.S.C. 154(b) by 0 days.

(21) Appl. No.: 13/858,240

(22) Filed: Apr. 8, 2013

(65) Prior Publication Data
US 2013/0221286 A1    Aug. 29, 2013

Related U.S. Application Data

(63) Continuation of application No. 13/070,286, filed on Mar. 23, 2011.

(60) Provisional application No. 61/359,662, filed on Jun. 29, 2010.

(51) Int. Cl.
*H01L 51/00* (2006.01)
*C09D 5/24* (2006.01)
(Continued)

(52) U.S. Cl.
CPC .............. *C09D 5/24* (2013.01); *H01L 23/4828* (2013.01); *H01L 23/53276* (2013.01);
(Continued)

(58) Field of Classification Search
CPC ....................................................... B82Y 30/00
USPC ................. 438/99, 758, 780, 800, FOR. 135, 438/FOR. 385; 977/773, 774, 775, 786, 977/787; 427/213.3, 213.31, 388.4; 257/40, 257/616; 422/186; 252/512; 106/31.92; 204/157.15, 157.41
See application file for complete search history.

(56) References Cited

U.S. PATENT DOCUMENTS 3,645,939 A    2/1972    Gaylord
4,071,494 A    1/1978    Gaylord
(Continued)

FOREIGN PATENT DOCUMENTS

EP    0018634 A1    11/1980
EP    1054035 A2    11/2000
(Continued)

OTHER PUBLICATIONS

Brunauer et al., "Adsorption of Gases in Multimolecular Layers," J. Am. Chem. Soc., 60, 309-319 (1938).
(Continued)

*Primary Examiner* — Victor A Mandala
*Assistant Examiner* — Quovaunda V Jefferson
(74) *Attorney, Agent, or Firm* — Dardi & Herbert, PLLC; Peter S. Dardi

(57) ABSTRACT

Laser pyrolysis reactor designs and corresponding reactant inlet nozzles are described to provide desirable particle quenching that is particularly suitable for the synthesis of elemental silicon particles. In particular, the nozzles can have a design to encourage nucleation and quenching with inert gas based on a significant flow of inert gas surrounding the reactant precursor flow and with a large inert entrainment flow effectively surrounding the reactant precursor and quench gas flows. Improved silicon nanoparticle inks are described that has silicon nanoparticles without any surface modification with organic compounds. The silicon ink properties can be engineered for particular printing applications, such as inkjet printing, gravure printing or screen printing. Appropriate processing methods are described to provide flexibility for ink designs without surface modifying the silicon nanoparticles.

25 Claims, 34 Drawing Sheets

(51) Int. Cl.

| | |
|---|---|
| B01J 19/12 | (2006.01) |
| B82Y 30/00 | (2011.01) |
| C09D 7/12 | (2006.01) |
| C09D 7/14 | (2006.01) |
| C09D 11/101 | (2014.01) |
| C09D 11/52 | (2014.01) |
| H01L 21/02 | (2006.01) |
| H01L 31/0236 | (2006.01) |
| H01L 31/0368 | (2006.01) |
| H01L 31/0376 | (2006.01) |
| H01L 31/0747 | (2012.01) |
| H01L 31/18 | (2006.01) |
| H01L 31/00 | (2006.01) |
| H01L 23/482 | (2006.01) |
| H01L 23/532 | (2006.01) |
| C08K 3/08 | (2006.01) |
| C08K 3/36 | (2006.01) |
| C08K 9/02 | (2006.01) |

(52) U.S. Cl.
CPC ....... B01J 19/121 (2013.01); *B01J 2219/0869* (2013.01); *B01J 2219/0871* (2013.01); *B01J 2219/0875* (2013.01); B82Y 30/00 (2013.01); *C08K 3/08* (2013.01); *C08K 3/36* (2013.01); *C08K 9/02* (2013.01); *C09D 7/1266* (2013.01); *C09D 7/1275* (2013.01); *C09D 7/14* (2013.01); *C09D 11/101* (2013.01); *C09D 11/52* (2013.01); *H01L 21/02532* (2013.01); *H01L 21/02573* (2013.01); *H01L 21/02579* (2013.01); *H01L 21/02581* (2013.01); *H01L 21/02601* (2013.01); *H01L 21/02628* (2013.01); *Y02E 10/52* (2013.01); *H01L 31/02363* (2013.01); *H01L 31/03682* (2013.01); *H01L 31/03762* (2013.01); *H01L 31/0747* (2013.01); *H01L 31/182* (2013.01); *H01L 31/1864* (2013.01); *H01L 31/00* (2013.01)

(56) References Cited

U.S. PATENT DOCUMENTS

| | | | |
|---|---|---|---|
| 4,317,762 A | | 3/1982 | Kratel et al. |
| 4,330,358 A | | 5/1982 | Grabmaier et al. |
| 4,390,743 A | | 6/1983 | Dahlberg |
| 4,425,384 A | | 1/1984 | Brownscombe |
| 4,478,963 A | | 10/1984 | McGarry |
| 4,595,749 A | | 6/1986 | Hoxmeier |
| 4,786,477 A | | 11/1988 | Yoon et al. |
| 4,828,695 A | | 5/1989 | Yamamura et al. |
| 4,947,219 A | | 8/1990 | Boehm |
| 4,972,008 A | | 11/1990 | Lee et al. |
| 5,132,248 A | | 7/1992 | Drummond et al. |
| 5,179,185 A | | 1/1993 | Yamamoto et al. |
| 5,262,357 A | | 11/1993 | Alivisatos et al. |
| 5,372,749 A | | 12/1994 | Li et al. |
| 5,374,413 A | | 12/1994 | Kim et al. |
| 5,429,708 A | | 7/1995 | Linford et al. |
| 5,489,449 A | | 2/1996 | Umeya et al. |
| 5,491,114 A | | 2/1996 | Goldstein |
| 5,559,057 A | | 9/1996 | Goldstein |
| 5,565,188 A | * | 10/1996 | Wong et al. ................ 424/9.411 |
| 5,576,248 A | | 11/1996 | Goldstein |
| 5,695,617 A | | 12/1997 | Graiver et al. |
| 5,801,108 A | | 9/1998 | Huang et al. |
| 5,850,064 A | | 12/1998 | Goldstein |
| 5,866,471 A | | 2/1999 | Beppu et al. |
| 5,958,348 A | | 9/1999 | Bi et al. |
| 5,990,479 A | | 11/1999 | Weiss et al. |
| 6,005,707 A | | 12/1999 | Berggren et al. |
| 6,007,869 A | | 12/1999 | Schreieder et al. |
| 6,086,945 A | | 7/2000 | Kamata et al. |
| 6,100,464 A | | 8/2000 | Priesemuth |
| 6,136,905 A | | 10/2000 | Suzuki et al. |
| 6,268,041 B1 | | 7/2001 | Goldstein |
| 6,270,732 B1 | | 8/2001 | Gardner et al. |
| 6,281,427 B1 | | 8/2001 | Mitsuhiro et al. |
| 6,287,925 B1 | | 9/2001 | Yu |
| 6,348,295 B1 | | 2/2002 | Griffith et al. |
| 6,403,382 B1 | | 6/2002 | Zhu et al. |
| 6,416,721 B1 | | 7/2002 | Sanjurjo et al. |
| 6,476,098 B1 | | 11/2002 | Arakawa et al. |
| 6,531,191 B1 | | 3/2003 | Notenboom |
| 6,552,405 B2 | | 4/2003 | Sugawara et al. |
| 6,585,947 B1 | | 7/2003 | Nayfeh et al. |
| 6,586,785 B2 | | 7/2003 | Flagan et al. |
| 6,599,631 B2 | | 7/2003 | Kambe et al. |
| 6,712,999 B2 | | 3/2004 | Haering et al. |
| 6,727,645 B2 | | 4/2004 | Tsujimura et al. |
| 6,752,979 B1 | | 6/2004 | Talbot et al. |
| 6,759,711 B2 | | 7/2004 | Powell |
| 6,761,816 B1 | | 7/2004 | Blackburn et al. |
| 6,793,724 B2 | | 9/2004 | Satoh et al. |
| 6,794,265 B2 | | 9/2004 | Lee et al. |
| 6,808,577 B2 | | 10/2004 | Miyazaki et al. |
| 6,821,329 B2 | | 11/2004 | Choy |
| 6,846,565 B2 | | 1/2005 | Korgel et al. |
| 6,849,334 B2 | | 2/2005 | Horne et al. |
| 6,878,184 B1 | | 4/2005 | Rockenberger et al. |
| 6,881,490 B2 | | 4/2005 | Kambe et al. |
| 6,911,385 B1 | | 6/2005 | Haubrich et al. |
| 6,918,946 B2 | | 7/2005 | Korgel et al. |
| 6,998,288 B1 | | 2/2006 | Smith et al. |
| 7,001,578 B2 | | 2/2006 | Nayfeh et al. |
| 7,029,632 B1 | | 4/2006 | Weidhaus et al. |
| 7,038,655 B2 | | 5/2006 | Herb et al. |
| 7,045,851 B2 | | 5/2006 | Black et al. |
| 7,057,206 B2 | | 6/2006 | Halik et al. |
| 7,067,069 B2 | | 6/2006 | Shiho et al. |
| 7,067,337 B2 | | 6/2006 | Yudasaka et al. |
| 7,078,276 B1 | | 7/2006 | Zurcher et al. |
| 7,135,350 B1 | | 11/2006 | Smith et al. |
| 7,173,180 B2 | | 2/2007 | Shiho et al. |
| 7,229,859 B2 | | 6/2007 | Yudasaka et al. |
| 7,267,721 B2 | | 9/2007 | Kauzlarich et al. |
| 7,384,680 B2 | | 6/2008 | Bi et al. |
| 7,473,443 B2 | | 1/2009 | Matsuki et al. |
| 7,521,340 B2 | | 4/2009 | Lemmi et al. |
| 7,575,784 B1 | | 8/2009 | Bi et al. |
| 7,615,393 B1 | | 11/2009 | Shah et al. |
| 7,718,707 B2 | | 5/2010 | Kelman et al. |
| 7,852,435 B2 | | 12/2010 | Fujisawa et al. |
| 7,892,872 B2 | | 2/2011 | Hieslmair et al. |
| 8,188,991 B2 | | 5/2012 | Ohhashi et al. |
| 8,314,176 B2 | | 11/2012 | Du et al. |
| 8,348,134 B2 | | 1/2013 | Komatsu |
| 8,404,771 B2 | | 3/2013 | Du et al. |
| 8,623,951 B2 | | 1/2014 | Kambe |
| 2001/0051118 A1 | | 12/2001 | Mosso et al. |
| 2002/0074547 A1 | | 6/2002 | Yudasaka et al. |
| 2003/0003300 A1 | | 1/2003 | Korgel et al. |
| 2003/0031438 A1 | | 2/2003 | Kambe et al. |
| 2003/0045632 A1 | | 3/2003 | Shiho et al. |
| 2003/0091647 A1 | * | 5/2003 | Lewis et al. ................... 424/490 |
| 2003/0190763 A1 | | 10/2003 | Cok et al. |
| 2003/0222315 A1 | | 12/2003 | Amundson et al. |
| 2005/0008880 A1 | | 1/2005 | Kunze et al. |
| 2005/0145163 A1 | | 7/2005 | Matsuki et al. |
| 2005/0170192 A1 | | 8/2005 | Kambe et al. |
| 2005/0200036 A1 | | 9/2005 | Mosso et al. |
| 2006/0094189 A1 | | 5/2006 | Zurcher et al. |
| 2006/0137567 A1 | | 6/2006 | Yadav |
| 2006/0157677 A1 | | 7/2006 | Kunze et al. |
| 2006/0237719 A1 | | 10/2006 | Colfer et al. |
| 2006/0267776 A1 | | 11/2006 | Taki et al. |
| 2007/0003694 A1 | | 1/2007 | Chiruvolu et al. |
| 2007/0094757 A1 | | 4/2007 | Pridohl et al. |
| 2007/0212510 A1 | | 9/2007 | Hieslmair et al. |
| 2007/0295957 A1 | | 12/2007 | Lee et al. |
| 2008/0083926 A1 | | 4/2008 | Ostergard |
| 2008/0138966 A1 | | 6/2008 | Rogojina et al. |

(56) References Cited

U.S. PATENT DOCUMENTS

| | | |
|---|---|---|
| 2008/0152938 A1 | 6/2008 | Kelman et al. |
| 2008/0160265 A1* | 7/2008 | Hieslmair et al. ............ 428/208 |
| 2008/0171425 A1 | 7/2008 | Poplavskyy et al. |
| 2008/0191193 A1 | 8/2008 | Li et al. |
| 2008/0202576 A1 | 8/2008 | Hieslmair |
| 2008/0220175 A1 | 9/2008 | Mangolini et al. |
| 2008/0305619 A1 | 12/2008 | Lemmi et al. |
| 2009/0020411 A1 | 1/2009 | Holunga et al. |
| 2009/0026421 A1 | 1/2009 | Li et al. |
| 2009/0263977 A1 | 10/2009 | Rogojina et al. |
| 2009/0269913 A1 | 10/2009 | Terry et al. |
| 2010/0007025 A1* | 1/2010 | Nakagawa et al. ........... 257/759 |
| 2010/0062338 A1 | 3/2010 | Golightly et al. |
| 2010/0136771 A1 | 6/2010 | Kim et al. |
| 2010/0216299 A1* | 8/2010 | Poplavskyy et al. .......... 438/502 |
| 2010/0294349 A1 | 11/2010 | Srinivasan et al. |
| 2011/0012066 A1 | 1/2011 | Kim et al. |
| 2011/0120537 A1 | 5/2011 | Liu et al. |
| 2011/0135928 A1 | 6/2011 | Ravilisetty et al. |
| 2011/0318905 A1 | 12/2011 | Chiruvolu et al. |
| 2012/0012032 A1 | 1/2012 | Bi et al. |
| 2012/0193769 A1 | 8/2012 | Liu et al. |
| 2013/0012636 A1 | 1/2013 | Kambe et al. |

FOREIGN PATENT DOCUMENTS

| | | |
|---|---|---|
| EP | 2267055 A1 | 12/2010 |
| JP | 48-010612 | 4/1973 |
| JP | 63-210661 | 9/1988 |
| JP | 64-026640 | 1/1989 |
| JP | 03-095269 | 4/1991 |
| JP | 05-254883 | 10/1993 |
| JP | 05-261267 | 10/1993 |
| JP | 06-091162 | 4/1994 |
| JP | 06-142496 | 5/1994 |
| JP | 07-008792 | 1/1995 |
| JP | 09-272706 | 10/1997 |
| JP | 10-45409 A | 2/1998 |
| JP | 11-171947 | 6/1999 |
| JP | 2000-026692 | 1/2000 |
| JP | 2000-219901 | 8/2000 |
| JP | 2000-279817 | 10/2000 |
| JP | 2000-282222 | 10/2000 |
| JP | 2000-327930 | 11/2000 |
| JP | 2001-011119 | 1/2001 |
| JP | 2002-270546 A | 9/2002 |
| JP | 2003-096338 A | 4/2003 |
| JP | 2005-093307 A | 4/2005 |
| JP | 2005-203360 A | 7/2005 |
| JP | 2005-328030 | 11/2005 |
| JP | 2006-321876 A | 11/2006 |
| JP | 2009-246213 | 10/2009 |
| JP | 2010-109352 | 5/2010 |
| WO | 01/32799 A | 5/2001 |
| WO | 2005/013337 | 2/2005 |
| WO | 2005/049492 | 6/2005 |
| WO | 2006/009881 | 1/2006 |
| WO | 2007/023362 | 3/2007 |
| WO | 2007/072162 | 6/2007 |
| WO | 2007/117265 | 10/2007 |
| WO | 2008/030966 | 3/2008 |
| WO | 2008/039757 | 4/2008 |
| WO | 2008/061131 | 5/2008 |
| WO | 2008/073763 | 6/2008 |
| WO | 2008/091393 | 7/2008 |
| WO | 2008/118865 | 10/2008 |
| WO | 2008/137738 | 11/2008 |
| WO | 2008/143716 | 11/2008 |
| WO | 2008/152272 | 12/2008 |
| WO | 2009/032359 | 3/2009 |
| WO | 2009/114026 | 9/2009 |
| WO | 2009/117007 | 9/2009 |
| WO | 2011/035306 | 3/2011 |
| WO | 2012/172414 A1 | 12/2012 |

OTHER PUBLICATIONS

Cannon et al., "Sinterable Ceramic Powders from Laser-Driven Reactions: I, Process Description and Modeling," J. Am. Ceramic Society 65 (7):324-329 (1982).
Cannon et al., "Sinterable Ceramic Powders from Laser-Driven Reactions: II, Powder Characteristics and Process Variables," J. Am. Ceramic Society 65(7):330-335 (1982).
Goldstein et al., "Observation of Melting in 30 Å Diameter CdS Nanocrystals", Mat. Res. Soc. Symp. Proc., 206:271-274 (1991).
Ostraat et al., "The Feasibility of Inert Colloidal Processing of Silicon Nanoparticles," J. of Colloidal and Interface Science, 283:414-421 (2005).
Thomas, "The Determination of Log Normal Particle Size Distributions by Dynamic Light Scattering", Journal of Colloid and Interface Science, 117(1):187-192 (May 1987).
Haggerty et al., "Sinterable Powders from Laser-Driven Reactions," in Laser-Induced Chemical Processes, ed. by J.I. Steinfeld, Plenum Press, pp. 165-241 (1981).
International Search Report and Written Opinion for co-pending application PCT/US2011/042142 dated Jun. 28, 2011 (15 pages).
Koglin, "Assessment of the Degree of Agglomeration in Suspensions," Powder Technology 17(2):219-227 (Jul. 1, 1977).
Hoornstra et al., "The Importance of Paste Rheology in Improving Fine Line, Thick Film Screen Printing of Front Side Metallization," Netherlands Energy Research Foundation ECN, 4 pages (1997).
European Search Report from co-pending European No. EP 11804119.3 dated Aug. 4, 2013, 7 pages.

* cited by examiner

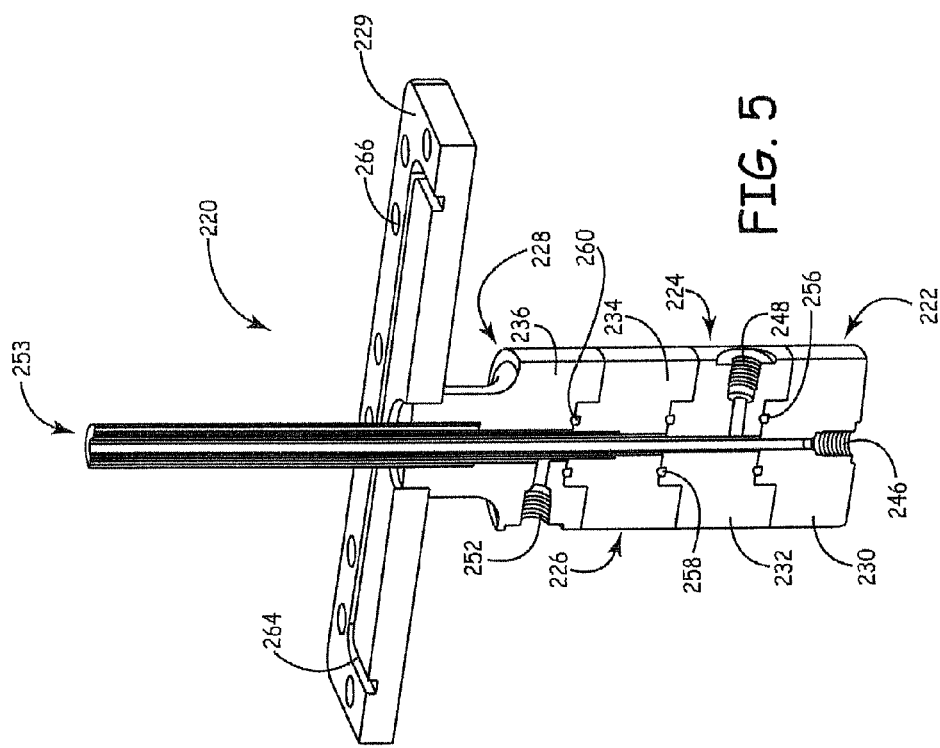
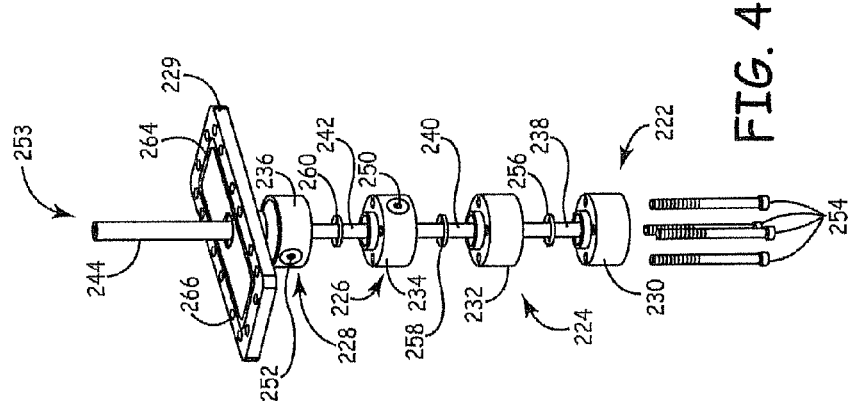
FIG. 5
FIG. 4

Structure of p/n Junction Diode

US 9,006,720 B2

SILICON/GERMANIUM NANOPARTICLES AND INKS HAVING LOW METAL CONTAMINATION

CROSS REFERENCE TO RELATED APPLICATIONS

This application is a continuation of copending U.S. patent application Ser. No. 13/070,286 to Chiruvolu et al. filed Mar. 23, 2011, entitled "Silicon/Germanium Nanoparticle Inks, Laser Pyrolysis Reactors for the Synthesis of Nanoparticles and Associated Methods", which claims priority to U.S. provisional patent application 61/359,662 filed Jun. 29, 2010 to Chiruvolu et al., entitled "Silicon/Germanium Nanoparticle Inks, and Associated Methods," incorporated herein by reference.

FIELD OF THE INVENTION

The invention pertains to the synthesis of inorganic nanoparticles, such as doped silicon nanoparticles, with a desirable nozzle design for a laser pyrolysis reactor. The invention further pertains to silicon nanoparticle dispersions that can be formulated as desirable inks, such as inkjet inks, gravure printing inks or printing pastes.

BACKGROUND OF THE INVENTION

Silicon is an important commercial material. Many applications of silicon are based on the semiconducting properties of silicon. The semiconducting properties and electron mobilities of silicon can be altered using dopants. The formation of semiconductor devices generally involves the formation of regions of the device with selectively doped silicon in which the dopants alter the electrical conduction properties or other desired properties. Through the selected doping process different domains of the device can be formed that provide functionalities for particular device to exploit the semiconductor properties, such as a diode junction formed with separate materials with a p-type dopant and an n-type dopant. For example, n-type dopants provide excess electrons that can populate the conduction bands, and the resulting materials are referred to as n-type semiconductors. P-type dopants provide electron deficiencies or holes and are used to form p-type semiconductors. Through appropriate doping, a wide range of devices can be formed, such as transistors, diodes and the like.

The wide ranges of semiconductor applications generate commercial relevance for silicon materials in many forms. For example, the formation of large area thin film transistors or the like generates a demand for alternative semiconductor processing approaches. Also, with increasing energy costs and increasing demand for energy, the market for solar cells has been correspondingly increasing. A majority of commercial solar cells comprise photoconducting silicon semiconductors, and differential doping of the semiconductor facilitates harvesting of the photocurrent. At the same time with increasing performance demands, there are strong pressures to keep costs down so that improvements in material processing is very desirable as an approach to address performance issues while keeping costs at acceptable levels. Germanium is a semiconducting material that can be an alternative to silicon with similar semiconducting properties. Also, silicon and germanium can form semiconducting alloys with each other.

SUMMARY OF THE INVENTION

In a first aspect, the invention pertains to a dispersion comprising at least about 1 weight percent elemental silicon/germanium nanoparticles having an average primary particle diameter of no more than about 50 nanometers, wherein the dispersion is a good dispersion, and the silicon particles are free of non-solvent based chemically bonded organic surface modification.

In a further aspect, the invention pertains to a dispersion comprising at least about 1 weight percent elemental silicon/germanium nanoparticles having an average primary particle diameter of no more than about 50 nanometers, wherein the dispersion is a good dispersion, and having total metal contamination of no more than about 1 parts per million by weight.

In another aspect, the invention pertains to a collection of silicon/germanium nanoparticles having an average primary particle diameter of no more than about 100 nm and a level of total metal contamination of no more than about 5 parts per million.

In additional aspects, the invention pertains to a paste comprising at least about 5 weight percent elemental silicon/germanium nanoparticles having an average primary particle size of no more than about 50 nm, from about 0.25 weight percent to about 15 weight percent of a first solvent having a boiling point from about 55° C. to about 160° C., and from about 65 weight percent to about 94.75 weight percent of a second solvent having a boiling point of at least about 175° C., wherein the paste has a viscosity from about 10 Pa·s to about 300 Pa·s.

In other aspects, the invention pertains to an ink comprising at least about 1 weight percent elemental silicon/germanium nanoparticles having an average primary particle size of no more than about 30 nm, from about 10 weight percent to about 60 weight percent alcohol, from about 30 to about 80 weight percent of a polar aprotic solvent, wherein the ink has a viscosity from about 0.1 mPa·s to about 100 mPa·s and a surface tension from about 20 dynes/cm to about 70 dynes/cm.

Moreover, the invention pertains to a method for preparing an ink with elemental silicon/germanium nanoparticles. The method can comprise adding a second solvent to an initial dispersion of elemental silicon nanoparticles dispersed in a first solvent to form the ink which is a good dispersion of the nanoparticles in a blend of the solvents. In some embodiments, the elemental silicon nanoparticles are free from non-solvent based chemically bonded surface modification with an organic compound. Generally, the first solvent and the second solvent blend to form a single phase.

Furthermore, the invention pertains to a method for forming a screen printing paste with a selected viscosity based on adjusting the nanoparticle concentration wherein the screen printing paste comprises elemental silicon/germanium nanoparticles. The method generally comprises dispersing the nanoparticles in a solvent comprising a blend of a first solvent having a boiling point from about 55° C. to about 160° C. and a second solvent having a boiling point of at least about 175° C. to form the paste, in which the paste has a particle concentration from about 10 weight percent to about 20 weight percent and the paste has a viscosity at a shear rate of 2 s$^{-1}$ from about 10 Pa·s to about 800 pa·s.

Additionally, the invention pertains to a method for printing a desired thickness of a silicon nanoparticle ink wherein the ink comprises at least about 1 weight percent elemental silicon/germanium nanoparticles having an average primary particle diameter of no more than about 50 nanometers and wherein the ink is a good dispersion. The method generally comprises printing a first time the silicon nanoparticle ink to form a first silicon nanoparticle deposit, and repeating the printing one or more times as appropriate to get a desired thickness of the nanoparticle ink deposit.

In further aspects, the invention pertains to a laser pyrolysis reactor comprising a reaction chamber, a light source and associated optical elements configured to deliver a light beam through the reaction chamber, a reactant delivery system comprising reactant reservoirs, a nozzle configured to deliver one or more reactants from the reactant delivery system into the reaction chamber, and a collection system configured to receive the flow from the reaction chamber that originated from the nozzle. In some embodiments, the nozzle comprises an inner inert gas channel, an intermediate reactant channel surrounding the inner inert gas channel and an outer inert gas channel surrounding the intermediate reactant channel, wherein the inner inert gas channel and the outer inert gas channel are operably connected to an inert gas source.

In some aspects, the invention pertains to a method for synthesizing nanoparticles by laser pyrolysis, in which the method comprising reacting a reactant flow using a light beam to drive the reaction. In some embodiments, a reactant flow is initiated from a nozzle with reactants flowed through an annular ring with inert gases flowed through an inner flow channel in center and through an outer gas channel surrounding the reactant flow wherein the reactant flow substantially completely flows through a light beam such that energy from the light beam drives the reaction to form product particles.

In additional aspects, the invention pertains to a laser pyrolysis reactor comprising a reaction chamber, a light source and associated optical elements configured to deliver a light beam through the reaction chamber, a reactant delivery system comprising reactant reservoirs, a nozzle configured to deliver one or more reactants from the reactant delivery system into the reaction chamber, and a collection system configured to receive the flow from the reaction chamber that originated from the nozzle. In some embodiments, the nozzle comprises a reactant channel having a width and a length, one or more quench gas channels oriented to provide flow along the length of the reactant channel and one or more entrainment gas channels oriented along the length of the inert gas channels, wherein the one or more quench gas channels and the one or more entrainment gas channels are operably connected to an inert gas source and the reactant channel is operably connected to the reactant delivery system and wherein the entrainment inlets have an area at least about 25% larger than the area of the quench gas channels.

In other aspects, the invention pertains to a method for synthesizing nanoparticles by laser pyrolysis, in which the method comprises reacting a reactant flow using a light beam to drive the reaction. In some embodiments, a reactant flow is initiated from a nozzle with reactants flowed through a reactant inlet with inert gases flowed through a quench gas inlet approximately surrounding the flow from the reactant inlet and an inert entrainment gas flows through an outer gas channel approximately surrounding the inert quench gas flow wherein the reactant flow substantially completely flows through a light beam such that energy from the light beam drives the reaction to form product particles. The entrainment gas flow can be at a volume at least about 25% greater than the inert quench gas flow and the entrainment gas flow leaving the nozzle at a greater velocity than the inert quench gas flow.

Also, the invention pertains to a laser pyrolysis apparatus comprising a reaction chamber, a light source and associated optical elements configured to deliver a light beam through the reaction chamber, a reactant delivery system comprising reactant reservoirs, a nozzle configured to deliver one or more reactants from the reactant delivery system into the reaction chamber, and a collection system configured to receive the flow from the reaction chamber that originated from the nozzle. In some embodiments, at least a portion of the interior of the reaction chamber, at least a portion of the nozzle exposed to the interior of the reaction chamber or reactant flow, at least a portion of the collection system exposed to flow from the reaction chamber, or a combination thereof is coated with a polymer, ceramic material or combinations thereof such that flow within apparatus has reduced exposure to metal contaminants from the apparatus.

BRIEF DESCRIPTION OF THE DRAWINGS

FIG. 4 is a partially exploded perspective side view of the reactant inlet nozzle depicted in FIG. 3, shown in a partially disassembled configuration.

FIG. 5 is a perspective sectional view of the reactant inlet nozzle depicted in FIG. 3, in which the section is taken along line 5-5 of FIG. 3.

FIG. 31(*b*) is a stroboscopic image of the printed line from FIG. 31(*a*) taken one hour after printing.

DETAILED DESCRIPTION OF THE INVENTION

Figure 1:
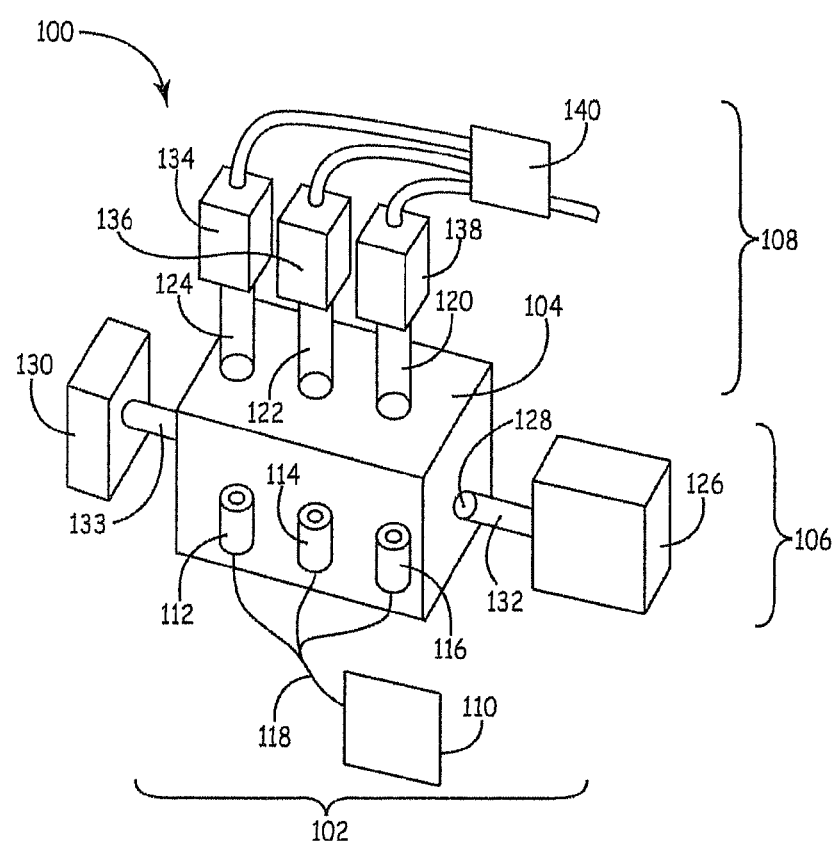
FIG. 1 is a schematic representation of a laser pyrolysis apparatus having three reactant inlet nozzles.

To simplify processing to form high quality silicon/germanium semiconducting material with a low level of contaminants and generally with a significant dopant level, it has been found that good dispersions of silicon nanoparticles can be formed without stabilizing the dispersions using non-solvent organic compositions chemically bonded to the particle surfaces. Solvents interact with the native particle surfaces with varying interactions as described further below. The dispersions with unmodified silicon particles can be formulated at high concentrations of silicon particles and the properties of the dispersions can be appropriately adjusted for a desired printing ink, such as an inkjet ink, other printing ink or a printing paste. Printable silicon/germanium inks provide significant potential processing advantages for the formation of semiconductor devices. The inks can be used for the delivery of dopant elements in a desirable form for driving into a substrate and/or the deposited silicon particles can be sintered into a component of a device. For further processing of the inks after deposition, e.g., printing, of the ink, it can be desirable to incorporate small nanoparticles into the inks, and desirable nozzle designs for a laser pyrolysis reactor are described for the synthesis of high quality silicon nanoparticles with small particle diameters, optionally with a high degree of doping. The silicon nanoparticles as well as corresponding inks can be formulated with very low levels of metal contaminants, which makes it possible to form particles with controlled low dopant levels in a meaningful way. The ability to print silicon nanoparticles, such as highly doped nanoparticles, using high quality inks can provide significant processing advantages for printed electronics, solar cell component formation and other semiconductor applications.

With respect to desirable nozzles for silicon nanoparticle production with laser pyrolysis, in some embodiments the nozzle has an annular configuration that provides quenching of the particles with an inert gas delivered from the nozzle shortly after synthesis of the particles. Additional nozzle embodiments have a relative small path length of the light beam through the reactant flow and an entraining inert gas flow that facilitates particle nucleation and quenching. The availability of good quality particles facilitates the corresponding formation of good quality inks.

Several improvements are described herein relating to different stages of the ink formulation process starting with the synthesis of elemental silicon nanoparticles. For example, laser pyrolysis apparatus designs provide for the synthesis of highly uniform silicon nanoparticles at commercially significant rates, which can have a very low level of total metal contaminants on the order of 10 parts per million by weight and similarly a very low level of iron contamination. Using the improved apparatuses described herein, high dopant levels can be achieved while forming very uniform silicon nanoparticles. The resulting silicon/germanium nanoparticles are suitable for the formation of high concentration dispersions of the nanoparticles. The highly concentrated dispersions have been formulated without modifying the surface of the particles with organic compositions, while being able to achieve desired ink properties over a broad range. Silicon/germanium refers to silicon, germanium, alloys thereof or mixtures thereof. To simplify the discussion, elemental germanium and alloys of germanium with silicon are generally not explicitly discussed. While the discussion below focuses on silicon, the analogous processing of and compositions with germanium and alloys with silicon follows from the discussion based on the similar chemistries of the elements.

As described herein, elemental silicon inks can be formulated for suitable printing processes for commercial applications. The ability to form good dispersions without chemical modification of the silicon nanoparticle surfaces with an organic compound simplifies processing of the particles after printing. For appropriate embodiments, if there are no organic components bonded to the particles to remove, the silicon nanoparticles can be processed for the formation of semiconductor components with reduced processing to achieve equivalent low levels of contaminants. Also, the ability to form the dispersions without organic chemical modification of the silicon nanoparticles can reduce the processing steps to form the inks. Furthermore, the processing to form organic modification of the particles involves the use of additional chemicals that can introduce further contaminants to the particle dispersion. Based on improved processing techniques, the particles can be transferred between solvents or formulated with desired solvent blends for production of desired ink formulations, which can be formed with very low levels of contamination. Processing techniques for the inks into corresponding devices can be selected based on the particular application.

Solvents generally interact with solutes with various interactions, such as hydrogen bonding, polar interactions as well as various interactions that can have ranges of bonding versus non-bonding characteristics. These various states of interaction are at equilibrium within the solution/dispersion. Inorganic nanoparticles, such as silicon nanoparticles, are a particular type of solute. In general, for organic molecules, solvated bio-macromolecules, solvated inorganic species and even inorganic nanoparticles, the solute-solvent interactions are generally complex and in many circumstances not completely understood. The degree of interactions with the solvent can cover a range of binding strengths with corresponding degrees of reversibility of the interactions, such as with dry of the solvent. With the reference to un-modified silicon particles herein, this reference does not take into account any potential solvent interactions with the particles.

It has been proposed that ethanol and ethylene glycol form reactive species in solution with silicon particles. This interaction seems to be significantly pH dependent and to also depend on the degree of oxidation of the particle surfaces as well as the presence of dissolved oxygen in the solvent. This phenomenon is described further in Ostraat et al., "The Feasibility of Inert Colloidal Processing of Silicon Nanoparticles," J. of Colloidal and Interface Science, 283 (2005) 414-421, incorporated herein by reference. In the experience of the current inventors, observations suggest that isopropyl alcohol forms interactive species with the particle surfaces, but that the isopropyl alcohol is effectively completely removed through evaporation suggesting that any solvent-particle interactions are reversible under conditions of solvent removal. Other observations suggest that ethylene glycol and propylene glycol may be more difficult to completely remove with solvent evaporation. However, it is clear that the solvent-particle interactions are generally of a different character from strong bonding interactions of specific surface modification compositions that have been described for modifying the particle surfaces to alter the solvent interactions with the modified particle surfaces. In particular, the specific solvent modifying compositions used to modify the solvent interactions are generally designed to be effectively irreversible under conditions in the ink in order to support dispersion in different types of solvents.

Laser pyrolysis is a desirable technique for the production of crystalline silicon nanoparticles, although in principle inks described herein can be formulated with silicon submicron particles from other sources that can correspondingly produce high quality and uniform particle. In some embodiments of particular interest, the particles are synthesized by laser pyrolysis in which light from an intense light source drives the reaction to form the particles from an appropriate precursor flow. Lasers are a convenient light source for laser pyrolysis, although in principle other intense, non-laser light sources can be used. The particles are synthesized in a flow that initiates at a reactant nozzle and ends at a collection system. Laser pyrolysis is useful in the formation of particles that are highly uniform in composition and size. The ability to introduce a range of precursor compositions facilitates the formation of silicon particles with selected dopants, which can be introduced at high concentrations.

Due to the versatility, laser pyrolysis is an excellent approach for efficiently producing a wide range of nanoscale particles with a selected composition and a narrow distribution of average particle diameters. Specifically, laser pyrolysis has been successfully used for the synthesis of a wide range of complex inorganic particles, including, for example, compositions with multiple metal/metalloid elements as well as doped materials. In the laser pyrolysis process, the dopant element(s) are introduced into the reactant stream such that the elements can be incorporated into the product particles. The dopant elements can be delivered into the reactant stream as a suitable composition. The reactant stream can comprise gas precursors, vapor precursors and/or aerosol precursors. Laser pyrolysis can be used to form doped silicon particles with a wide range of selected dopants or combinations of dopants. For the doping of semiconductor substrates, desirable dopants include, for example, B, P, Al, Ga, As, Sb and combinations thereof. The general use of laser pyrolysis for the formation of a range of materials including doped silicon nanoparticle is described in published U.S. Pat. No. 7,384,680 to Bi et al., entitled "Nanoparticle Production and Corresponding Structures," incorporated herein by reference.

Due to the nature of the laser pyrolysis process, high dopant levels can be achieved within the product submicron silicon particles. Specifically, dopant levels of several atomic percent can be achieved, as described further below. The ability to achieve high dopant levels make the corresponding inks particularly desirable for applications where dopants are transferred to a semiconducting material from the silicon nanoparticles, or for the formation directly of components of devices with high dopant levels through the sintering of the silicon nanoparticles. The high dopant levels can be achieved while also having control of average primary particle diameters and while achieving dispersible nanoparticles with good uniformity.

Laser pyrolysis can effectively produce uniform particles due to rapid quenching of the product particles as the particles leave the reaction zone. Laser pyrolysis has a particular advantage relative to flame techniques for the synthesis of inorganic particles that are not metal/metalloid oxides since flame processes generally have oxygen present to drive the flame. For the synthesis of silicon particles in comparison with ceramic particles, such as oxides, nitrides or carbides, quenching of the product particles is particularly sensitive to limit fusing of the particles within the flow. Enhanced quenching of reactant flow for laser pyrolysis reactors with a rectangular nozzle is described in published U.S. patent application 2009/0020411 to Holunga et al., entitled "Laser Pyrolysis With In-Flight Particle Manipulation for Powder Engineering," incorporated herein by reference. Alternative desirable nozzle designs are described herein based on short path lengths of the light beam through the reactant flow to achieve greater uniformity of the reaction across the reactant flow. These alternative nozzle designs provide a relatively high yield with respect to reactant flow and reduce effects of light beam attenuation.

In some embodiments, the nozzle has an annular or similar configuration having the reactive flow going around an interior inert gas flow and a surrounding inert gas flow. The nozzle configuration provides for efficient quenching of the silicon particles without any direct interaction with the reactant flow downstream from the reaction zone. Also, the nozzle has a convenient design to maintain silicon nanoparticle production for long term commercial quantities at moderate rates. In further embodiments, the nozzle has a reactant inlet with an approximately rectangular shape that is oriented with the length of the inlet oriented at an angle to the light path, such as perpendicular, to maintain a relatively small light path through the reactant stream.

For the improved nozzle designs, an inert quench gas flow is supplied to surround the reactant flow. Also, in some embodiments, a distinct entrainment flow of inert gas can be provided around both the reactant flow and the inert quench gas flow. The entrainment flow can facilitate particle nucleation and/or more efficient quenching of the particles. The entrainment flow generally has a higher velocity than the other flows and a relatively large flow volume. However, the velocity differences of adjacent flows exiting the nozzle are generally not too large to reduce turbulence that can result from shear between adjacent flows. Thus, the design of the nozzles to generate an inert quenching gas flow adjacent to a reactant flow and further a distinct entrainment inert gas flow surrounding the inert quench gas flow provides for improved synthesis of silicon nanoparticles due to the assistance of the entrainment gas flow to facilitate particle nucleation and subsequent quenching of the particles.

An early description of the synthesis of crystalline silicon nanoparticles using laser pyrolysis and a silane precursor is described in Chapter 3 by Haggerty et al. "Sinterable Powders from Laser-Driven Reactions," in Laser-Induced Chemical Processes, ed. by J. I. Steinfeld, Plenum Press 1981, pages 165-241, incorporated herein by reference. See also, Cannon et al., "Sinterable Ceramic Powders from Laser-Driven Reaction: I, Process Description and Modeling," J. Am. Ceramic Society 65 (7), 324 (1982), and Cannon et al., "Sinterable Ceramic Powders from Laser-Driven Reaction: II, Powder Characteristics and Process Variables," J. Am. Ceramic Society 65 (7), 330 (1982), both of which are incorporated by reference. The formation of doped silicon nanoparticles and nanostructured coatings is described in U.S. Pat. No. 7,575,784 to Bi et al., entitled Coating Formation by Reactive Deposition," incorporated herein by reference. The use of doped silicon particles formed by laser pyrolysis is described in published U.S. patent application 2008/0160265 to Hieslmair et al., entitled "Silicon/Germanium Particle Inks, Doped Particles, Printing and Processes for Semiconductor Applications," incorporated herein by reference.

In addition to the design of improved nozzles, the laser pyrolysis apparatus and processes have been redesigned to achieve exceedingly low metal contaminations for silicon nanoparticles. Specifically, the precursors can be supplied in extremely purified forms, and the product particles are collected and handled in a controlled environment with very clean polymer containers to reduce or eliminate metal contaminants resulting from handling the particles. Furthermore, metal contaminant levels may be further reduced through the coatings of appropriate reaction chamber components with appropriate coatings, such as polymers, e.g., polytetrafluoroethylene, or ceramics, e.g., as silica or silicon nitride. Based on these improved designs, silicon nanoparticles can be synthesized with a very high level of purity with respect to metal elements. Thus, most metal concentrations can be reduced to levels of no more than about 20 parts per billion by weight (ppb) for inks with a 10 weight percent particle concentration, and total metal contamination can be reduced to levels of no more than about 100 ppb by weight ink. With respect to the particles, the contamination of the particles can be estimated from the particle concentration of a dispersion and the contamination level of the dispersion. The particles can have a metal contamination concentration of any individual metal of no more than about 300 ppb and a total metal contaminant level of no more than about 1 parts per million by weight (ppm). To further remove contaminants in the formation of the dispersions, centrifugation can be used to remove contaminants from the dispersions with the pure silicon nanoparticles remaining disbursed in the liquid.

The properties of dispersions of nanoparticles, among other factors, depend significantly on the interactions of the particle surface and the liquid solvent that is functioning as the dispersant. To help control this interaction, molecules can be chemically bonded to the surface of the silicon particles. In general, the molecules bonded to the surface of the silicon particles are organic, although the compounds can comprise silicon based moieties and/or other functional groups in addition to organic moieties. The character of the bonded molecules can then be selected to facilitate the formation of a good dispersion in a selected solvent or blend of solvents. Some of the desired ink formulations can take advantage of surface modification of the silicon particles, and surface modification is described further below. Surface modification of silicon particles is also described further in published U.S. patent application 2008/0160265 to Hieslmair et al., entitled "Silicon/Germanium Particle Inks, Doped Particles, Printing and Processes for Semiconductor Applications," incorporated herein by reference.

The surfaces of the silicon particles generally have various degrees of oxidation and/or hydrogenation, which can depend on the synthesis conditions as well as the handling of the particles following synthesis, and such hydrogenation or oxidation is not an organic modification of the particles. Silicon nanoparticles are generally crystalline, and silicon submicron particles produced by laser pyrolysis generally have a high level of crystallinity. In general, the particle surface represents a termination of the particle lattice, and the bonds of the surface silicon atoms bond appropriately to avoid dangling bonds. The surface can terminate with distorted structures to accommodate multiple bonds between silicon atoms or bonds with other atoms, such as bridging oxygen atoms, —OH bonds or —H bonds. For silicon particles formed with silane precursors, there are generally quantities of hydrogen available during the formation of particles that can result in some degree of hydrogenation of the silicon. Contact with air may result in some oxidation of the surface.

In some embodiments, it can be desirable for the silicon particles used in the dispersion to be free from chemical modification with an organic composition. While, in principle, the organic moieties can be removed during processing after printing or other deposition of the silicon ink prior to use of the deposited silicon particles for device formation, the presence of the organic moieties in the inks can lead to carbon contamination of the silicon materials after processing of the silicon into a component. The electrical properties of the material can be strongly dependent on the presence of impurities. Therefore, the ability to process the inks with silicon particles without chemically bonded organic moieties can simplify processing and reduce average contaminant levels, or in certain cases may also provide a more flexible device fabrication process flow. Furthermore, processing steps related to the chemical modification with an organic moiety as well as steps related to removal of the chemical modifications clearly can be eliminated if the particles are not chemically modified with organic moieties.

It has been found that good dispersions can be formed of silicon nanoparticles formed using laser pyrolysis. The dispersions can be formed at high concentrations, and the properties of the dispersions can be engineered over desirable ranges based on particular applications. In particular, the solvent properties for forming the initial dispersion are significant to be able to form the dispersions of the particles without surface modification. Appropriate mixing, sonication or the like can be supplied to facilitate the initial dispersion of the particles. The characteristics of the initial dispersion can be evaluated through an examination of secondary particle properties, such as Z-average particle size and particle size distribution, measured in the dispersion using generally light scattering, which are measures of the size of the dispersed particles in the liquid.

Once an initial good dispersion is formed with the silicon nanoparticles in an appropriate solvent to form the good dispersion, the solvent or blends thereof can be manipulated to form an overall ink with selected properties while maintaining the good dispersion of the particles. Specifically, techniques have been developed for more versatile exchange of solvents or formation of solvent blends such that a desirable solvent system can be selected for a particular printing approach. With the ability to provide highly uniform silicon nanoparticles in high concentration dispersions with selected solvents, inks can be formulated that can be printed using desirable approaches. After printing, the inks can be used to form components of semiconductor devices or as a dopant source to be driven into an underlying semiconductor material. In particular, the silicon inks can be used for forming components of solar cells or of electronic devices, such as thin film transistors. In some embodiments, the particles can be incorporated directly into a component of an ultimate product. The good dispersion can be characterized with respect to the secondary particle sizes and distributions. Dispersions that are too concentrated for direct measurement of secondary particle sizes can be diluted, for example, to a 1 weight percent concentration for the secondary particle characterization. In particular, it can be desirable for the Z-average particle size to be no more than about 250 nm and in further embodiments no more than about 150 nm.

The engineering of a desired ink can involve several parameters. For example, a desired ink generally comprises a solvent or blend of solvents with desired properties. Many ink formulations advantageously comprise a blend of solvents to achieve target ink properties. The use of a blend of solvents can be particularly effective for the formation of an ink with desired properties for processing. In general, if a blend of solvents is used, the solvents form a single liquid phase either due to miscibility or solubility of the solvents relative to each other. A starting point for ink formulations involves the formation of well dispersed silicon particles. Once the particles are well dispersed, the resulting dispersion can be appropriately modified to form a selected ink. Solvent can be removed by evaporation to increase the particle concentration. A good dispersion is characterized by the nanoparticles remaining suspended, with no significant particle settling, for at least an hour without application of additional mixing. At higher particle concentrations of the inks, the secondary particle sizes cannot be directly measured by optical methods. But the higher concentration inks can be evaluated by the lack of particle settling, i.e., remaining a good dispersion, and by diluting the concentrated ink to a concentration where the secondary particle size can be measured.

For many ink formulations, the inks have a relatively large particle concentration, for example, at least about 0.5 weight percent or possibly significantly higher. With improved processing techniques and ink formulations described herein, the inks can be formulated with high silicon particle concentrations and with desirable rheological, i.e., fluid, properties. Suitable inks are described for inkjet printing, gravure printing and screen printing with a paste consistency, and other inks can be similarly formulated based on this teaching. To obtain desired thickness of deposited inks, a coating or printing process can be repeated to form multiple layers of the ink with a corresponding greater thickness.

For silicon nanoparticles inks for most printing applications, it can be desirable to use a blend of solvents. Similarly, convenient processing approaches can be adapted for the formation of inks with a blend of organic liquids that can be referred to as solvents for convenience. Specifically, the blend of solvents generally comprises a first low boiling temperature solvent, generally having a boiling point of no more than about 160° C. and a second high boiling temperature solvent, generally having a boiling point of at least about 175° C. The solvents are generally selected to form a single liquid phase upon mixing. The lower boiling solvent can be removed upon printing of the ink to stabilize the printed material, and the higher boiling solvent can be removed upon further processing of the printed material.

For processing to form the desired inks, the particles are generally dispersed in the low boiling solvent to form a good dispersion. The silicon nanoparticles formed using laser pyrolysis can be well dispersed in alcohols. The second high boiling point solvent can be added to the initial silicon nanoparticle dispersion. A portion of the low boiling point solvent can be evaporated to achieve the desired overall solvent composition, and particle concentration. The solvent blend can be selected to maintain a good dispersion of the silicon particles at the selected concentrations of particles, and the solvents should also be selected to achieve the desired viscosities, surface tensions and/or other desired ink properties.

The silicon particle inkjet inks generally have a relatively low viscosity with a relatively large particle loading over reasonable ranges of shear. In some embodiments, one of the solvents for the inkjet ink generally comprises an alcohol, and another solvent can be an aprotic polar solvent. For inkjet inks, it is generally desirable for the ink to comprise at least about 5 weight percent silicon particles.

The silicon inks can also be formulated for gravure printing. In gravure printing, the ink is spread onto a printing plate that has depressions to hold the ink at selected locations. After any excess ink is removed, the printing plate is pressed onto the printing surface to transfer the ink to the surface in the pattern established by the printing plate. The printing plate can be shaped as a roller to facilitate the transfer process. The silicon inks for gravure printing are generally between the values for an inkjet ink and a screen printing paste.

The silicon ink pastes, such as screen printing pastes, generally have very high viscosities. The pastes generally comprise a low boiling point solvent that evaporates upon printing of the paste. The pastes further comprise a high boiling temperature solvent that can be selected to provide desirable paste properties and to be consistent with materials used for forming the printing screens. The printing screens are generally used repeatedly, so the screen printing paste should be selected to avoid significantly damaging the screens or masks with use.

In general, the silicon inks can be deposited by any suitable deposition approach, and as noted above, the inks can be correspondingly formulated for a particular deposition approach. For example, suitable deposition approaches include, for example, coating approaches and direct patterning approaches, such as printing. With proper formulation of the silicon inks, appropriate coating approaches, such as spin coating, spray coating or the like, can be used to form a layer of the ink. In general, any reasonable printing technique can be used, such as inkjet printing, gravure printing or screen printing, and the inks can be appropriately formulated. In general, any reasonable substrate can be used for deposition of the silicon nanoparticle inks. In some embodiments, the substrate can comprise a semiconductor, such as silicon, and the ink can be used to supply dopant elements and/or to form a component of a device on the substrate. In alternative embodiments, the substrate can comprise a polymer sheet onto which the silicon ink is deposited. Other inorganic materials, such as dielectrics and electrical conductors, can also be used as substrates for silicon ink deposition.

In some embodiments, printing processes can effectively supply compositions in patterns over large areas quickly and efficiently. For semiconductor applications, the use of printing techniques described herein may eliminate one or more photolithography steps that may be involved in more traditional processing approaches to achieve the desired patterning. The silicon inks can be formulated for various printing approaches with appropriate attention to processing efficiencies, desired resolutions of the printed structures, capital equipment availability and other appropriate issues.

For circuit formation, the substrate can comprise semiconductor materials, such as silicon, germanium or alloy thereof, or in other embodiments, a polymer substrate. A printing process can deposit the ink at specific locations along the substrate surface. This allows the selective placement of silicon particles with or without a dopant along the substrate, such as for formation of specific circuit components. Similarly, the placement of doped silicon particles along a substrate can provide a dopant source that can provide a dopant that can be driven into the adjacent substrate for the formation of circuit components. Other patterning approaches can be used with the inks alone or combined with a printing approach, or no patterning can be used, as appropriate for a specific application.

For printed circuit applications, once a doped silicon ink is deposited at selected locations, the particles can be sintered or otherwise fused at the deposited position on the substrate to form a corresponding structure or domain. This can be done, for example, by heating the substrate in an oven to relatively high temperatures, such as 750° C. to 1250° C. to obtain a solid mass from the particles in intimate contact with the substrate surface. Nanoparticles may melt or flow at lower temperatures than larger particles so that the use of nanoparticles can facilitate the process with oven based heating. These temperatures are still below the melting point of bulk silicon, so that rapid thermal annealing can be used on silicon substrates and other relatively high temperature substrates. However, in some embodiments, improved control of the process as well as energy saving can be obtained through the application of light energy, such as from a laser or incoherent light source, to melt the particles at the deposited position along the substrate without generally heating the substrate or only heating the substrate to lower temperatures. This photonic curing process may be suitable for some lower melting substrates.

Printed circuit applications of particular interest include, for example, display circuits in which electrical connections for display elements cover a relatively large area while involving moderate resolution to distinguish the elements. The display circuits can be formed through the printing process and subsequent processing to form the circuitry for controlling the display element. The display circuits can comprise thin film transistors that can comprise components formed with the silicon inks described herein.

The formation of desirable solar cell elements on a thin silicon foil is described further in published U.S. patent application 2008/0202576A to Hieslmair et al., entitled "Solar Cell Structures, Photovoltaic Panels and Corresponding Processes," incorporated herein by reference. The '576 application describes forming shallow doped regions in some embodiments. These shallow doped regions can be conveniently formed by printing the doped silicon and using heat and/or light, such as from a laser or flash lamp, to fuse the doped silicon into corresponding doped contacts. This processing can further lead to dopant drive-in to supply dopant in the initial silicon material. Also, the doped silicon particles described herein can be also used to deliver the dopant atoms to the underlying silicon substrate. Also, other similar solar cell elements can be formed on other silicon or other semiconducting substrates for solar cell applications. Dopant drive-in and silicon particle fusing is described further in copending U.S. provisional patent application 61/438,064 to Liu et al, entitled "Silicon Substrates With Doped Surface Contacts Formed From Doped Silicon Inks and Corresponding Processes," incorporated herein by reference. If the silicon particles are used solely as a dopant source, the remains of the particles can be removed following processing if desired.

As described herein, high quality dispersions of silicon, with or without dopants, provides the ability for effective deposition of silicon nanoparticles, and in some embodiments the nanoparticles can be printed to form moderate resolution structures. Due to the enhanced ability to control the properties of the inks, the silicon can be printed rapidly and with a selected printing technique, for example, using inkjet printing, gravure printing, screen printing or other desired approach. The ability to introduce silicon with selected dopants over a wide range of compositions provides the ability to form a corresponding wide range of devices based on the silicon particles. The dopants can be selected based on the particle device to be formed and the corresponding desired electrical properties for the element or component. Using a selected printing process, silicon particles with different dopants can be selectively placed at different locations along the substrate surface.

Laser Pyrolysis Synthesis of Silicon Particles and Improved Nozzle Design

Laser pyrolysis is an effective method for the synthesis of high quality inorganic submicron particles. With appropriate design of the laser pyrolysis apparatus, highly uniform silicon nanoparticles can be synthesized with high levels of dopants. A multichannel nozzle design has been developed that provides for more effective control of silicon nanoparticle synthesis to support the production of small silicon nanoparticles with a high degree of uniformity. In particular, in some embodiments, the nozzle provides a core of inert gas as well as a blanket of inert gas surrounding the outside of the reactive flow such that the blending of the flows following the reaction zone results in effective quenching of the particles. In additional or alternative embodiments, a generally rectangular nozzle can be used with a short path length of the light beam through the reactant stream to reduce effects of light beam attenuation. In general, an entrainment flow with relatively high velocity relative to the reactant flow and a high flow rate can be used to surround the reactant flow and an inert quenching gas flow to facilitate the confinement of the reactant flow and quenching gas. As described further below, the effective control of the particle synthesis can be directed at the synthesis in some embodiments of uniform silicon nanoparticles with an average primary particle diameter no more than about 50 nm.

For convenience, light-based pyrolysis is referred to as laser pyrolysis since this terminology reflects the convenience of lasers as a radiation source and is a conventional term in the art. Laser pyrolysis approaches discussed herein incorporate a reactant flow that can involve gases, vapors, aerosols or combinations thereof to introduce desired elements into the flow stream. The versatility of generating a reactant stream with gases, vapor and/or aerosol precursors provides for the generation of particles with a wide range of potential compositions.

Designs of laser pyrolysis apparatuses for larger scale particle production have been based on the use of an inlet that has an extended dimension of the reactant inlet and a chamber that conforms to the inlet dimensions. An axis pointing along the extended dimensions of the opening of the nozzle inlet generally has been aligned roughly parallel to the line along the propagation direction of the light beam through the reaction chamber so that essentially the entire reaction flow can pass through the light beam. The slit type inlet provides for increased reactant flux through the light beam. This design is described, for example, in U.S. Pat. No. 5,958,348 to Bi et al. (the '348 patent), entitled "Efficient Production of Particles by Chemical Reaction," incorporated herein by reference. However, it has been found that light beam attenuation along the parallel nozzle can result in low yields and an undesirable reduction in uniformity along the length of the nozzle, especially for elemental silicon particle synthesis. Alternative nozzle designs are described herein that can produce appropriate production rates for doped silicon nanoparticles with very good uniformity and with high dopant levels. In particular, the nozzles can be designed for rapid quenching of the flow following reaction along with confinement of the reactive flow with quenching gas, which is particularly significant for silicon nanoparticles with average primary particle diameters of no more than about 50 nm, which involves particular attention to particle quenching in the flow.

Improvements in the laser pyrolysis nozzle design provides for the synthesis of more uniform elemental silicon nanoparticles with selectable particle sizes and optionally high dopant levels. In particular, the improved nozzles can have separate flows of reactants and inert gas within strong flows of inert entraining gas that has a relatively greater flow volume and flow velocity to help to confine the inner flows. In general, the entrainment gas flow has a velocity out of the nozzle of at least about 5 percent greater than the reactant flow, and the volume of entrainment gas is generally at least about 10% greater than the flow of inert quenching gas.

The overall nozzle configuration influences the reactant inlet properties. For example, the reactant inlet shape can range from an annular shape to a rectangular shape. For annular shaped reactant inlets and the like, a central channel can be used for the delivery of inert quench gas. For a particular nozzle, the path length of the light beam through the reactant flow should be relatively small so that the effects of light beam attenuation can be better managed. The reaction can be controlled to produce uniform particles with a selected average particle size.

In some embodiments with a reactant inlet oriented around a central inner quenching gas channel, inner shielding gas and outer shielding gas can be supplied with an annular or similar non-circular reactant inlet with inert shielding gas fed in the interior of the nozzle and around the outside of the reactant flow. An entrainment inert gas flow can also be supplied through a separate ring of the nozzle. The use of an annular reactant inlet can provide for a more uniform reactant flow across dimensions of the flow, and the greater uniformity of the flow correspondingly provides for greater uniformity of the resulting product particles. This nozzle design can be used for the synthesis of a wide range of inorganic nanoparticles using laser pyrolysis, although herein the nozzle is exemplified for synthesis of elemental silicon nanoparticles and corresponding doped particles.

In additional embodiments, the reactant inlet has an approximately rectangular shape or similar slit shape. In contrast with the design described in the '348 patent cited above, the reactant inlet is oriented with the inlet length perpendicular or at an angle to the light beam such that path length of the light beam through the reactant flow is relatively small so that effects of beam attenuation is significantly reduced. An entrainment inert gas flow can confine the reaction to facilitate the particle formation.

The reactant flow from the reactant nozzle generally is oriented to pass essentially entirely through a light beam, such as a laser beam. Since the absorption of light drives the reaction of the reactant flow within a small reactant zone, it is desirable for the entire or approximately the entire reactant flow to pass through the light beam so that the product particles maintain a desired high level of uniformity. The reaction zone generally overlaps with the location of the intersection of the reactant flow with the light beam, and the particles quench relatively rapidly after leaving the reaction zone. The light beam generally can be directed to cross the reaction chamber and strike a beam dump, such as a power meter. A plurality of improved quenching nozzles can be aligned in a single chamber such that a light beam passes sequentially through the reactant flow from the nozzles. The use of a plurality of aligned nozzles correspondingly can be used to increase the throughput through a single chamber.

The reaction conditions can determine the qualities of the particles produced by laser pyrolysis. The reaction conditions for laser pyrolysis can be controlled relatively precisely in order to produce particles with desired properties. For example, the reaction chamber pressure, flow rates, composition and concentration of reactants, radiation intensity, radiation energy/wavelength, type and concentration of inert diluent gas or gases in the reaction stream, temperature of the reactant flow can affect the composition and other properties of the product particles, for example, by altering the time of flight of the reactants/products in the reaction zone and the quench rate. Thus, in a particular embodiment, one or more of the specific reaction conditions can be controlled. The appropriate reaction conditions to produce a certain type of particles generally depend on the design of the particular apparatus. Specific conditions used to produce selected silicon nanoparticles in particular apparatuses are described below in the Examples. Furthermore, some general observations on the relationship between reaction conditions and the resulting particles can be made.

Reactant velocity of the reactant gas stream is inversely related to particle size so that increasing the reactant velocity tends to result in smaller particle sizes. A significant factor in determining particle size is the concentration of product composition condensing into product particles. Reducing the concentration of condensing product compositions generally reduces the particle size. The concentration of condensing product can be controlled by dilution with non-condensing, e.g., inert, compositions or by changing the pressure with a fixed ratio of condensing product to non-condensing compositions, with a reduction in pressure generally leading to reduced concentration and a corresponding reduction in particle size and vice versa, or by combinations thereof, or by any other suitable means. Light power also influences particle size with increased light power favoring larger particle formation for lower melting temperature materials and smaller particle formation for higher melting temperature materials.

The use of a radiation, e.g., light, beam, to drive the reaction can result in a localized reaction zone that leads to high uniformity of the particles. Beyond the reaction zone, the product flow comprises product particles, unreacted reactants, reaction by-products and inert gases. The product flow can continue to a collector at which at least a significant portion of the product particles are harvested from the flow. An effectively continuous supply of reactants initiate a reactant flow directed to the reaction zone. Removal of product particles from the product flow prior to venting during the course of the reaction characterizes the reaction process within the flowing reactant system.

To perform laser pyrolysis, one or more reactants can be supplied in gas phase or vapor phase. Suitable gaseous reactants for elemental silicon particle formation and dopant reactants are described below. Alternatively or additionally, one or more reactants can be supplied as an aerosol. The use of an aerosol provides for the use of a wider range of precursors for laser pyrolysis than are suitable for vapor delivery only. Suitable control of the reaction conditions with the selected reactant flow results in submicron/nanoscale particles with a narrow particle size distribution.

A representative laser pyrolysis apparatus for use with the nozzle designs described herein is shown in FIG. 1. In the embodiment in FIG. 1, the apparatus comprises a reactant delivery system 102, a reaction chamber 104, an optical system 106 to deliver a light beam and a collection system 108. Reactant delivery system 102 can comprise a reactant source 110, reactant inlet nozzles 112, 114, 116 and a manifold 118. Reactant inlet nozzles 112, 114, 116 are configured to initiate a reactant flow through reaction chamber 104, and manifold 116 is configured to deliver reactant flow from reactant source 110 to reactant inlet nozzles 112, 114, 116. Collection system 108 can comprise exhaust conduits 120, 122, 124 that direct the product flow from reaction chamber 104, and exhaust conduits 120, 122, 124 can be positioned such that the flow from reactant inlet nozzles 112, 114, 116 inherently follows a path roughly towards the exhaust conduits 120, 122, 124. As shown in FIG. 1, reactant inlet nozzles 112, 114, 116 for reaction chamber 104 are placed on the bottom of reaction chamber 104 and exhaust conduits 120, 122, 124 are placed along the top of reaction chamber 104. In alternative or additional embodiments, these positions can be reversed with reactant inlet nozzles 112, 114, 116 positioned along the top of reaction chamber 104 and exhaust conduits 120, 122, 124 positioned along the bottom of reaction chamber 104. Similarly, a fraction of a set of inlet nozzles can be placed along the top of the reaction chamber and a fraction of the inlet nozzles can be placed along the bottom of the reaction chamber.

As shown in FIG. 1, reaction chamber 104 has the approximate shape of a rectangular parallelepiped, although other shapes, such as a generally cylindrical shape, can be used as appropriate. As noted above, the embodiments of particular interest described herein comprise nozzles with a series of flow channels and a reactant inlet configured to surround an inert gas flow, as described in more detail below. As shown in FIG. 1, the laser pyrolysis apparatus is configured with three reactant inlet nozzles 112, 114, 116 flowing through a single reaction chamber 104. In alternative or additional embodiments, the reaction chamber can be configured with a single reactant inlet nozzle, two reactant inlet nozzles, four reactant inlet nozzles or more than four reactant inlet nozzles. In general, the number of reactant inlet nozzles may be constrained due to the attenuation of the light beam as it passes through the flow from other reactant inlet nozzles. As shown in FIG. 1, reactant inlet nozzles 112, 114, 116 are collinear such that a light beam can pass through the flow from all of the reactant inlet nozzles 112, 114, 116 although if the optical path is adjusted appropriately, other reactant inlet nozzle configurations can be used.

Reaction chamber 104 can be constructed, for example, from metal components, such as stainless steel or the like. In some embodiments, portions of the interior of reaction chamber 104 can be coated with a polymer, such as polytetrafluoroethylene, polycarbonate, polyamides or other suitable polymer or combinations thereof, or with a ceramic composition, such as silica, silicon nitride, other suitable ceramic composition or combinations thereof. Coating of a metal reaction chamber and/or the reactant inlet nozzle or portions thereof may reduce metal contaminants in the product flow. In addition, the reaction chamber and/or nozzle components can be formed from ceramics, such as silica or quartz, to provide low contaminant levels while maintaining a durable apparatus.

Optical system 106 can comprise a light source 126, optical element 128, and a beam dump 130 or the like. In operation, light emitted from light source 126 pass through optical element 128 and into reaction chamber 104. Light emitted from light source 126 that is not absorbed in reaction chamber 104 by the reactant stream then passes into beam dump 130 where the optical path is terminated. Light source 126 can comprise a laser or other intense light source. While laser pyrolysis can be performed with radiation at a variety of optical frequencies, convenient light sources operate in the infrared portion of the electromagnetic spectrum, although other wavelengths can be used, such as the visible and ultraviolet regions of the spectrum. Excimer lasers can be used as ultraviolet sources. $CO_2$ lasers are particularly useful sources of infrared light. Suitable $CO_2$ lasers are commercially available. Beam dump 130 can comprise commercial power meters. An appropriate power meter for a $CO_2$ laser is available from Coherent Inc., Auburn, Calif. Optical element 128 can comprise lenses mirrors, windows, or the like. Optical element 128 can be used to control the optical path of the output beam generated from light source 126. For example, a cylindrical lens can be used to focus the beam in a single dimension. In such an example, the thickness of the beam along the vertical dimension can be narrowed without narrowing the beam in the horizontal dimension so as to allow a wider reactant flow can pass through the beam. Alternatively or additionally, telescopic optics can be used as described in published U.S. patent application 2005/0200036A to Mosso et al., entitled "Particle Production Apparatus," incorporated herein by reference. While the embodiment of an optical system depicted in FIG. 1 comprises only one optical element, in other embodiments an optical system can comprise a plurality of optical elements. In general, optical system 106 can further comprise light tubes 132, 133 that enclose the beam generated from light source 126 on its path to the beam dump. Additionally, light tubes 132, 133 can also provide the spacing of optical elements away from reaction chamber 104 to reduce contamination of the optical element 128 with compositions flowing through reaction chamber 104. Appropriate flows of inert shielding gas can also be flowed into light tubes 132, 133 to reduce contamination of optical elements 128.

Collection system 108 can comprise filter elements 134, 136, 138, a negative pressure device 140, and conduits 120, 122, 124. Filter elements 134, 136, 138 can comprise filter mediums that divides a clean plenum downstream from the filter element and a product plenum upstream from the filter element. Alternatively, filter elements 134, 136, 138 can comprise electrostatic collectors to remove particles from the flow. A bag style collector suitable for a laser pyrolysis apparatus is described further in U.S. Pat. No. 6,270,732 to Gardner et al., entitled "Particle Collection Apparatus and Associated Methods," incorporated herein by reference. Suitable negative pressure devices can comprise, for example, a blower, a pump, such as a mechanical pump or vacuum pump, an aspirator or other suitable devices that can maintain a desired pressure and flow through the apparatus. The collection system can further comprise a scrubber or the like to remove any unreacted precursor compositions and/or reaction byproducts prior to venting the exhaust gas.

Figure 2:
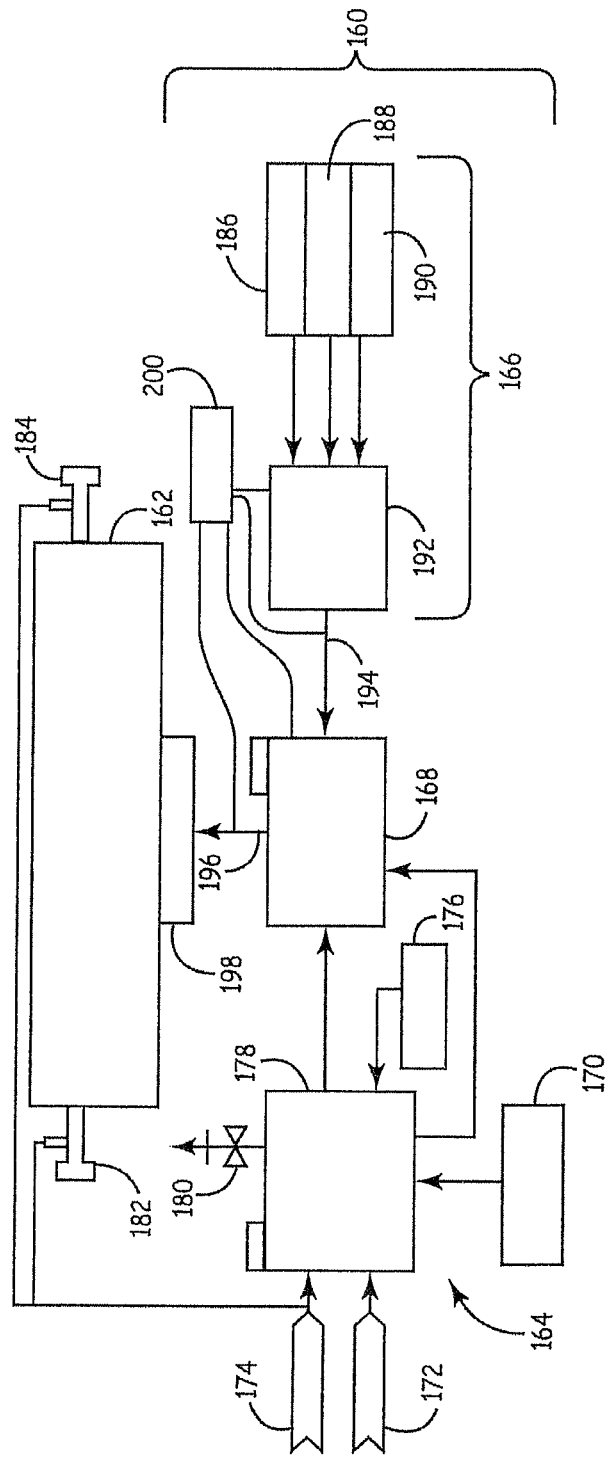
FIG. 2 is a schematic representation of a reactant delivery system.

A representative reactant delivery system is shown in FIG. 2. In general, a reactant delivery system can be configured with a plurality of different precursor sources. The configuration shown schematically in FIG. 2 can be designed for the synthesis of silicon particles with an optional selected dopant. Suitable silicon precursors include, for example, gaseous compounds. Dopant precursors can be gaseous compounds and/or liquid or solid compounds with sufficient vapor pressure. Precursor compounds can optionally be delivered with a carrier gas, and mass flow controllers can be used to control the flow through the system. In some embodiments, a flash evaporator can be used to deliver a selected partial pressure of a compound with excellent control and reproducibility. The reactant flow can also be optionally combined with an inert diluent gas to modulate the reaction conditions.

FIG. 2 shows an embodiment of reactant delivery system 160 in relation to a reaction chamber 162. Reactant delivery system 160 is suitable for the delivery of the reaction precursor component of a reaction stream to an inlet nozzle such as reactant inlet nozzles 112, 114, 166 depicted in FIG. 1. In particular, reactant delivery system 160 is suitable for the delivery of vapor/gaseous reactants. As shown in FIG. 2, reactant delivery system 160 comprises a gas delivery subsystem 164 and a vapor delivery subsystem 166 that both join a mixing subsystem 168. Gas delivery subsystem 164 can comprise one or more gas sources, such as a gas cylinder or the like for the delivery of gases into the reaction chamber. As shown in FIG. 2, gas delivery subsystem 164 comprises reactant gas sources 170, 172, inert gas source 174, and an optional light absorbing gas source 176 that can supply a light absorbing gas for laser pyrolysis. A reactant stream comprising light absorbing gas can be desirable if a reaction precursor does not sufficiently absorb the intense light. In other embodiments, gas delivery subsystem 164 can comprise a different number of gas sources such that desired reactant gases and/or other gases can be selected as desired.

The gases combine in a gas manifold 178 where the gases can mix. Gas manifold 178 can have a pressure relief valve 180 for safety. Inert gas source 174 can be also used to supply inert gas to the interior of light tubes 182, 184 used to reduce contamination of any optical elements associated with the light tubes. Mass flow controllers can be used to regulate the flow of gases to gas manifold 178.

Vapor delivery subsystem 166 comprises a plurality of flash evaporators 186, 188, 190. Although shown with three flash evaporators, vapor delivery subsystem can comprise, for example, one flash evaporator, two flash evaporators, four flash evaporators or more than four flash evaporators to provide a desired number of vapor precursors that can be selected for delivery into reaction chamber 162 to form desired inorganic particles. Each flash evaporator can be connected to a liquid reservoir to supply liquid precursor in suitable quantities. Suitable flash evaporators are available from, for example, MKS Equipment or can be constructed from readily available components. The flash evaporators can be programmed to deliver a selected partial pressure of the particular precursor. The vapors from the flash evaporator are directed to a manifold 192 that directs the vapors to a common feed line 194. The vapor precursors mix within manifold 192 and common feed line 194. A flash evaporator can be replaced by a solid precursor delivery apparatus, which can heat a solid to generate a vapor that can then be delivered with a carrier gas if desired. The carrier gas can be, for example, an infrared absorber, a secondary reactant, an inert gas or mixtures thereof.

The gas compositions from gas delivery subsystem 164 and vapor compositions from vapor delivery subsystem 166 are combined within mixing subsystem 168. Mixing subsystem 168 can be a manifold that combines the flow from gas delivery subsystem 164 and vapor delivery subsystem 166. In the mixing subsystem 168, the inputs can be oriented to improve mixing of the combined flows of different vapors and gases at different pressures. The mixing block can have a slanted termination to reduce backflow into lower pressure sources. A conduit 196 leads from mixing subsystem 168 to a reactant inlet nozzle 198 and ultimately to reaction chamber 162. Where the reactant delivery system comprises a plurality of reactant inlet nozzles, such as in the embodiment of a laser pyrolysis apparatus depicted in FIG. 1, conduit 196 can comprise a manifold to deliver a portion of the reactant stream to each of the reactant inlet nozzles or each reactant delivery nozzle can be configured with a distinct reactant delivery system, such as reactant delivery system 160.

Reactant delivery system 160 can be configured to deliver a selected reactant composition based on a supply with a range of precursors and other reactants to tune a particular inorganic particle composition without refitting the unit since a number of precursors supplies can be integrated together within the unit simultaneously. For the formation of complex materials and/or doped materials, a significant number of reactant sources and, optionally, separate reactant ducts can be used for reactant/precursor delivery. For example, as many as 25 reactant sources and/or ducts are contemplated, although in principle, even larger numbers could be used. For the formation of doped elemental silicon particles, generally only a silicon precursor and a more modest number of dopant sources can be used in the reactant delivery system.

Referring to FIG. 2, a heat controller 200 can be used to control the temperature of various components through conduction heaters or the like throughout the vapor delivery subsystem 166, mixing subsystem 194 and/or conduit 196 to reduce or eliminate any condensation of precursor vapors. A suitable heat controller is model CN132 from Omega Engineering (Stamford, Conn.). Overall precursor flow can be controlled/monitored by a DX5 controller from United Instruments (Westbury, N.Y.). The DX5 instrument can be interfaced with mass flow controllers (Mykrolis Corp., Billerica, Mass.) controlling the flow of one or more vapor/gas precursors. Pressure sensors can be used to monitor the chamber pressure, and appropriate control systems, feedback devices and the like can be used to control the operation of the system. Valves, such as automated valves, can also be used to control the flow and pressure within the system. The automation of the unit can be integrated with a controller from Brooks-PRI Automation (Chelmsford, Mass.). A description of a comparable reactant delivery system for a laser pyrolysis with alternative reactor and nozzle designs is provided in published U.S. patent application 2009/0020411A to Holunga et al., entitled "Laser Pyrolysis With In-Flight Particle Manipulation for Powder Engineering," incorporated herein by reference.

Figure 3:
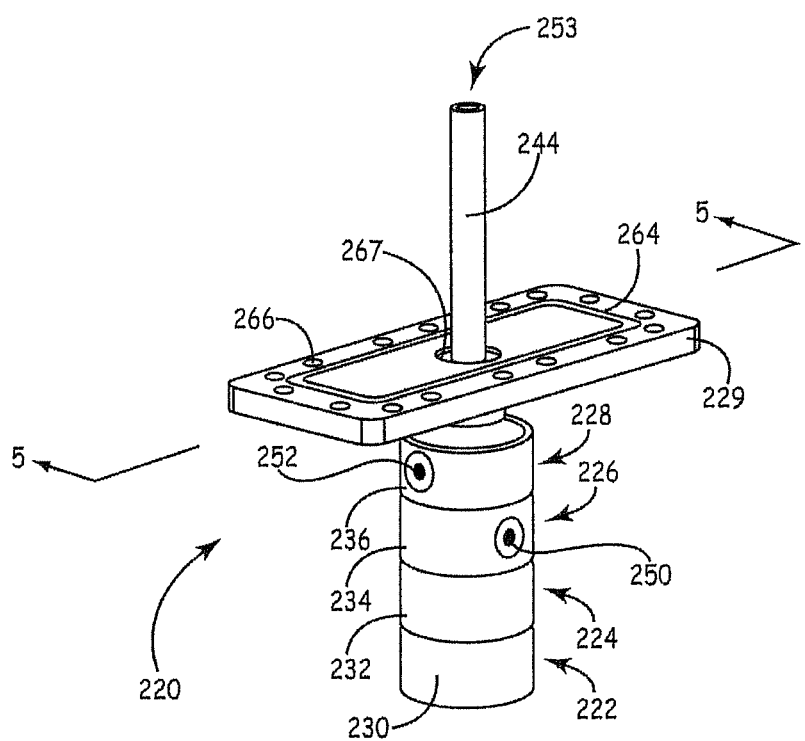
FIG. 3 is a perspective side view of a reactant inlet nozzle comprising annular flow channels.
Figure 6:
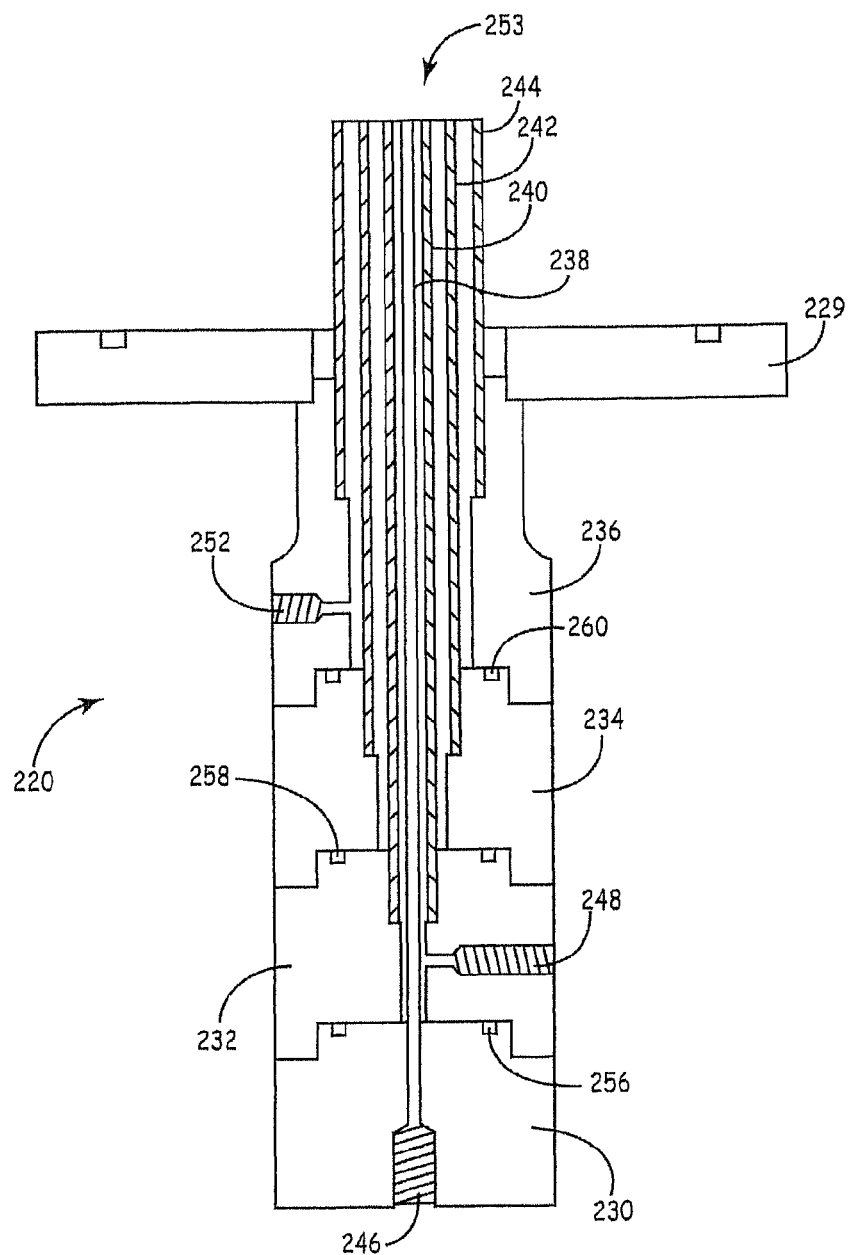
FIG. 6 is a sectional side-view of the reactant inlet nozzle depicted in FIG. 3, in which the same section is shown as in FIG. 5 and in which the dimensions of the flow channels and corresponding structure is expanded to facilitate viewing.

FIGS. 3-6 show an embodiment of a reactant inlet nozzle 220 separated from a reaction chamber. Reactant inlet nozzle 220 can be desirable for the formation of silicon nanoparticles and can also be used effectively for the synthesis of other nanoparticles using laser pyrolysis. Furthermore, reactant inlet nozzle 220 has the advantage of a robust design that is amenable to the exchange of elements for cleaning, repair, or for modification of the reactant flow. FIG. 3 depicts reactant inlet nozzle 220 in an assembled configuration, and FIG. 4 depicts a partially exploded view of reactant inlet nozzle 220. FIGS. 5 and 6 depict cross-sectional views of nozzle 220 in an assembled configuration. Reactant inlet nozzle 220 comprises flow elements 222, 224, 226, 228 in a nested configuration. Reactant nozzle 220 can also desirably comprise sealing plate 229. Sealing plate 229 comprises trough 265, bolt holes 266 and a central hole 267. Sealing plate 262 is designed to secure reactant inlet nozzle 220 to a reaction chamber with bolts that extend through bolt holes 266. A portion of flow element 238 extends through central hole 267 such that the nozzle extends into the reaction chamber for the delivery of reactants in a reactant flow. A seal can be established between sealing plate 262 and flow element 238, for example, with a rubber or polymer gasket, with a weld or other appropriate method. A rubber gasket, other polymer gasket or the like can be placed within trough 265 to affect a seal between sealing plate 262 and the reaction chamber upon connection of the nozzle to a reactor.

Each flow element 222, 224, 226, 228 comprises a support hub 230, 232, 234, 236, a flow tube 238, 240, 242, 244, and an access port 246, 248, 250, 252. In this embodiment, each support hub approximately forms a cylindrical block with a central channel, and each flow tube approximately forms a cylinder. Each flow element is constructed such that the corresponding flow tube rests within a recess within the central channel of the corresponding support hub. Each access port extends through the block to the central channel of the corresponding support hub and forms a delivery channel within the lumen of the corresponding flow tube, which may be bounded by the exterior of an inner flow tube except for flow tube 238, which is at the center of the nozzle. In a nested configuration, flow elements 222, 224, 226, 228 are assembled such that the flow tubes form a nozzle comprising concentric cylinders with a common central axis. Referring to FIGS. 3-6, access port 246 extends through the bottom of support hub 230 and forms a delivery channel between the exterior of support hub 230 and flow tube 238. Access ports 248, 250, 252 extend through the side of corresponding support hubs 232, 234, 236 and form delivery channels between the exterior of each support hub 232, 234, 236 and the central channel of the respective support hub.

Reactant inlet nozzle 220 is configured in a nested configuration. Flow element 226 is placed in contact with the opposite surface of flow element 228, relative to sealing plate 262, such that flow tube 242 extends into the lumen of flow tube 244. Flow element 224 is placed in contact with the opposite surface of flow element 226, relative to sealing plate 262, such that flow tube 240 extends into the lumen of flow tubes 242, 244. Flow element 222 is placed in contact with the opposite surface of flow element 224, relative to sealing plate 262, such that flow tube 238 extends into the lumen of flow tubes 240, 242, 244. Nested flow tubes 238, 240, 242, 244 form an annular nozzle 253 comprising an inner lumen defined by flow tube 238 and an outer lumen defined by flow tube 244. Furthermore, in this embodiment, the relative orientation of each flow element 222, 224, 226, 228 of reactant inlet nozzle 220 about the common long axis of flow tubes 238, 240, 242, 244 can be desirably configured such that access ports 250, 248 are rotated 90° and 180°, respectively, from access ports 242 to provide for convenient connection of supply tubes to the access ports. However, in other embodiments of a reactant inlet nozzle, other relative orientations of the flow elements can be used as desirable. Reactant inlet nozzle 220 can further comprise bolts 254 that secure together flow elements 222, 224, 226, 228 and as well as fix the relative orientation of flow elements 222, 224, 226, 228 about the common long axis of flow tubes 238, 240, 242, 244.

Sealing elements 256, 258, 260 are located between flow elements 222, 224, between flow elements 224, 266, and between flow elements 226, 228, respectively. Sealing elements 256, 258, 260 are designed to provide a fluid tight seal at the interface between adjacent flow elements 222, 224, 226, 228. Sealing elements 256, 258, 260 can be formed from rubber o-rings, other polymer materials or the like.

The diameters of flow tubes 238, 240, 242, 244 generally are designed to have the dimensions of reactant stream roughly match the dimensions of the light beam positioned to intersect with the reactant stream. In particular, approximately the entire reactant stream should flow through the beam, so that the inner diameter of annular flow channel contributing the reactant stream generally is approximately the same width or somewhat smaller than the width of the light beam in the vicinity of nozzle 253. In some embodiments of particular interest, inert gas flows through tubes 238, 242, 244, and reactants and other diluents flow through tube 240. The inner diameter of the flow tube corresponding to the reactive stream component comprising reaction precursors generally can have dimensions from about 3.0 inches (76.2 mm) to about 0.05 inches (1.27 mm), in additional embodiments from about 2.0 inches (50.8 mm) to about 0.075 inches (1.91 mm) and in further embodiments from about 2.0 inches (50.8 mm) to about 0.1 inches (2.54 mm). The outer diameter of the flow tube 238 corresponding to the reactive stream component comprising an inner shielding gas supply tube can be from about 0.20 to about 0.85 and in further embodiments from about 0.25 to about 0.75 times the inner diameter of the tube providing the reactive flow. The outer diameter of the annular nozzle 253 generally can be from about 4 times to about 1.5 times, and in further embodiments from the 3.5 times to about 2 times the outer diameter of the flow tube providing the component of the reactant stream comprising the reactive flow, in which the outer diameter is the sum of the inner diameter and the wall thickness. A person of ordinary skill in the art will recognize that additional ranges of tube dimensions within the explicit ranges above are contemplated and are within the present disclosure. The lengths of the tubes are selected to position the flow near the light beam based on the particular reactor configuration. The components of the flow elements can be formed from suitable metals, such as stainless steel or other suitable metal.

It can be desirable to flow inert entrainment gas between the inner wall of flow tube 244 and the outer wall of flow tube 242. To perform the entrainment function, the entrainment gas flow generally has a somewhat higher gas velocity out from the nozzle and a significant flow volume. To achieve the desired flow volume of the entrainment gas at reasonable gas velocities, the area of the annulus contributing the entrainment gas flow generally is relatively large. In particular, the area of the inlet opening for the entrainment gas between flow tubes 242, 244 can be at least about 10% larger than the area between flow tubes 240 and 242 providing for inert quenching gas flow, in further embodiments from about 12% to about 500% larger and in additional embodiments from about 15% to about 200% larger than the area between flow tubes 240 and 242. Similarly, in use, the entrainment flow volumes of at least about 50% greater, in some embodiment from about 60% larger to about 1000% greater and in further embodiments from about 75% greater to about 750% greater than the flow volume of quenching inert gas. A person of ordinary skill in the art will recognize that additional ranges of flow areas within the explicit ranges above are contemplated and are within the present disclosure. Additional desirable nozzle designs are described below that generally incorporate flow channels for inert quenching gas and distinct channels for inert entrainment gas, and the relationships of the areas of the inlets for these flow channels can be based on the ranges provided above for the embodiment in FIGS. 3-6.

The walls of inner flow tubes 238,240,242 can be relatively thin. If the walls of the inner flow tubes are thin, the respective flows from the flow tubes have a desired interaction within the reaction chamber. In particular, with a thin wall of a flow tube, interfacial shear is enhanced between the adjacent flows especially if the flows are adjusted to result in similar velocities of the flow, and the interfacial shear can help particle quenching. With respect to the thickness of the inner walls of the flow tubes, the walls can have a thickness from about 0.0025 inches (0.0635 mm) to about 0.050 inches (1.27 mm), in further embodiments from about 0.003 inches (0.0762 mm) to about 0.040 inches (1.02 mm), and in other embodiments form about 0.0035 inches (0.0889 mm) to about 0.030 inches (0.762 mm). The outer flow tube can have a thicker wall to provide for protection of the assembled nozzle without altering the flow significantly since there is no adjacent flow at the outer wall of the nozzle. A person of ordinary skill in the art will recognize that additional ranges of tube thickness within the explicit ranges above are contemplated and are within the present disclosure.

Reactant inlet nozzle 220 provides an easy to assemble design with significant flexibility for delivery of reactants with appropriate shielding gas. Access ports 246, 248, 250, 252 provide for connection of the nozzle to a reactant delivery system with selected connections to provide for delivery of reactive compositions, inert gases combinations thereof or the like through corresponding flow tubes 238, 240, 242, 244. Reactant inlet nozzle 220 can be disassembled for cleaning and/or replacement of one component. Thus, the dimensions of flow tubes 238, 240, 242, 244 can be modified to correspondingly alter the flow. While reactant inlet nozzle 220 is shown with four flow tubes 238, 240, 242, 244, the design of reactant inlet nozzle 220 allows for the simple modification for two flow tubes by leaving out two flow elements from assembly, three flow tubes by leaving out two flow elements from the assembly, or five or more flow tubes by including additional flow elements within the assembly, each additional flow element comprising a support hub, a flow tube, and an access port, as described above. Furthermore, a flow tube designed to provide shielding gas can have a rod or other cover, such as a porous sintered metal cap, over the opening of the flow tube to restrict the flow such that less inert shielding gas is needed to maintain the velocity of the shielding gas flow, which is established to provide little interfacial shear at the interface between the precursor flow and the shielding gas flow.

In operation, components of a flow stream are supplied to reactant inlet nozzle 220 though each access port 246, 248, 250, 252. The component of the flow stream supplied to access port 246 travels through the lumen of flow tube 238. The component of the flow stream supplied to access ports 248, 250, 252 travel through the annular flow channels formed between flow tubes 238, 240, between flow tubes 240, 242, and between flow tubes 242, 244, respectively. Each flow stream component exits reactant inlet nozzle 220 at top of annular nozzle 253, which is placed within a reaction chamber.

Generally, different components of a reactant flow stream are supplied to different nozzle access ports. For example, with respect to reactant inlet nozzle 220, it can be desirable to distribute the components of the reactant stream such that the component comprising reaction precursors are supplied to access port 248, while the components comprising an inner inert gas, an outer inert gas, and an entrainment gas flow are supplied to access ports 246, 250, 252, respectively. A reactant delivery system similar to reactant delivery system 160, depicted in FIG. 2, can be used to supply reaction precursors to access port 248. The inner inert gas, outer inter gas, and entrainment gas can be supplied to access ports 246, 250, 252 from suitable gas reservoirs that allow for delivery of the corresponding gasses over appropriate pressure ranges. However, other distributions of reactant stream components to access ports 246, 248, 250, 252 can also be desirable.

While reactant inlet nozzle 220 provides significant advantages, alternative designs which provide similar nested flow channels can be adapted around the concepts provided in this embodiment of a reactant inlet nozzle. For example, while the support hub design is convenient and versatile, the design can be replaced with an integral machined unit that provides equivalent flow channels and access ports. Furthermore, while flow tubes with a circular cross section perpendicular to the central axis of the flow tube provide for good flow properties, other cross sectional shapes can be used, such as a square or rectangular shape, optionally with rounded corners. Other flow tube shapes can be similarly used. In general, regardless of the shape, the reactant stream from annular nozzle 253 passes through the light beam within the reaction chamber, and it is desirable for the width of the reactant stream be selected such that essentially the entire reactant stream passes through the light beam based on the width of the light beam passing through the reaction chamber.

Figure 7A:
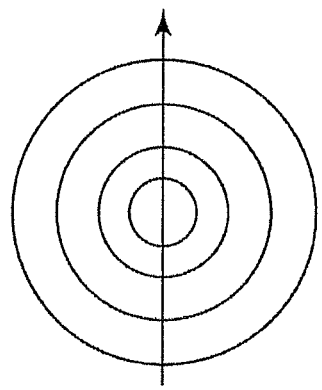
FIG. 7A is a top plan view of the reactant inlet nozzle depicted in FIG. 3.
Figure 7B:
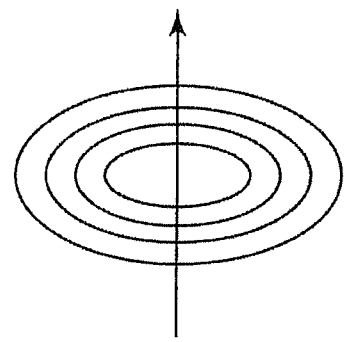
FIG. 7B is a top plan view of an alternative embodiment of a reactant inlet nozzle comprising flow tubes having an oval cross-sectional shape.

As shown in FIGS. 3-6, the flow tubes are approximately cylindrical. This design provides for flow behavior that can be estimated, and this design provides for convenient manufacturing. However, alternative shapes can be used that can be expected to provide roughly comparable behavior. Referring to FIG. 7A, the top view of nozzle 220 of FIG. 3-6 is shown with circular edges of the flow tubes. Referring to FIG. 7B, a top-view of an alternative embodiment is depicted looking down into the flow channels for flow tubes with an oval shaped cross section. The arrows in FIGS. 7A and 7B show the general direction of the light beam path relative to the edge of the nozzle. A rectangular nozzle without an inner inert quenching gas flow but with a small optical path length through the reactant flow is described in detail below.

Figure 8:
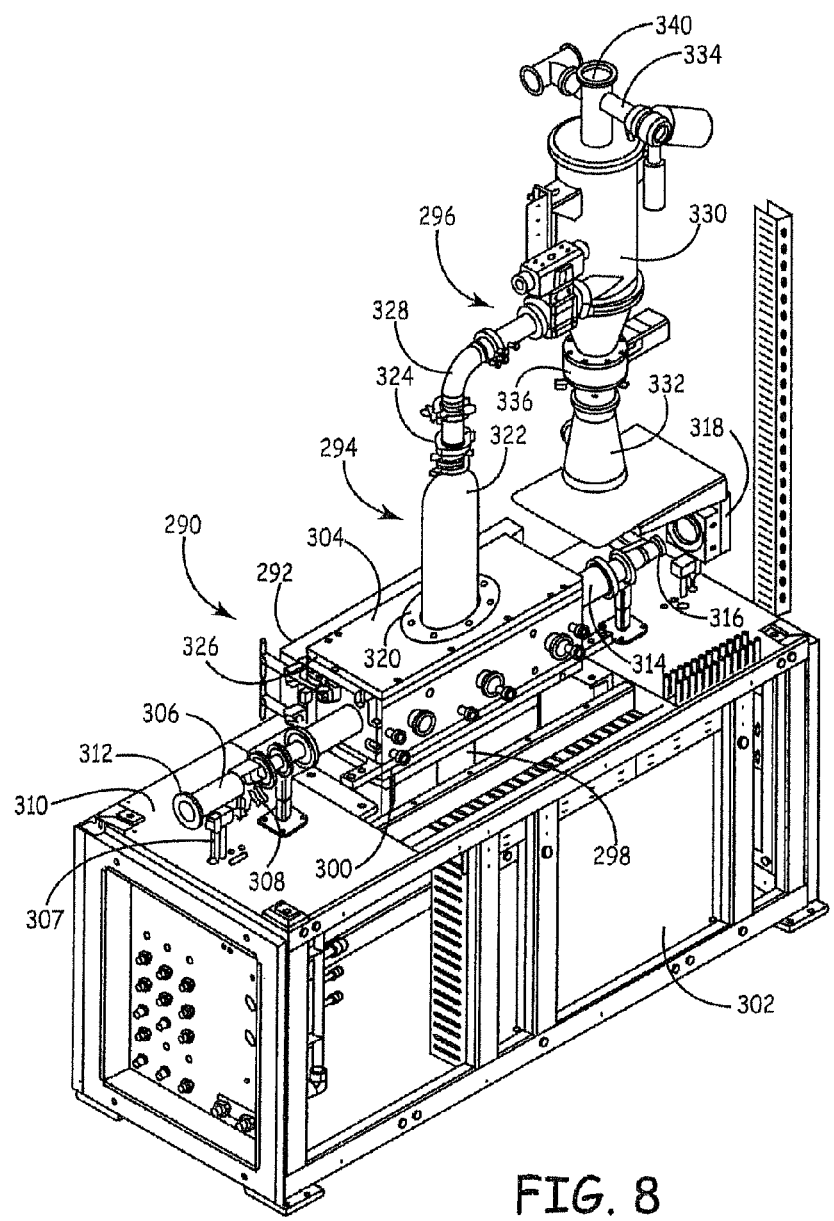
FIG. 8 is a perspective view of a laser pyrolysis apparatus comprising a single reactant inlet nozzle and a single collection apparatus.

An alternative embodiment of a laser pyrolysis apparatus is shown in FIG. 8. Referring to FIG. 8, a laser pyrolysis apparatus 290 includes reaction chamber 292, particle transfer element 294, and a particle collection system 296. Reaction chamber 292 interfaces with reactant inlet nozzle 298 at a bottom surface 300 of reaction chamber 292 where reactant delivery system 302 connects with reaction chamber 292. Particle transfer element 294 connects along a top surface 304 with reaction chamber 292. In this embodiment, the reactants are delivered from the bottom of reaction chamber 292 while the products are collected from the top of reaction chamber 292. Reactant inlet nozzle 298 can have a nozzle structure with the annular channels similar to the configuration shown in FIGS. 5 and 6.

First light tube 306 is configured to direct a light beam path through reaction chamber 292 along the length of the chamber. First light tube 306 comprises a cylindrical lens 308 oriented to focus along the direction oriented along a normal between top surface 304 to bottom surface 300 of reaction chamber 292 while not focusing the light along the direction parallel to a table top 310. Inert gas is directed into a first tube 307 from gas tubing to keep contaminants away from optical components. First light tube 306 connects directly or indirectly with a light source at flange 312. The light beam path continues through reaction chamber 292 to a second light tube 314. Second light tube 314 is terminated with a window 316 that directs the beam to a beam dump 318, for example, a light meter. In operation, the light beam, generally from a $CO_2$ laser, intersects a reactant stream generated from reactant inlet nozzle 298.

Particle transfer element 294 can comprise an attachment plate 320, a flow conduit 322 and cooling collar 324. Attachment plate 320 provides for secure fastening of particle transfer element 294 to a top plate 326. Cooling collar 324 is secured with a gas tight seal to flow conduit 322 with a fastening band or the like, although, in other embodiments, flow collar 504 can be welded or otherwise fastened to form a gas tight seal. Furthermore, cooling collar 324 provides for flow of product stream from flow conduit 322 to particle collection system 296. Cooling collar 324 is designed to reduce the temperature of the product stream flowing therein, for example, by mixing the product stream with an inert gas supplied from the exterior of cooling collar 324. A cooling collar design using gas jets is described in detail in U.S. patent application publication number 2009/0020411A1 to Holunga et al., entitled "Laser Pyrolysis with In-Flight Particle Manipulation for Powder Engineering," incorporated herein by reference. In operation, product stream flows from reaction chamber 292, through flow conduit 322 and cooling collar 324, to particle collection system 296.

Particle collection system 296 comprises flow tube 328, collection chamber 330 and container 332. Flow tube 328 provides a fluid connection between cooling collar 324 and collection chamber 330. Collection chamber 330 can comprise a single bag collector which uses a flexible bag to separate a product plenum from a clean plenum. Back pulse system 334 provides occasional back pulses of gas to remove product powders from the bag membrane so that the powders fall to the bottom of collection chamber 330. The bottom of collection chamber 330 is connected with valve 336 that is releasably connected to container 332. When valve 336 is open powder can fall into container 332. To remove and replace container 332, valve 336 can be closed. Collection chamber 330 also leads to a vent 340 that generally is connected to a scrubber and a pump. Other collection systems can be used in place of the single bag collector if desired.

Figure 12:
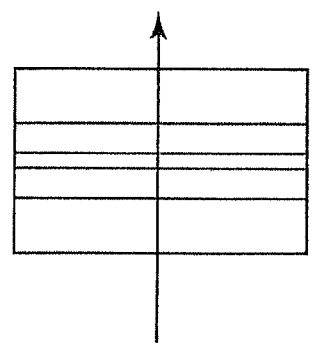
FIG. 12 is a top plan view of the opening of reactant inlet nozzle depicted in FIG. 9, showing only the flow channels.
Figure 9:
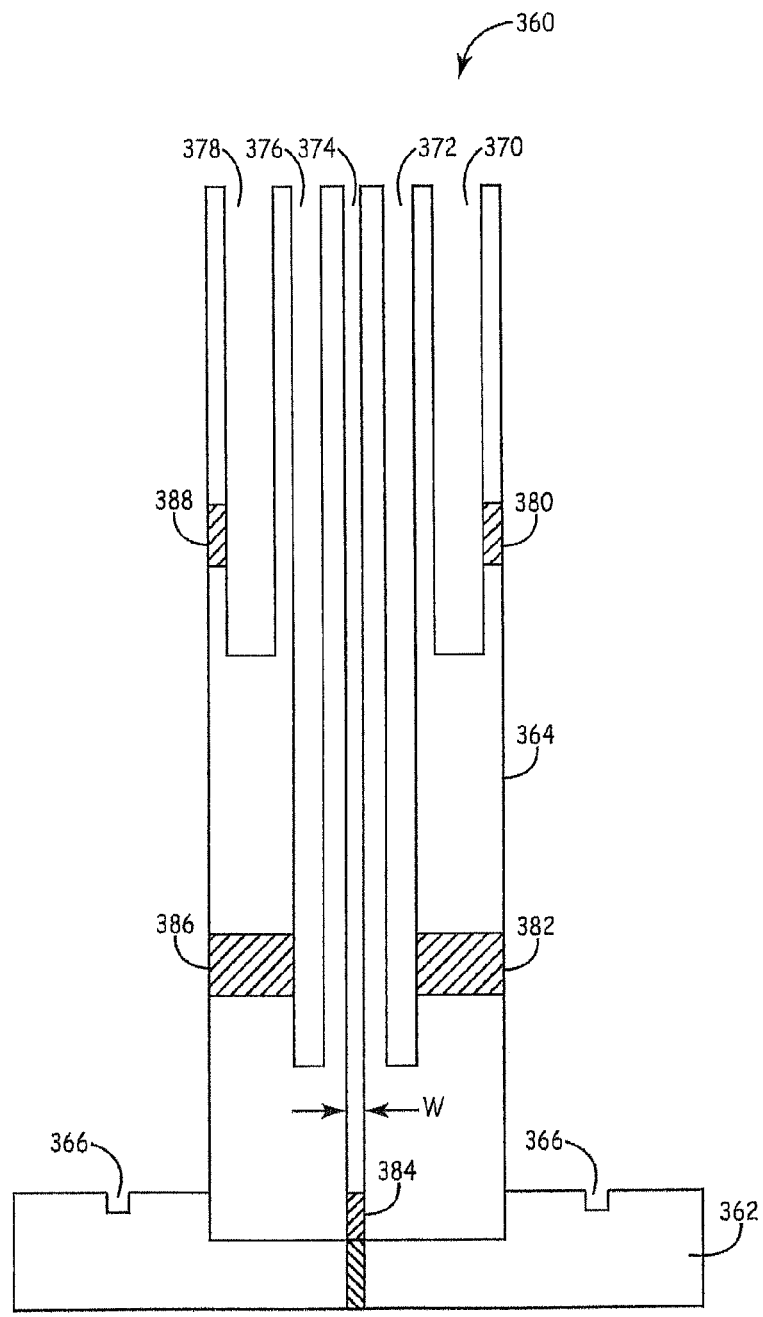
FIG. 9 is a sectional side view of a reactant inlet nozzle comprising adjacent rectangular flow channels, in which the cross section is taken along line 9-9 of FIG. 10.
Figure 10:
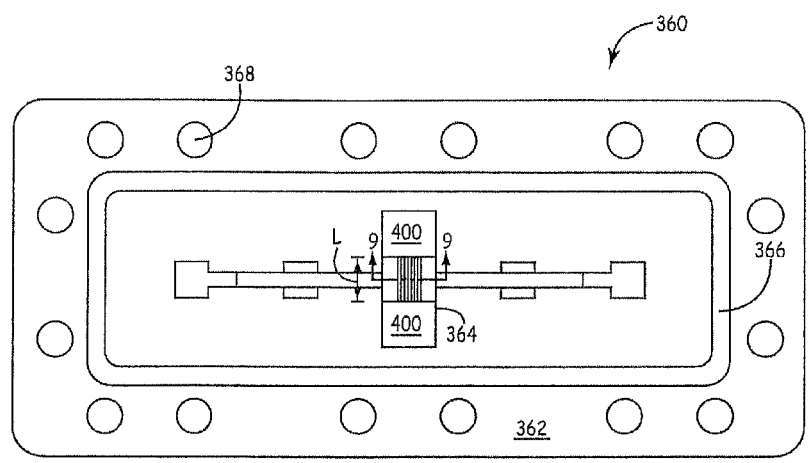
FIG. 10 is a top plan view of the reactant inlet nozzle depicted in FIG. 9.
Figure 11:
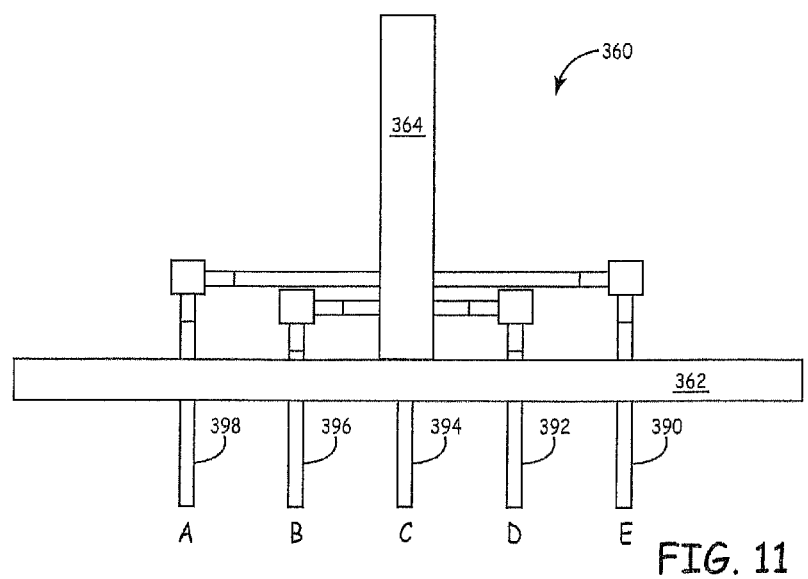
FIG. 11 is a side plan view of the reactant inlet nozzle depicted in FIG. 9.

FIGS. 9-11 show an alternate embodiment of a reactant inlet nozzle. Reactant inlet nozzle 360 comprises a plurality of adjacent rectangular flow channels. Reactant inlet nozzle 360 can be desirable for the formation of silicon nanoparticles and can also be used effectively for the synthesis of other nanoparticles using laser pyrolysis. Reactant inlet nozzle 360 can be advantageous because it can promote homogenous reaction conditions in the reactant stream during product particle formation. In particular, the reactant inlet nozzle design depicted in FIGS. 9-11 can help reduce attenuation of the laser beam across the reactant stream. FIG. 9 depicts a side-view cross section of reactant inlet nozzle 360. FIGS. 10 and 11 depict a top view and a side-view, respectively, of reactant inlet nozzle 360. A top view of just the flow channels is shown in FIG. 12 along with an arrow indicating the light beam path is shown in FIG. 12. FIG. 12 provides clarity with respect to the intended orientation of the nozzle within the reactor.

Referring to FIGS. 9-11, reactant inlet nozzle 360 comprises sealing plate 362 and flow element 364. Sealing plate 362 comprises trough 366 and bolt holes 368. Sealing plate 362 is secured at a flange to the lower portion of flow element 364 and is designed to secure reactant inlet nozzle 360 to a reaction chamber via bolt holes 368. A rubber gasket or the like can be place within trough 366 to affect an improved seal between sealing plate 362 and the reaction chamber.

Flow element 364 comprises flow channels 370, 372, 374, 376, 378 and access ports 380, 382, 384, 386, 388. Flow channels 370, 372, 374, 376, 378 have a substantially rectangular cross-sectional shape in a plane parallel to the top surface of sealing plate 362 in the orientation of the figure. Access ports 380, 382, 384, 386, 388 provide flow channels between the exterior of flow element 364 and corresponding flow channels 370, 372, 374, 376, 378. Reactant inlet nozzle 360 can also comprise component delivery tubes 390, 392, 394, 396, 398 that can be secured to corresponding access ports 380, 382, 384, 386, 388 and are routed through holes in sealing plate 362. Flow element 364 and deliver tubes 390, 392, 396, 398 can be formed from suitable metals, such as stainless steel or other suitable metal. In operation, components of the reaction stream are delivered through component delivery tubes 390, 392, 394, 396, 398, through corresponding access ports 380, 382, 384, 386, 388, and into corresponding flow channels 370, 372, 374, 376, 378.

Generally, different components of a flow stream are supplied to the respective access ports. With respect to reactant inlet nozzle 360, it can be desirable to distribute the components of the reactant flow stream such that the component comprising reaction precursors as well as possible diluents and the like are supplied to access port 394. In some embodiments, inert gasses can be supplied to access ports 392, 396 and inert entrainment gasses can be supplied to access ports 390, 398. Reaction stream components supplied to access ports 392, 396 may or may not be supplied from the same source and may or may not have the same composition and/or flow characteristics. Similarly, reaction stream components supplied to access ports 390, 398 may or may not be supplied from the same source and may or may not have the same composition and/or flow characteristics. In other embodiments, different distributions of flow stream components across access ports can be desirable.

The dimensions of flow channels 370, 372, 374, 376, 378 can be desirably selected to roughly match the dimensions of the light beam positioned to intersect with the reaction stream. In particular, approximately the entire reactant stream should flow through the beam, so that the length of the flow channels (marked as "L" in FIG. 10), i.e. the dimension of the flow channels that is perpendicular to the optical path of the light beam through the reactant stream and perpendicular to the flow of the flow stream that emanates out from the edge of the nozzle, generally is approximately the same width or somewhat smaller than the light beam in the vicinity or reactant inlet nozzle 360. Generally, the length of the flow channels is from about 0.5 cm to about 20 cm and in further embodiments from about 1 cm to about 10 cm. A person of ordinary skill in the art will recognize that additional ranges of flow channel dimensions within the explicit ranges above are contemplated and are within the present disclosure. The lengths of the tubes are selected to position the flow near the light beam based on the particular reactor configuration.

The walls of flow channels 370, 372, 374, 376, 378 (i.e. the surfaces of flow element 364 that form the flow channels) can be relatively thin. If the walls of the inner flow tubes are thin, the respective flows from the flow tubes have a desired interaction within the reaction chamber. In particular, with a thin wall between adjacent flow channels, interfacial shear is enhanced between the adjacent flows especially if the flows are adjusted to result in similar velocities of the flow, and the interfacial shear can help particle quenching. The thickness of walls between adjacent flows can be from about 0.05 mm to about 1.5 mm and in additional ranges from about 0.1 mm to about 1 mm. A person of ordinary skill in the art will recognize that additional ranges of flow channel dimensions within the explicit ranges above are contemplated and are within the present disclosure. The outer wall of the flow channels can be made thicker to provide protection to the overall nozzle structure since the thickness of the outer wall generally does not influence the flow. The height of the nozzle can be selected to position the flow near the light beam based on the particular reactor configuration.

Similarly, the dimensions of flow element 364 can be desirably selected to promote homogeneous reaction condition in the region of the reaction zone. In particular, the width "W" of reactant flow path 374 (as noted in FIG. 9), i.e. the dimension of the flow element that is perpendicular to the optical path of the light bean through the reactant stream, is selected to reduce the attenuation of the light beam along the optical path through the reactant stream. The width of the reactant flow path can be from about 0.1 mm to about 2 cm, in further embodiments from about 1.5 mm to about 1.5 cm and in additional embodiments from about 0.25 mm to about 1 cm. A person of ordinary skill in the art will recognize that additional ranges of flow channel dimensions within the explicit ranges above are contemplated and are within the present disclosure. The optical path values above can generally correspond with appropriate optical path distances for the nozzle configurations having an inner quench gas channel, such as shown in FIGS. 3-7. But in these other configurations the largest optical paths have components separated by the inner inert gas channel such that the light beam is attenuated going through the far portion of the flow due to absorption of light after the beam has passed through the closer section of the reactant flow. The effects of attenuation of the light beam may be reduced in the nozzle design in FIGS. 9-11. While the nozzle in FIGS. 9-11 is depicted with five flow channels symmetrically placed around an inner reactant precursor flow, additional embodiments can be formed with a single flow channel, with three flow channels, with seven flow channels or with more than seven flow channels.

Flow element 364 can have flow channels and access ports can be machined from a single block of material. Referring to FIG. 10, the flow channels can be machined in a central portion of the block, leaving un-machined regions of lateral support 400. However, in other embodiments, the flow element can be fabricated with wall elements that are removable. In such a design, the space between wall elements forms a portion of a rectangular flow channel. Removable wall elements are advantageous because they allow for the exchange of elements for cleaning, repair, or for modification of the reactant flow. In such embodiments, a flow element can comprise a frame providing the outer walls of the nozzle and a plurality of parallel, rectangular plates that can be secured with slots, spacer elements or other structural elements to maintain the selected spacing within the nozzle. A region defined by the surfaces of adjacent plates and the inner carrier surfaces between adjacent plates forms a rectangular flow channel. The number of rectangular plates and groves used in the construction corresponds to the number of flow channels. For example, if three flow channels are desired, three parallel groves are formed on each inner carrier surface and a rectangular plate is disposed between each of the three corresponding groves. If four flow channels are desired, four parallel groves are formed on each inner carrier surface and a rectangular plate is disposed between each of the four corresponding groves. Notwithstanding the specifics of the embodiment, any embodiment of a flow element wherein the wall elements are removable and wherein the spaces between the wall elements form rectangular flow channels designed to deliver components of a reactant stream can be desirable.

While the improved nozzle designs can used for the synthesis for a range of desired inorganic particles, based on a particular interest in the synthesis of elemental silicon particles with an optional dopant, additional discussion is devoted to these materials. A basic feature of successful application of laser pyrolysis for the production of desirable silicon particles is the generation of a reactant stream containing one or more silicon precursor compounds and optionally one or more dopant precursor compounds. As noted above, these approaches can be similarly used for the synthesis of germanium particles, and suitable germanium precursors are presented below. In some embodiments, a radiation absorber can be included in the flow, but for elemental silicon particles, suitable silicon precursors can be used that directly absorb infrared laser light. Dopant precursors can be introduced into the reactant flow for incorporation into the silicon particles. With respect to combined vapor and aerosol delivery approaches, a silicon precursor can be delivered as a vapor/gas, while one or more dopant precursors are delivered as an aerosol. However, for many desirable dopants, suitable dopant precursors can be delivered as a gaseous composition. The dopant elements can be delivered into the reactant stream as a suitable composition. For the doping of semiconductor substrates, desirable dopants include, for example, B, P, Al, Ga, As, Sb and combinations thereof.

Dopants can be introduced at desired concentrations by varying the composition of the reactant stream. A dopant element or a combination of dopant elements are introduced into the silicon host material by appropriately selecting the composition in the reactant stream and the processing conditions. Thus, submicron particles incorporating selected dopants, including, for example, complex blends of dopant compositions, can be formed. Generally, the conditions in the reactor should be sufficiently reducing to produce the elemental silicon or alloys for the product nanoparticles. Generally the silicon particles are crystalline, and the dopant can be an intercalation or alloying element. Based on the nozzle designs described herein, high quality silicon nanoparticles can be produced at desirable rates with or without dopants.

Suitable silicon precursors for elemental silicon particle formation include, for example, silane ($SiH_4$), disilane ($Si_2H_6$), trisilane ($Si_3H_8$), silicon tetrachloride ($SiCl_4$), trichlorosilane ($SiCl_3H$), and $SiCl_2H_2$. Silane, $SiH_4$, is a convenient precursor for laser pyrolysis since it absorbs infrared light from a $CO_2$ laser and decomposes to form crystalline silicon particles upon decomposition. The higher order silanes similarly decompose to form elemental silicon, i.e.

$Si^0$, silicon in its elemental state. Thus, with silane as a precursor, a secondary reactant source may not be used, and a separate infrared absorber is not needed. Corresponding germanes ($GeH_4$ and $Ge_2H_6$) can be used as precursors. An inert gas can be used to moderate the reaction. Suitable inert gases include for example, Ar, $HeN_2$ or mixtures thereof.

Suitable precursors for aerosol delivery of gallium include, for example, gallium nitrate ($Ga(NO_3)_3$). Arsenic precursors include, for example, $AsCl_3$, which is suitable for vapor delivery, and $As_2O_5$, which is suitable for aerosol precursor delivery in aqueous or alcohol solutions. Suitable boron precursors comprise, for example, diborane ($B_2H_6$), $BH_3$, and the like, and suitable combinations of any two or more thereof. Suitable aluminum precursors include, for example, aluminum hydride ($AlH_3$), aluminum s-butoxide ($Al(OC_4H_9)_3$), trimethyl aluminum ($Al(CH_3)_3$, trimethyl ammonia aluminum $Al(CH_3)_3NH_3$, and the like, and suitable combinations of any two or more thereof. Suitable phosphorous precursor compositions for vapor delivery comprise, for example, phosphine ($PH_3$), phosphorus trichloride ($PCl_3$), phosphorous pentachloride ($PCl_5$), phosphorus oxychloride ($POCl_3$), $P(OCH_3)_3$, and the like, and suitable combinations of any two or more thereof. Suitable antimony precursors include, for example, stibine ($SbH_3$) and antimony trichloride ($SbCl_3$), which is soluble in alcohol.

Particle Properties

The desirable silicon nanoparticle dispersions described herein are based in part on the ability to form highly uniform silicon nanoparticles with or without dopants. As described above, laser pyrolysis is a particularly suitable approach for the synthesis of highly uniform silicon submicron particles or nanoparticles. Also, laser pyrolysis is a versatile approach for the introduction of desired dopants at a selected concentration, such as high dopant concentrations. Also, the surface properties of the silicon particles can be influenced by the laser pyrolysis process, although the surface properties can be further manipulated after synthesis to form desired dispersions. Small and uniform silicon particles can provide processing advantages with respect to forming dispersions/inks.

In some embodiments, the particles have an average diameter of no more than about one micron, and in further embodiments it is desirable to have particles with smaller particle sizes to introduce desired properties. For example, nanoparticles with a small enough average particle size are observed to melt at lower temperatures than bulk material, which can be advantageous in some contexts. Also, the small particle sizes provide for the formation of inks with desirable properties, which can be particularly advantageous for inkjet printing since larger particles may clog some inkjet heads. Generally, the dopants and the dopant concentration are selected based on the desired electrical properties of the subsequently fused material or to provide a desired degree of dopant migration to an adjacent substrate.

In particular, laser pyrolysis is useful in the formation of particles that are highly uniform in composition, crystallinity, when appropriate, and size. A collection of submicron/nanoscale particles may have an average diameter for the primary particles of no more than about 500 nm, in some embodiments from about 2 nm to about 100 nm, alternatively from about 2 nm to about 75 nm, in further embodiments from about 2 nm to about 50 nm, in additional embodiments from about 2 nm to about 25 nm, and in other embodiments from about 2 nm to about 15 nm. A person of ordinary skill in the art will recognize that other ranges within these specific ranges are covered by the disclosure herein. In particular, for some applications, smaller average particle diameters can be particularly desirable. Particle diameters and primary particle diameters are evaluated by transmission electron microscopy. Primary particles are the small visible particulate units visible in the micrograph without reference to the separability of the primary particles. If the particles are not spherical, the diameter can be evaluated as averages of length measurements along the principle axes of the particle.

As used herein, the term "particles" refer to physical particles, which are unfused, so that any fused primary particles are considered as an aggregate, i.e. a physical particle. For particles formed by laser pyrolysis, if quenching is applied, the particles can be effectively the same as the primary particles, i.e., the primary structural element within the material. Thus, the ranges of average primary particle sizes above can also be used with respect to the particle sizes. If there is hard fusing of some primary particles, these hard fused primary particles form correspondingly larger physical particles. The primary particles can have a roughly spherical gross appearance, or they can have rod shapes, plate shapes or other non-spherical shapes. Upon closer examination, crystalline particles may have facets corresponding to the underlying crystal lattice. Amorphous particles generally have a spherical aspect.

Because of their small size, the particles tend to form loose agglomerates due to van der Waals and other electromagnetic forces between nearby particles. Even though the particles may form loose agglomerates, the nanometer scale of the particles is clearly observable in transmission electron micrographs of the particles. The particles generally have a surface area corresponding to particles on a nanometer scale as observed in the micrographs. Furthermore, the particles can manifest unique properties due to their small size and large surface area per weight of material. These loose agglomerates can be dispersed in a liquid to a significant degree and in some embodiments approximately completely to form dispersed primary particles.

The particles can have a high degree of uniformity in size. Laser pyrolysis generally results in particles having a very narrow range of particle diameters. As determined from examination of transmission electron micrographs, the primary particles generally have a distribution in sizes such that at least about 95 percent, and in some embodiments 99 percent, of the particles have a diameter greater than about 35 percent of the average diameter and less than about 280 percent of the average diameter. In additional embodiments, the particles generally have a distribution in sizes such that at least about 95 percent, and in some embodiments 99 percent, of the primary particles have a diameter greater than about 40 percent of the average diameter and less than about 250 percent of the average diameter. In further embodiments, the primary particles have a distribution of diameters such that at least about 95 percent, and in some embodiments 99 percent, of the primary particles have a diameter greater than about 60 percent of the average diameter and less than about 200 percent of the average diameter. A person of ordinary skill in the art will recognize that other ranges of uniformity within these specific ranges are contemplated and are within the present disclosure.

Furthermore, in some embodiments essentially no primary particles have an average diameter greater than about 5 times the average diameter, in other embodiments about 4 times the average diameter, in further embodiments 3 times the average diameter, and in additional embodiments 2 times the average diameter. In other words, the primary particle size distribution effectively does not have a tail indicative of a small number of particles with significantly larger sizes. This is a result of the small reaction region to form the inorganic particles and corresponding rapid quench of the inorganic particles. An effective cut off in the tail of the size distribution indicates that there are less than about 1 particle in $10^6$ has a diameter greater than a specified cut off value above the average diameter. High primary particle uniformity can be exploited in a variety of applications.

High quality particles can be produced that are substantially unfused. However, for the production of very small primary particle sizes, e.g., less than 10 nm average diameter, at higher production rates, the primary particles can involve substantial fusing into a nanostructured material. These particles can still be dispersed into a liquid to produce desired ranges of secondary particle size. Even though the particles with very small primary particle diameters may have significant fusing, these particles may still be desirable for applications in which the small primary particle size and corresponding high surface areas can facilitate dopant drive-in and/or fusing of the deposited inks into corresponding structures.

The silicon particles can further be characterized by BET surface areas. The surface area measurements are based on gas adsorption onto the particle surfaces. The theory of BET surface area was developed by Brunauer et al., J. Am. Chem. Soc. Vol. 60, 309 (1938). The BET surface area evaluation cannot directly distinguish small particle sizes from highly porous particles, but the surface area measurements nevertheless provide useful characterization of the particles. BET surface area measurements are an established approach in the field, and for silicon particles the BET surface area can be determined with an $N_2$ gas absorbate. The BET surface area can be measured with commercial instruments, such as a Micromeritics Tristar 3000™ instrument. The silicon particles described herein can have BET surface areas ranging from about 100 $m^2/g$ to about 1500 $m^2/g$ and in further embodiments, from about 200 $m^2/g$ to about 1250 $m^2/g$. A person of ordinary skill in the art will recognize that additional ranges within the explicit ranges above are contemplated and are within the present disclosure. The particle diameters can be estimated from the BET surface areas based on the assumption that the particles are non-porous, non-agglomerated spheres.

X-ray diffraction can be use to evaluate the crystallinity of the particles. Furthermore, crystalline nanoparticles produced by laser pyrolysis can have a high degree of crystallinity. However, x-ray diffraction can also be used to evaluate the crystallite size. In particular, for submicron particles, the diffraction peaks are broadened due to truncation of the crystal lattice at the particle surface. The degree of broadening of the x-ray diffraction peaks can be used to evaluate an estimate of the average crystallite size. While strain in the particles and instrument effects can also contribute to broadening of the diffraction peaks, if the particles are assumed to be essentially spherical, the Scherrer equation can be used to provide a lower limit on the average particle size. Meaningful broadening is only observed for crystallite sizes less than about 100 nm.

If the particle sizes from TEM evaluation of primary particle diameters, particle size estimates from the BET surface areas and the particle sizes from the Scherrer equation are roughly equal, this determination provides significant evidence that the fusing of the particles is not excessive, that the primary particles are effectively single crystals and that the particles have a high degree of uniformity. It is generally observed that silicon particle collections in which the three measurements of particle sizes are in rough agreement exhibit good dispersion in appropriate solvents. Thus, the various particle size measurements can be used as an indirect measure of particle quality.

In addition, the submicron particles may have a very high purity level. It has been found that the silicon particles can be produced with very low levels of metal impurities using laser pyrolysis with appropriate particle handling procedures. Low metal impurity levels are very desirable from the perspective of semiconductor processing. As described further below, the particles can be placed into dispersions. In the dispersions, processing such as centrifugation can be performed to reduce impurities. In the resulting dispersions, the contamination by metal elements can be very low based on desired handling of the particles. The contaminant levels can be evaluated by ICP-MS analysis (inductively coupled plasma-mass spectrometry).

In particular, the submicron silicon particles can be found to have no more than about 1 parts per million by weight (ppm) of metal contaminants, in further embodiments no more than about 900 parts per billion by weight (ppb) and in additional embodiments no more than about 700 ppb of total metal contaminants. For semiconductor applications, iron can be a contaminant of particular concern. With improved particle synthesis, handling and contaminant removal procedures, particles can be dispersed with no more than about 200 ppb of iron, in further embodiments, no more than about 100 ppb and in additional embodiments from about 15 ppb to about 75 ppb of iron contaminants with respect to the particle weight. A person of ordinary skill in the art will recognize that additional ranges of contaminant levels within the explicit ranges above are contemplated and are within the present disclosure. The low contaminant levels allows for the production of particles with low dopant levels of dopants, such as boron or phosphorous, in which the low dopant levels can be effective of tuning the electronic properties of particles in a meaningful way that cannot be achieved at higher contaminant levels.

To achieve the very low contaminant levels, the particles are synthesized in a laser pyrolysis apparatus sealed from the ambient atmosphere and appropriate cleaned and purged prior to the synthesis. Highly pure gaseous reactants are used for the silicon precursors as well as for the dopant precursors. The particles are collected and handled in a glove box to keep the particles free from contaminants from the ambient atmosphere. Very clean polymer containers, such as polyfluoroethylene containers, can be used for placement of the particles. The particles are dispersed in very pure solvents within clean vessels within a glove box or clean room. With meticulous attention to all aspects of the process, the high purity levels described herein have been and generally can be achieved.

The size of the dispersed particles in a liquid can be referred to as the secondary particle size. The primary particle size is roughly the lower limit of the secondary particle size for a particular collection of particles, so that the average secondary particle size can be approximately the average primary particle size if the primary particles are substantially unfused and if the particles are effectively completely dispersed in the liquid, which involves solvation forces that successfully overcome the inter-particle forces.

The secondary particle size may depend on the subsequent processing of the particles following their initial formation and the composition and structure of the particles. In particular, the particle surface chemistry, properties of the dispersant, the application of disruptive forces, such as shear or sonic forces, and the like can influence the efficiency of fully dispersing the particles. Ranges of values of average secondary particle sizes are presented below with respect to the description of dispersions. Secondary particles sizes within a liquid dispersion can be measured by established approaches, such as dynamic light scattering. Suitable particle size analyzers include, for example, a Microtrac UPA instrument from Honeywell based on dynamic light scattering, a Horiba Particle Size Analyzer from Horiba, Japan and ZetaSizer Series of instruments from Malvern based on Photon Correlation Spectroscopy. The principles of dynamic light scattering for particle size measurements in liquids are well established.

Dopants can be introduced to vary properties of the resulting particles. In general, any reasonable element can be introduced as a dopant to achieve desired properties. For example, dopants can be introduced to change the electrical properties of the particles. In particular, As, Sb and/or P dopants can be introduced into the elemental silicon particles to form n-type semiconducting materials in which the dopant provide excess electrons to populate the conduction bands, and B, Al, Ga and/or In can be introduced to form p-type semiconducting materials in which the dopants supply holes. P and B are used as dopants in the Examples below.

In some embodiments, one or more dopants can be introduced into the elemental silicon particles in concentrations from about $1.0 \times 10^{-7}$ to about 15 atomic percent relative to the silicon atoms, in further embodiments from about $1.0 \times 10^{-5}$ to about 5.0 atomic percent and in further embodiments from about $1 \times 10^{-4}$ to about 1.0 atomic percent relative to the silicon atoms. Both the low dopant levels and the high dopant levels are of interest in appropriate contexts. For the low dopant levels to be of particular usefulness, the particle should be pure. For small particles, the low dopant levels essentially can correspond with less than one dopant atom per particle on average. In combination with the high purity that has been achieved for the particles, low dopant levels from about $1.0 \times 10^{-7}$ to about $5.0 \times 10^{-3}$ correspond with difficult to achieve yet potentially useful materials. In some embodiments, high dopant levels are of particular interest, and the highly doped particles can have a dopant concentration from about 0.25 atomic percent to about 15 atomic percent, in other embodiments from about 0.5 atomic percent to about 12 atomic percent, and in further embodiments from about 1 atomic percent to about 10 atomic percent. A person of ordinary skill in the art will recognize that additional ranges within the explicit dopant level ranges are contemplated and are within the present disclosure.

Dispersions and Properties of the Dispersions

Dispersions of particular interest comprise a dispersing liquid or solvent and silicon nanoparticles dispersed within the liquid along with optional additives. Generally, the product silicon particles from laser pyrolysis are collected as a powder, which need to be dispersed as a step in forming the ink. The dispersion can be stable with respect to avoidance of settling over a reasonable period of time, generally at least an hour, without further mixing. A dispersion can be used as a coating material or as an ink, i.e., the dispersion can be printed. The properties of the ink can be adjusted based on the particular printing method. For example, in some embodiments, the viscosity of the ink is adjusted for the particular use, such as inkjet printing, gravure printing or screen printing, and particle concentrations and additives provide some additional parameters to adjust the viscosity and other properties. In some embodiments, the particles can be formed with concentrated dispersions with desirable fluid properties without surface modifying the particles with organic compounds. As noted above, the lack of surface modification with organic compounds excludes references to solvent-based interactions. In general, the solvents may interact with the particle surfaces with varying degrees of interactions that are distinct from the inclusion of distinct surface modifying agents that form strong and effectively durable chemical modification of the particle surfaces. The availability to form stable dispersions with small secondary particle sizes provides the ability to form certain inks that are not otherwise possible.

Furthermore, it is desirable for the silicon particles to be uniform with respect to particle size and other properties. Specifically, it is desirable for the particles to have a uniform primary particle size and for the primary particles to be sufficiently unfused based on the primary particle size. Then, the particles generally can be dispersed to yield a smaller more uniform secondary particle size in the dispersion. Secondary particle size refers to measurements of particle size within a dispersion. The formation of a good dispersion with a small secondary particle size can be facilitated through the matching of the surface chemistry of the particles with the properties of the dispersing liquid. The surface chemistry of particles can be influenced during synthesis of the particles as well as following collection of the particles. For example, the formation of dispersions with polar solvents is facilitated if the particles have polar groups on the particle surface.

As described herein, suitable approaches have been found to disperse dry silicon nanoparticle powders produced by laser pyrolysis and to form inks and the like for deposition. In some embodiments, the particle can be surface modified with an organic compound to change the surface properties of the particles in a dispersion, but in some embodiments of particular interest, the particles are not surface modified with an organic compound to provide advantages with respect to properties for certain applications and to simply processing. Thus, for some embodiments, significant advantages are obtained by forming dispersions of particles without surface modification. Using one or more of the processing approaches described herein, inks can be formed that can be deposited using convenient coating and printing approaches based on established commercial parameters. Thus, the advantages of vapor-based particle synthesis can be combined with desirable solution based processing approaches with highly dispersed particles to obtain desirable dispersions and inks, which can be formed with doped particles.

With respect to silicon dispersions, the dispersions can have concentrations from low concentrations to about 30 weight percent. In general, the secondary particles size can be expressed as a cumulant mean, or Z-average particle size as measured with dynamic light scattering (DLS). The Z-average particle size is an intensity average based on the scattered light measurements, and the scattering intensity based particle size distribution can be converted to volume distributions that can be used to evaluate a volume-average size. Generally, the Z-average particle size is no more than about 2 microns and in some embodiments, no more than about 250 nm. Additionally, in some embodiments it is desirable for the secondary particle size distribution to be narrow.

In general, the surface chemistry of the particles influences the process of forming the dispersion. In particular, it is easier to disperse the particles to form smaller secondary particle sizes if the dispersing liquid and the particle surfaces are compatible chemically, although other parameters such as density, particle surface charge, solvent molecular structure and the like also directly influence dispersability. In some embodiments, the liquid may be selected to be appropriate for the particular use of the dispersion, such as for a printing process. For silicon synthesized using silanes, the resulting silicon generally is partially hydrogenated, i.e., the silicon includes some small amount of hydrogen in the material. It is generally unclear if this hydrogen or a portion of the hydrogen is at the surface as Si—H bonds. However, the presence of a small amount of hydrogen does not presently seem particularly significant. However, it is found that silicon particles formed by laser pyrolysis are suitable for forming good dispersions in appropriately selected solvents without modifying the particles with chemically bonded organic compounds.

In general, the surface chemistry of the particles can be influenced by the synthesis approach, as well as subsequent handling of the particles. The surface by its nature represents a termination of the underlying solid state structure of the particle. This termination of the surface of the silicon particles can involve truncation of the silicon lattice. The termination of particular particles influences the surface chemistry of the particles. The nature of the reactants, reaction conditions, and by-products during particle synthesis influences the surface chemistry of the particles collected as a powder during flow reactions. The silicon can be terminated, for example, with bonds to hydrogen, as noted above. In some embodiments, the silicon particles can become surface oxidized, for example through exposure to air. For these embodiments, the surface can have bridging oxygen atoms in Si—O—Si structures or Si—O—H groups if hydrogen is available during the oxidation process.

In some embodiments, the surface properties of the particles can be modified through surface modification of the particles with a surface modifying composition chemically bonded to the particle surfaces. However, in some embodiments of particular interest, the particles are not surface modified so that unmodified particles are deposited for further processing. In appropriate embodiments, surface modification of the particles can influence the dispersion properties of the particles as well as the solvents that are suitable for dispersing the particles. Some surface active agents, such as many surfactants, act through non-bonding interactions with the particle surfaces, and these processing agents are described further below. In some embodiments, desirable properties, especially dispersability in otherwise unavailable solvents, can be obtained through the use of surface modification agents that chemically bond to the particle surface. The surface chemistry of the particles influences the selection of surface modification agents. The use of surface modifying agents to alter the silicon particle surface properties is described further in published U.S. patent application 2008/0160265 to Hieslmair et al., entitled "Silicon/Germanium Particle Inks, Doped Particles, Printing, and Processes for Semiconductor Applications," incorporated herein by reference. While surface modified particles can be designed for use with particular solvents, it has been found that desirable inks can be formed without surface modification at high particle concentrations and with good deliverability. The ability to form desired inks without surface modification can be useful for the formation of desired devices, especially semiconductor based devices, with a lower level of contamination.

When processing a dry, as-synthesized powder, it has been found that forming a good dispersion of the particles prior to further processing facilitates the subsequent processing steps. The dispersion of the as-synthesized particles generally comprises the selection of a solvent that is relatively compatible with the particles based on the surface chemistry of the particles. Shear, stirring, sonication or other appropriate mixing conditions can be applied to facilitate the formation of the dispersion. In general, it is desirable for the particles to be well dispersed, although the particles do not need to be stably dispersed initially if the particles are subsequently transferred to another liquid.

For particular applications, there may be fairly specific target properties of the inks as well as the corresponding liquids used in formulating the inks. Furthermore, it can be desirable to increase the particle concentration of a dispersion/ink relative to an initial concentration used to form a good dispersion. Specific formulations for inkjet printing, gravure printing and for screen printing are discussed in detail below.

One approach for changing solvents involves the addition of a liquid that destabilizes the dispersion. The liquid blend then can be substantially separated from the particles through decanting or the like. The particles are then re-dispersed in the newly selected liquid. This approach for changing solvents is discussed in published U.S. patent application 2008/0160265 to Hieslmair et al., entitled "Silicon/Germanium Particle Inks, Doped Particles, Printing and Processes for Semiconductor Applications," incorporated herein by reference.

However, for most inks, it is desirable to use solvent blends, and the design of the blends can be based on the ability to maintain a good dispersion after the initial formation of the dispersion. Thus, a desirable approach for the formation of inks with desired properties is to form a good dispersion of the particles and to maintain the good dispersion of the particles through the blending of solvents. The blend of solvents is selected such that the different liquids combine to form a single phase through the miscibility or solubility of the liquids with respect to each other.

With respect to the increase of particle concentration, solvent can be removed through evaporation to increase the concentration. This solvent removal generally can be done appropriately without destabilizing the dispersion. A lower boiling solvent component can be removed preferentially through evaporation. If the solvent blend forms an azeotrope, a combination of evaporation and further solvent addition can be used to obtain a target solvent blend. Solvent blends can be particularly useful for the formation of ink compositions since the blends can have liquid that contribute desirable properties to the ink. A low boiling temperature solvent component can evaporate relatively quickly after printing to stabilize the printed ink prior to further processing and curing. A higher temperature solvent component can be used to adjust the viscosity to limit spreading after printing. Thus, for many printing applications, solvent blends are desirable. The overall solvent composition can be adjusted to yield desired ink properties and particle concentrations.

At appropriate stages of the dispersion process, the dispersion can be processed to remove contaminants and/or any stray unusually large particles. Generally, a filter can be selected to exclude particulates that are much larger than the average secondary particle size so that the filtration process can be performed in a reasonable way. In general, the filtration processes have not been suitable for overall improvement of the dispersion quality. Suitable commercial filters are available, and can be selected based on the dispersion qualities and volumes.

Alternatively or additionally, the dispersion can be centrifuged. The centrifugation parameters can be selected such that at least a reasonable fraction of the silicon nanoparticles remain dispersed, but contaminants settle to the bottom of the centrifuge container. The dispersion can be decanted or similarly separated from the settled contaminants. The use of centrifugation can avoid the introduction of contaminants from a filtration material. It has been found that centrifugation of silicon particle dispersions can be useful for the formation of the highly pure dispersions with very low metal contamination described herein.

The dispersions can be formulated for a selected application. The dispersions can be characterized with respect to composition as well as the characterization of the particles within the dispersions. In general, the term ink is used to describe a dispersion that is subsequently deposited using a printing technique, and an ink may or may not include additional additives to modify the ink properties.

Better dispersions generally are more stable and/or have a smaller secondary particle size indicating less agglomeration. As used herein, stable dispersions have no settling without continuing mixing after one hour. In some embodiments, the dispersions exhibit no settling of particles without additional mixing after one day and in further embodiments after one week, and in additional embodiments after one month. In general, dispersions with well dispersed particles can be formed at concentrations of at least up to 30 weight percent inorganic particles. Generally, for some embodiments it is desirable to have dispersions with a particle concentration of at least about 0.05 weight percent, in other embodiments at least about 0.25 weight percent, in additional embodiments from about 0.5 weight percent to about 25 weight percent and in further embodiments from about 1 weight percent to about 20 weight percent. A person of ordinary skill in the art will recognize that additional ranges of stability times and concentrations within the explicit ranges above are contemplated and are within the present disclosure.

The dispersions can include additional compositions besides the silicon particles and the dispersing liquid or liquid blend to modify the properties of the dispersion to facilitate the particular application. For example, property modifiers can be added to the dispersion to facilitate the deposition process. Surfactants can be effectively added to the dispersion to influence the properties of the dispersion.

In general, cationic, anionic, zwitter-ionic and nonionic surfactants can be helpful in particular applications. In some applications, the surfactant further stabilizes the particle dispersions. For these applications, the selection of the surfactant can be influenced by the particular dispersing liquid as well as the properties of the particle surfaces. In general, surfactants are known in the art. Furthermore, the surfactants can be selected to influence the wetting or beading of the dispersion/ink onto the substrate surface following deposition of the dispersion. In some applications, it may be desirable for the dispersion to wet the surface, while in other applications it may be desirable for the dispersion to bead on the surface. The surface tension on the particular surface is influenced by the surfactant. Also, blends of surfactants can be helpful to combine the desired features of different surfactants, such as improve the dispersion stability and obtaining desired wetting properties following deposition. In some embodiments, the dispersions can have surfactant concentrations from about 0.01 to about 5 weight percent, and in further embodiments from about 0.02 to about 3 weight percent.

The use of non-ionic surfactants in printer inks is described further in U.S. Pat. No. 6,821,329 to Choy, entitled "Ink Compositions and Methods of Ink-Jet Printing on Hydrophobic Media," incorporated herein by reference. Suitable non-ionic surfactants described in this reference include, for example, organo-silicone surfactants, such as SILWET™ surfactants from Crompton Corp., polyethylene oxides, alkyl polyethylene oxides, other polyethylene oxide derivatives, some of which are sold under the trade names, TERGITOL™, BRIJ™, TRITON™, PLURONIC™, PLURAFAC™, IGEPALE™, and SULFYNOL™ from commercial manufacturers Union Carbide Corp., ICI Group, Rhone-Poulenc Co., Rhom & Haas Co., BASF Group and Air Products Inc. Other nonionic surfactants include MACKAM™ octylamine chloroacetic adducts from McIntyre Group and FLUORAD™ fluorosurfactants from 3M. The use of cationic surfactants and anionic surfactants for printing inks is described in U.S. Pat. No. 6,793,724 to Satoh et al., entitled "Ink for Ink-Jet Recording and Color Ink Set," incorporated herein by reference. This patent describes examples of anionic surfactants such as polyoxyethylene alkyl ether sulfate salt and polyoxyalkyl ether phosphate salt, and examples of cationic surfactants, such as quaternary ammonium salts.

Viscosity modifiers can be added to alter the viscosity of the dispersions. Suitable viscosity modifiers include, for example soluble polymers, such as polyacrylic acid, polyvinyl pyrrolidone and polyvinyl alcohol. Other potential additives include, for example, pH adjusting agents, antioxidants, UV absorbers, antiseptic agents and the like. These additional additives are generally present in amounts of no more than about 5 weight percent. A person of ordinary skill in the art will recognize that additional ranges of surfactant and additive concentrations within the explicit ranges herein are contemplated and are within the present disclosure.

For electronic applications, it can be desirable to remove organic components to the ink prior to or during certain processing steps such that the product materials are effectively free from carbon. In general, organic liquids can be evaporated to remove them from the deposited material. However, surfactants, surface modifying agents and other property modifiers may not be removable through evaporation, although they can be removed through heating at moderate temperature in an oxygen atmosphere to combust the organic materials.

The use and removal of surfactants for forming metal oxide powders is described in U.S. Pat. No. 6,752,979 to Talbot et al., entitled "Production of Metal Oxide Particles with Nano-Sized Grains," incorporated herein by reference. The '979 patent teaches suitable non-ionic surfactants, cationic surfactants, anionic surfactants and zwitter-ionic surfactants. The removal of the surfactants involves heating of the surfactants to moderate temperatures, such as to 200° C. in an oxygen atmosphere to combust the surfactant. Other organic additives generally can be combusted for removal analogously with the surfactants. If the substrate surface is sensitive to oxidation during the combustion process, a reducing step can be used following the combustion to return the surface to its original state.

The Z-average particle sizes can be measured using dynamic light scattering. The Z-average particle size is based on a scattering intensity weighted distribution as a function of particle size. The scattering intensity is a function of the particle size to the 6th power so that larger particle scatter much more intensely and are correspondingly weighted much more in the measurements. Evaluation of this distribution is prescribed in ISO International Standard 13321, Methods for Determination of Particle Size Distribution Part 8: Photon Correlation Spectroscopy, 1996. The Z-average distributions are based on a single exponential fit to time correlation functions. However, small particles scatter light with less intensity relative to their volume contribution to the dispersion. The intensity weighted distribution can be converted to a volume-weighted distribution that is perhaps more conceptually relevant for evaluating the properties of a dispersion. For nanoscale particles, the volume-based distribution can be evaluated from the intensity distribution using Mie Theory. The volume-average particle size can be evaluated from the volume-based particle size distribution. Further description of the manipulation of the secondary particle size distributions can be found in Malvern Instruments—DLS Technical Note MRK656-01, incorporated herein by reference. As a general matter, due to the scaling of volume average particle sizes by the cube of the particle diameter and the scattering intensity average (Z-average) by the sixth power of the average particle size, these measurements significantly weight larger particles over smaller particles.

In general, if processed appropriately, for dispersions with well dispersed particles and little fusing of the primary particles, the Z-average secondary particle size can be no more than a factor of four times the average primary particle size, in further embodiments no more than about 3 times the average primary particle size and in additional embodiments no more than about 2 times the average primary particle size. For primary particles that exhibit some fusing, the absolute value of the Z-average dispersed particle size is still very significant for the processing properties of the silicon particle distributions. In some embodiments, the Z-average particle size is no more than about 1 micron, in further embodiments no more than about 250 nm, in additional embodiments no more than about 200 nm, in some embodiments from about 5 nm to about 150 nm, in other embodiments from about 5 nm to about 100 nm, in further embodiments from about nm to about 75 nm and in some embodiments from about 5 nm to about 50 nm. In particular, for some printing applications, it is observed that good printing properties are generally correlated with Z-average particle sizes of no more than about 200 nm. With respect to the particle size distribution, in some embodiment, essentially all of the secondary particles can have a size distribution from scattering results with effectively no intensity corresponding to more than 5 times the Z-average secondary particle size, in further embodiments no more than about 4 times the Z-average particle size and in other embodiments no more than about 3 times the Z-average particle size. Furthermore, the DLS particle size distribution can have in some embodiments a full width at half-height of no more than about 50 percent of the Z-average particle size. Also, the secondary particles can have a distribution in sizes such that at least about 95 percent of the particles have a diameter greater than about 40 percent of the Z-average particle size and less than about 250 percent of the Z-average particle size. In further embodiments, the secondary particles can have a distribution of particle sizes such that at least about 95 percent of the particles have a particle size greater than about 60 percent of the Z-average particle size and less than about 200 percent of the Z-average particle size. A person of ordinary skill in the art will recognize that additional ranges of particle sizes and distributions within the explicit ranges above are contemplated and are within the present disclosure.

The viscosity of the dispersion/ink is dependent on the silicon particle concentration, the nature of the liquids as well as the presence of any other additives. Thus, there are several parameters that provide for adjustment of the viscosity. In general, a selected coating or printing approach has an appropriate range of viscosity. Surface tension may also be a significant parameter for certain printing applications. In general, for most ink formulations, the use of a solvent blend can provide for the rapid evaporation of a low boiling temperature solvent (boiling point approximately no more than about 160° C.) while using a higher boiling solvent (boiling point at least about 175° C.) to control the viscosity. The high boiling solvent generally can be removed more slowly without excessive blurring of the printed image. After removal of the higher boiling temperature solvent, the printed silicon particles can be cured, or further processed into the desired device. The properties for inkjet printing, gravure printing and screen printing for silicon nanoparticle inks are described in more detail in the following. These printing techniques represent a significant range of desired viscosities from relatively low viscosity for inkjet inks, to moderate viscosities for gravure printing inks and high viscosities for screen print pastes.

For some inkjet embodiments, the viscosity can be from 0.1 cP (mPa·s) to about 100 cP, in other embodiments from about 0.5 cP to about 50 cP and in further embodiments from about 1 cP to about 30 cP. Surface tension can be a significant parameter for inkjet inks. For some inkjet embodiments, the dispersions/inks can have a surface tension from about 20 to about 100 dynes/cm and in further embodiments from about 25 to about 80 dynes/cm and in additional embodiments form about 30 to about 55 dynes/cm. A person of ordinary skill in the art will recognize that additional ranges of viscosity and surface tension within the explicit ranges above are contemplated and are within the present disclosure.

To achieve the target fluid properties, the compositions of the fluids can be correspondingly adjusted. For inkjet inks, the silicon particle concentrations are generally at least about 1 weight percent, in further embodiments at least about 2.5 weight percent and in additional embodiments from about 5 weight percent to about 15 weight percent. In some embodiments, the inkjet inks can comprise an alcohol and a polar aprotic solvent. The alcohol can be a relatively low boiling point solvent, such as isopropanol, ethylene glycol, propylene glycol, ethanol, methanol or combinations thereof. In some embodiments, suitable aprotic solvents include, for example, N-methyl pyrolidone, dimethylformamide, dimethylsulfoxide, methylethylketone, acetonitrile, ethylacetate and combinations thereof. In general, the ink can comprise from about 10 weight percent to about 70 weight percent alcohol and in further embodiments from about 20 weight percent to about 50 weight percent alcohol. Similarly, the ink can comprise from about 30 weight percent to about 80 weight percent polar aprotic solvent and in additional embodiments form about 40 weight percent to about 70 weight percent polar aprotic solvent. A person of ordinary skill in the art will recognize that additional concentration and property ranges within the explicit ranges above are contemplated and are within the present disclosure.

For screen printing, the formulations are prepared as a paste that can be delivered through the screen. The screens generally are reused repeatedly. The solvent systems for the paste should be selected to both provide desired printing properties and to be compatible with the screens so that the screens are not damaged by the paste. Suitable lower boiling point solvents include, for example, isopropyl alcohol, cyclohexanone, dimethylformamide, acetone or combinations thereof. Suitable higher boiling point solvents include, for examples, ethylene glycol, propylene glycol, N-methylpyrrolidone, terpineols, such as α-terpineol, Carbitol, butyl Cellosolve, or combinations thereof. The screen printing paste can further include a surfactant and/or a viscosity modifier. In general, the screen printable ink or paste are very viscous and can be desired to have a viscosity from about 10 Pa·s (Poise) to about 300 Pa·s, and in further embodiments from about 50 Pa·s to about 250 Pa·s. The screen printable inks can have a silicon particle concentration from about 5 weight percent to about 25 weight percent silicon particles. Also, the screen printable inks can have from 0.25 to about 10 weight percent lower boiling solvent, in further embodiments from about 0.5 to about 8 and in other embodiments from about 1 to about 7 weight percent lower boiling solvent. The description of screen printable pastes for the formation of electrical components is described further in U.S. Pat. No. 5,801,108 to Huang et al., entitled "Low Temperature Curable Dielectric Paste," incorporated herein by reference, although the dielectric paste comprises additives that are not suitable for the semiconductor pastes/inks described herein. A person of ordinary skill in the art will recognize that additional ranges of composition and properties for silicon pastes within the explicit ranges above are contemplated and are within the present disclosure.

The property ranges of inks suitable for gravure printing are intermediate between the properties of inkjet inks can screen printing pastes. For gravure printing, the viscosity of the ink can be from about 10 cP to about 800 cP, in further embodiments from about 20 cP to about 750 cP and in additional embodiments from about 30 cP to about 600 cP. To achieve the desired ink properties, the ink can comprise silicon particle concentrations from about 1 weight percent to about 20 weight percent, in further embodiments from about 2 weight percent to about 17 weight percent and in other embodiments from about 5 weight percent to about 14 weight percent silicon particles. In general, there are a range of suitable low boiling and high boiling solvents that can be blended for gravure printing. For example, isopropyl alcohol is suitable for use as the lower boiling solvent, and propylene glycol, ethylene glycol, terpineol and combinations thereof are suitable higher boiling solvents. For these applications, the ink can comprise from about 0.5 weight percent to about 30 weight percent low boiling alcohol and in further embodiments from about 1 to about 25 weight percent low boiling alcohol. The ratio of solvents can be used to adjust the viscosity to a desired value. A person of ordinary skill in the art will recognize that additional ranges of composition and properties for gravure printing inks within the explicit ranges above are contemplated and are within the present disclosure.

While the inks can comprise heavily doped silicon particles, it can be desirable to further include a liquid dopant source in the ink. Suitable liquid dopant sources include, for example, organophosphorus compounds (for example, phosphonates, such as etidronic acid and dimethyl methyl phosphonate, organophosphine oxide, organophosphanes, such as diphenylphosphine, or organophosphates, such as trioctyl phosphate), organoboron compounds (tetraphenylborate or triphenylboron), phosphoric acid, boric acid, combinations thereof or the like. In general, an ink can comprise no more than about 10 weight percent dopant composition as well as any and all subranges within this explicit range.

For dopant drive in applications, it can be desirable to include further components to the ink to facilitate the dopant drive in process. In particular, the ink can comprise a silicon oxide precursor, such as tetraethyl orthosilicate (TEOS). TEOS can be converted to silica in a hydrolysis reaction with water at an appropriate pH. A silica glass can facilitate dopant drive in from highly doped silicon particles into a silicon substrate through the at least partial isolation of the dopants from the vapor phase above the deposited particles. The alternative or additional use of spin on glasses and silica sol-gels in silicon inks is described in copending U.S. provisional patent application 61/438,064 to Liu et al, entitled "Silicon Substrates With Doped Surface Contacts Formed From Doped Silicon Inks and Corresponding Processes," incorporated herein by reference.

The dispersions/inks can be formed using the application of appropriate mixing conditions. For example, mixers/blenders that apply shear can be used and/or sonication can be used to mix the dispersions. The particular additives can be added in an appropriate order to maintain the stability of the particle dispersion. A person of ordinary skill in the art can select the additives and mixing conditions empirically based on the teachings herein.

Coating and Printing Processes

The dispersions/inks can be deposited for using a selected approach that achieves a desired distribution of the dispersion on a substrate. For example, coating and printing techniques can be used to apply the ink to a surface. Using selected printing approaches, patterns can be formed with high resolution. Coating and/or printing processes can be repeated to obtain a thicker deposit of ink and/or to form overlapping patterns. For example, the printing/coating can be repeated for a total of two printing/coating steps, three printing/coating steps, four printing/coating steps or more than four printing/coating steps. Each printing/coating step may or may not involve a patterning. The ink may or may not be dried or partially dried between the respective coating and/or printing steps. Sequential patterned printing steps generally involve the deposition onto an initially deposited ink material. The subsequent deposits may or may not approximately align with the initially deposited material, and further subsequently deposited patterns of material may or may not approximately align with the previously deposited layers. Thus, multiple layers can be present only at a subset of the ink deposit. Following deposition, the deposited material can be further processed into a desired device or state.

Suitable coating approaches for the application of the dispersions include, for example, spin coatings, dip coating, spray coating, knife-edge coating, extrusion or the like. In general, any suitable coating thickness can be applied, although in embodiments of particular interest, coating thickness can range from about 50 nm to about 500 microns and in further embodiments from about 100 nm to about 250 microns. A person of ordinary skill in the art will recognize that additional ranges of thicknesses within the particular ranges above are contemplated and are within the present disclosure.

Similarly, a range of printing techniques can be used to print the dispersion/ink into a pattern on a substrate. Suitable printing techniques include, for example, screen printing, inkjet printing, lithographic printing, gravure printing and the like. Suitable substrates include, for example, polymers, such as polysiloxanes, polyamides, polyimides, polyethylenes, polycarbonates, polyesters, combinations thereof, and the like, ceramic substrates, such as silica glass, and semiconductor substrates, such as silicon or germanium substrates. The composition of the substrates influences the appropriate range of processing options following deposition of the dispersion/ink.

While various coating and printing approaches are suitable, inkjet printing offers desirable features for some applications with respect to speed, resolution and versatility with respect to real time selection of deposition patterning while maintaining speed and resolution. Practical deposition using inkjet printing with inorganic particles requires dispersion properties that involve both the techniques to form high quality silicon nanoparticle, such as with laser pyrolysis, along with the improved ability to form high quality dispersions from these particles. Thus, the particles produced using laser pyrolysis combined with the improved dispersion techniques provides for the formation of inks that are amenable to inkjet deposition.

Similarly, screen printing can offer desirable features for printing silicon inks for some applications. In particular, screen printing may already be tooled for a particular use. Thus, the substitution of the silicon inks for other materials in a production line may be performed with reduced capital expenses. Also, the pastes for screen printing may have a greater silicon particle concentration relative to concentrations suitable for other deposition approaches. The silicon particles and processes described herein are suitable for forming good quality pastes for screen printing as demonstrated in the examples below. Similarly, gravure printing can provide for efficient processing at high speeds with moderate resolution and relatively low maintenance costs for capital equipment.

Figure 13:
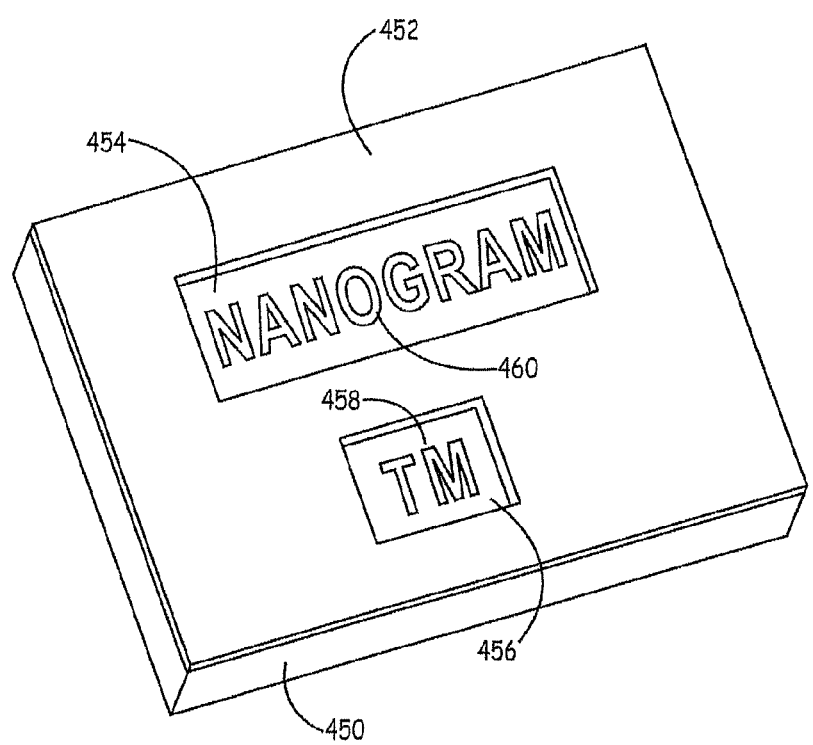
FIG. 13 is a schematic representation of a printed substrate.

A representative printed substrate is shown in FIG. 13. In this embodiment, substrate 450 has a surface coating 452 with windows 454, 456 through coating 452 to expose a portion of the substrate surface. Silicon ink is printed to form deposits 458, 460 on the substrate surface. The substrate can comprise silicon, germanium or an alloy thereof. Suitable substrates include, for example, high purity silicon wafers and the like. In other embodiments, suitable substrates include silicon/germanium foils, as described in published U.S. Patent application 2007/0212510A to Hieslmair et al., entitled "Thin Silicon or Germanium Sheets and Photovoltaics Formed From Thin Sheets," incorporated herein by reference. A silicon dispersion/ink can be applied over the surface using the coating or printing techniques described above.

In general, following deposition, the liquid evaporates to leave the particles and any other non-volatile components of the inks remaining. For some embodiments with suitable substrates that tolerates suitable temperatures and with organic ink additives, if the additives have been properly selected, the additives can be removed through the addition of heat in an appropriate oxygen atmosphere to remove the additives, as described above. Once the solvent and optional additives are removed, the silicon particles can then be processed further to achieve desired structures from the particles.

For example, the deposited silicon nanoparticles can be melted to form a cohesive mass of the silicon deposited at the selected locations. If a heat treatment is performed with reasonable control over the conditions, the deposited mass does not migrate significantly from the deposition location, and the fused mass can be further processed into a desired device. The approach used to sinter the silicon particles can be selected to be consistent with the substrate structure to avoid significant damage to the substrate during silicon particle processing. For example, laser sintering or oven based thermal heating can be used in some embodiments. Laser sintering and thermal sintering of silicon nanoparticles is described further in copending U.S. patent application Ser. No. 12/887,262, now published Application 2011/0120537, to Liu et al., entitled "Silicon Inks for Thin Film Solar Cell Formation, Corresponding Methods and Solar Cell Structures," incorporated herein by reference. The use of highly doped silicon nanoparticles for dopant drive in applications is described further below.

Semiconductor Applications

For solar cell, thin film transistor and other semiconductor applications, silicon particles can be used to form structures, such as doped contacts, that can form a portion of a particular device. In some embodiments, the inks can be used to form layers or the like of doped or intrinsic silicon. The formation of silicon layers can be useful for formation or thin film semiconductor elements, such as on a polymer film for display, layers for thin film solar cells or other applications, or patterned elements, which can be highly doped for the introduction of desired functionality for thin film transistors, solar cell contacts or the like.

The formation of a solar cell junction can be performed using the screen printing of a silicon ink with thermal densification in which the processing steps are folded into an overall processing scheme. In some embodiments, doped silicon particles can be used as a dopant source that provides a dopant that is subsequently driven into the underlying substrate to for a doped region extending into the silicon material. Following dopant drive-in, the silicon particles may or may not be removed. Thus, the doped silicon particles can be used to form doped contacts for solar cells. The use of doped silicon particles for dopant drive-in is described further in copending provisional patent application 61/438,064 to Liu et al, entitled "Silicon Substrates With Doped Surface Contacts Formed From Doped Silicon Inks and Corresponding Processes," incorporated herein by reference.

Some specific embodiments of photovoltaic cells using thin semiconductor foils and back surface contact processing is described further in published U.S. patent application 2008/0202576 to Hieslmair, entitled "Solar Cell Structures, Photovoltaic Panels, and Corresponding Processes," incorporated herein by reference. In some embodiments, the silicon ink is applied through pre-established windows to the substrate surface. The doped ink is printed within the substrate windows. Other patterning or no patterning can be used as desired for a particular application.

The silicon inks can also be used for the formation of integrated circuits for certain applications. Thin film transistors (TFTs) can be used to gate new display structures including, for example, active matrix liquid crystal displays, electrophoretic displays, and organic light emitting diode displays (OLED). Appropriate elements of the transistors can be printed with silicon inks using conventional photolithographic approaches or for moderate resolution using inkjet printing or other suitable printing techniques. The substrates can be selected to be compatible with the processing temperatures for the ink.

The TFTs comprise doped semiconductor elements and corresponding interfaces. Thin film transistors used as electronic gates for a range of active matrix displays are described further in Published U.S. Patent Application number 2003/0222315A to Amundson et al., entitled "Backplanes for Display Applications, and Components for use Therein," incorporated herein by reference. An n-type doped polycrystalline or amorphous silicon TFT active element with an anode common structure with an organic LED element is described further in U.S. Pat. No. 6,727,645 to Tsjimura et al., entitled "Organic LED Device," incorporated herein by reference. OLED display structures are described further, for example, in published U.S. Patent Application 2003/0190763 to Cok et al., entitled "Method of Manufacturing a Top-Emitting OLED Display Device With Desiccant Structures," incorporated herein by reference. Conventional photolithography techniques for the formation of TFTs is described further in U.S. Pat. No. 6,759,711 to Powell, entitled "Method of Manufacturing a Transistor," incorporated herein by reference. These conventional photolithography approaches can be replaced with the printing approaches described herein. U.S. Pat. No. 6,759,711 further describes integration of TFTs with an active matrix liquid crystal display. The silicon nanoparticle inks described herein can be effectively used to print elements of a TFT with selected dopants.

Biochips are growing in use for diagnostic medical purposes. U.S. Pat. No. 6,761,816 to Blackburn et al., entitled "Printed Circuit Boards With Monolayers and Capture Ligands," incorporated herein by reference. These biochip arrays have electrical circuits integrated with biological components so that automatic evaluations can be performed. The functional inks described herein can be used to form electrical components for these devices while biological liquids can be printed or otherwise deposited for the other components.

Radio-Frequency Identification (RFID) tags are gaining widespread use for loss prevention. These devices are desired to be small for less obtrusiveness and low cost. The silicon inks described herein can be used effectively to print RFIDs or components thereof. Systems for printing RFIDs on a roll-to-roll configuration are described further in published U.S. Patent Application serial number 2006/0267776A to Taki et al., entitled "RFID-Tag Fabricating Apparatus and Cartridge," incorporated herein by reference.

To form a device component from the silicon particle deposit, the material is heated. For example, the structure can be placed into an oven or the like with the temperature set to soften the particles such that fuse into a mass. The time and temperature can be adjusted to yield a desired fusing and corresponding electrical properties of the fused mass. Alternative approaches can be used to heat the surface of the substrate with the deposit. A thermal process based on taking advantage of reduced melting temperatures for silicon nanoparticles with a particle size no more than roughly 10 nm is described in U.S. Pat. No. 5,576,248 to Goldstein, entitled "Group IV Semiconductor Thin Films Formed at Low Temperature Using Nanocrystal Precursors," incorporated herein by reference. This reference describes films that are no thicker than about 20 nm. Higher temperatures or light based fusing can be used to achieve thicker deposits.

However, improved control of the resulting doped substrate as well as energy saving can be obtained through the use of light to melt the silicon particles without generally heating the substrate or only heating the substrate to lower temperatures. Local high temperatures on the order of 1400° C. can be reached to melt the surface layer of the substrate as well as the silicon particles on the substrate. Generally, any intense source selected for absorption by the particles can be used, although excimer lasers or other lasers are a convenient UV source for this purpose. Excimer lasers can be pulsed at 10 to 300 nanoseconds at high fluence to briefly melt a thin layer, such as 20 nm to 1000 nm, of the substrate. Longer wavelength light sources such as 1 micron wavelength light sources can also be used.

Thermal and light based fusing of silicon particles is described further in published U.S. Patent Application 2005/0145163A to Matsuki et al., entitled "Composition for Forming Silicon Film and Method for Forming Silicon Film," incorporated herein by reference. In particular, this reference describes the alternative use of irradiation with a laser or with a flash lamp. Suitable lasers include, for example, a YAG laser or an excimer laser. Noble gas based flash lamps are also described. The heating generally can be performed in a non-oxidizing atmosphere.

Following the fusing of the silicon particles into a solid structure, additional processing steps can be performed to incorporate the resulting structure into the device. For photovoltaic applications, the fused deposit can comprise a doped silicon material that forms a p-doped or n-doped contact. The contacts are then connected to appropriate current collectors to provide for harvesting of the power from the photovoltaic cell.

EXAMPLES

Example 1

Synthesis of Highly Doped Si Nanoparticles Using Laser Pyrolysis with Rectangular Nozzle and Air Knife Quenching This example demonstrates the ability to synthesize highly doped silicon nanoparticles with high uniformity using laser pyrolysis.

A laser pyrolysis apparatus similar to FIG. 8 of published U.S. patent application 2009/0020411A to Holunga et al., entitled "Laser Pyrolysis With In-Flight Particle Manipulation for Powder Engineering," incorporated herein by reference. The apparatus was equipped with an air knife to provide quenching of the particles entering the exhaust conduit.

Phosphine ($PH_3$) was used as the phosphorous dopant source, and the phosphine gas was mixed with inert argon at a mole ratio of 91% Ar to 9% $PH_3$. The silane precursor was mixed with the blend of Ar and phosphine precursor for delivery to the nozzle. A reactant delivery system similar to the system shown in FIG. 2 was used. The parameters for the synthesis of particles with two dopant levels are summarized in Table 1, where slm is standard liters per minute.

TABLE 1

| Particle Sample | 1 | 2 |
|---|---|---|
| $SiH_4$ (slm) | 0.02-0.15 | 1-5 |
| 9% $PH_3$ + 91% Ar (slm) | 0.01-0.1 | 1.0-10 |
| Pressure (Torr) | 500-650 | 100-300 |
| Argon - Dilution (slm) | 3-10 | 3-10 |
| Argon -Shielding (slm) | 3-10 | 3-10 |
| Argon -Air Knives (slm) | 10-25 | 10-25 |
| Laser Input (Watts) | 2000 | 1500 |
| Measured Dopant (atomic percent) | 2.94 | 7.44 |
| Stoichiometric Dopant Incorporation (atomic percent) | 4.3 | 27.3 |

The results were obtained under the conditions where no visible flame is observable. The dopant levels measured with inductively coupled plasma-mass spectroscopy (ICP-MS) are presented in Table 1. These dopant levels can also be presented in other units, e.g., 2.94 atomic percent=32,600 ppm by weight=$1.47 \times 10^{21}$ atoms/cm$^3$, 7.44 atomic percent=82,400 ppm by weight=$3.72 \times 10^{21}$ atoms/cm$^3$, 0.39 atomic percent=4300 ppm by weight=$1.94 \times 10^{20}$ atoms/cm$^3$, and 2.5 atomic percent=28,000 ppm by weight=$1.26 \times 10^{21}$ atoms/cm$^3$. Very high dopant levels were achieved through the laser pyrolysis synthesis process.

Example 2

Synthesis of Highly N-Doped Si Nanoparticles Using Laser Pyrolysis with Annular Nozzle This example demonstrates the ability to synthesize highly doped silicon nanoparticles with high uniformity using laser pyrolysis.

The apparatus was modified with a nozzle essentially as shown in FIGS. 3-6. Inert shielding gas was flowed through the inner tube and the central annular passage, and the silicon precursor ($SiH_4$) and dopant precursor were flowed through the inner annular passage. Inert gas as an entrainment gas was flowed through the outer annular passage. Experiments were performed targeting different dopant levels.

As in example 1, phosphine ($PH_3$) was used as the phosphorous dopant source, and the phosphine gas was mixed with inert argon at a mole ratio of 91% Ar to 9% $PH_3$. The silane precursor was mixed with the blend of Ar and phosphene precursor for delivery to the nozzle. A reactant delivery system similar to the system shown in FIG. 2 was used. The parameters for the synthesis of particles with 4 selected dopant levels are summarized in Table 2, where slm is standard liters per minute.

TABLE 2

| Particle Sample | 3 | 4 | 5 | 6 |
|---|---|---|---|---|
| SiH$_4$ (slm) | 1-5 | 1-5 | 1-5 | 0.5-2 |
| 9% PH$_3$ + 91% Ar (slm) | 0.1-0.25 | 1-2.5 | 0.5-1 | 1-2.5 |
| Pressure (Torr) | 500-700 | 500-700 | 500-700 | 500-700 |
| Argon -Inner Shielding (slm) | 8-12 | 8-12 | 8-12 | 8-12 |
| Argon - Dilution (slm) | 5-10 | 5-10 | 5-10 | 5-10 |
| Argon - Outer Shielding (slm) | 25-40 | 25-40 | 25-40 | 25-40 |
| Argon -Entrainment (slm) | 100-200 | 100-200 | 100-200 | 100-200 |
| Laser Input (Watts) | 2000 | 2000 | 2000 | 2000 |
| Measured Dopant (atomic percent) | 0.39 | 2.5 | 1 | 2.3-2.7 |
| Stoichiometric Dopant Incorporation (atomic percent) | 0.46 | 4.3 | 1.5 | 18 |

In contrast with the results in Example 1, the results in this example were obtained under conditions in which a flame was visible. Note that the relative incorporation of dopant in the run under the conditions for particle sample 1 in Example 1 was similar to the relative incorporation of dopant for particles synthesizes under the conditions noted for particle sample 4. Sample 5 was aimed at an intermediate dopant level relative to samples 3 and 4. The particles in sample 6 were smaller than the particles in sample 3-5, and a significantly smaller portion of dopant was incorporated from the flow into the particles.

Figure 14:
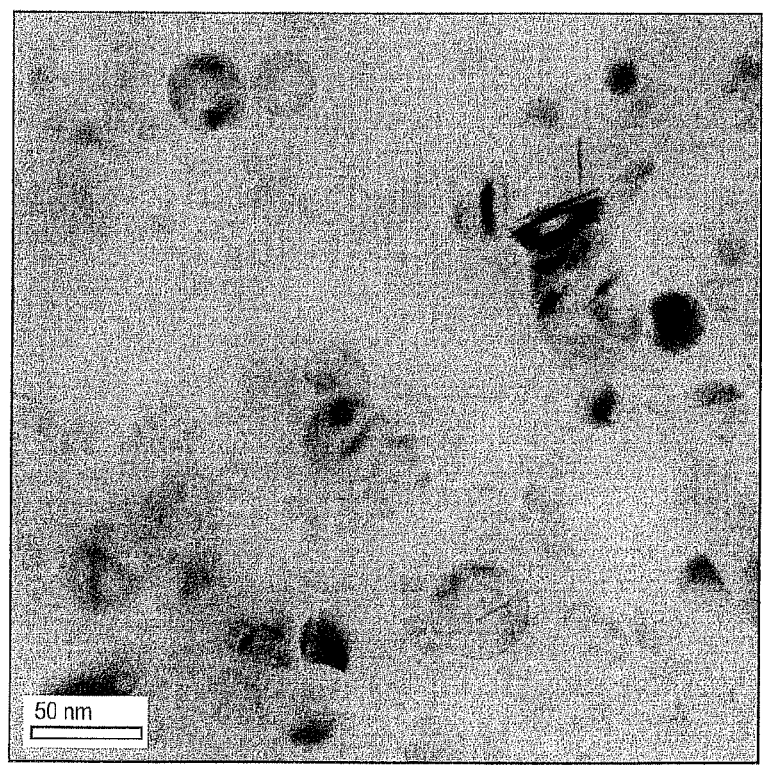
FIG. 14 is a TEM micrograph of a silicon particles comprising about 0.39 at % phosphorous dopant taken at a first magnification.
Figure 15:
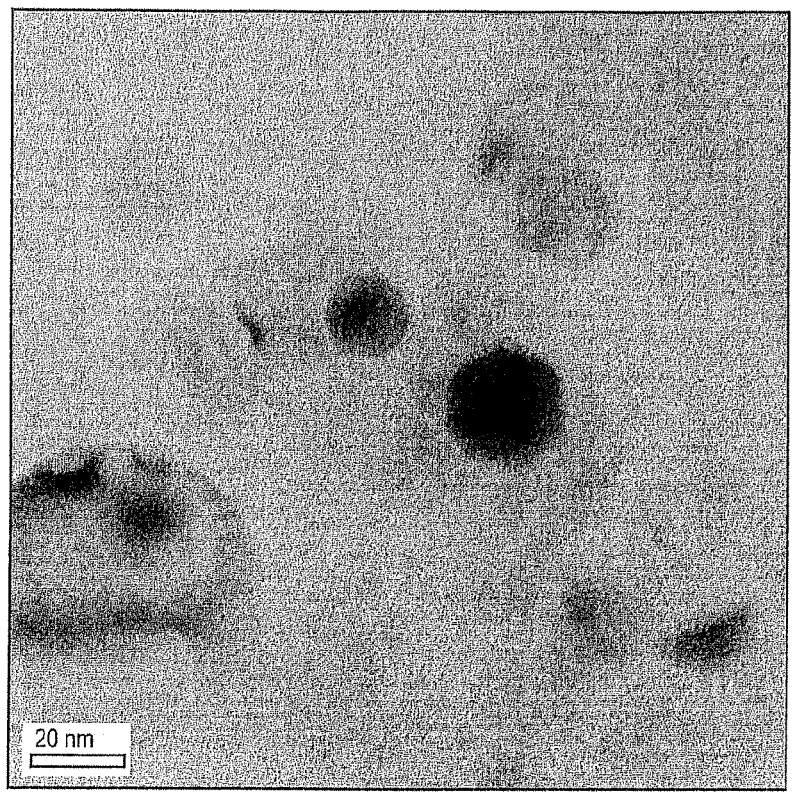
FIG. 15 is a TEM micrograph of silicon particles comprising about 0.39 at % phosphorous dopant taken at a second magnification.
Figure 16:
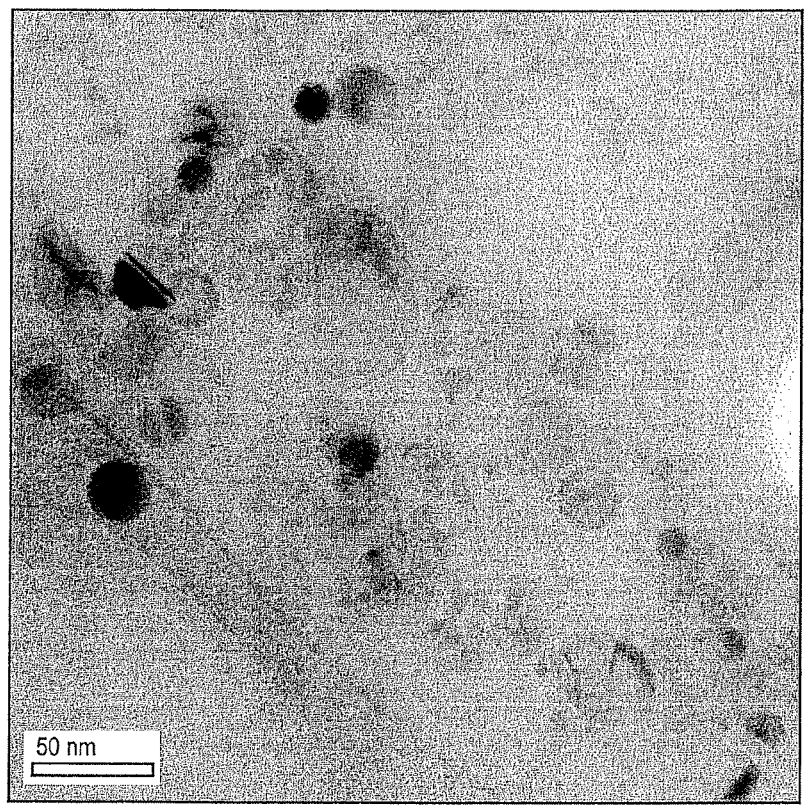
FIG. 16 is a TEM micrograph of silicon particles comprising about 2.5 at % phosphorous dopant taken at a first magnification.
Figure 17:
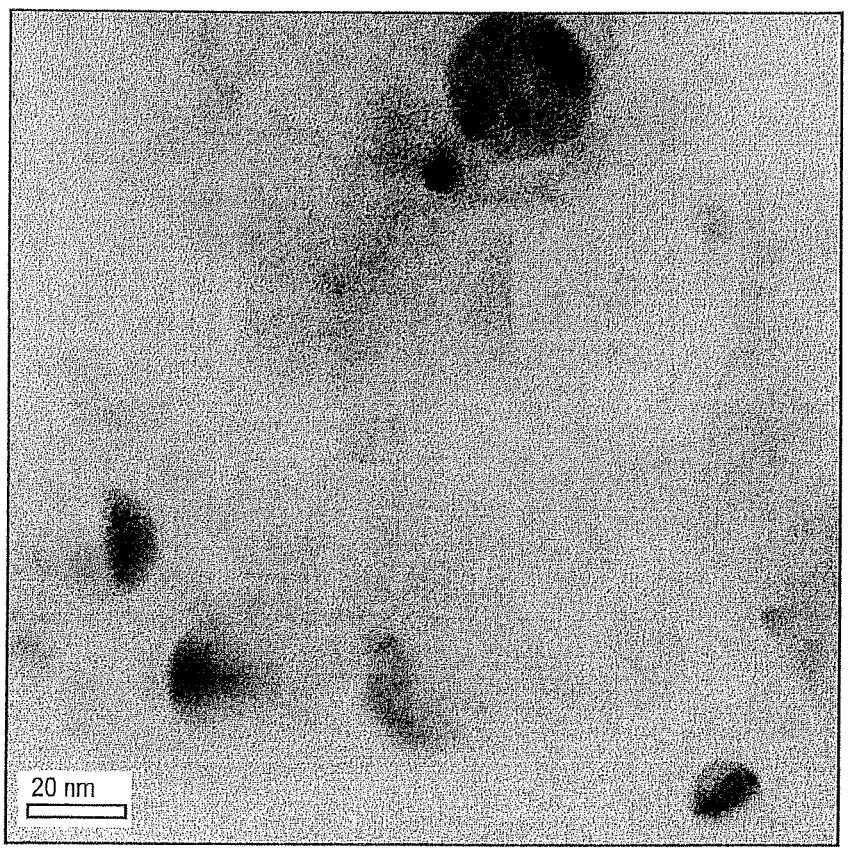
FIG. 17 is a TEM micrograph of silicon particles comprising about 2.5 at % phosphorous dopant taken at a second magnification.
Figure 18:
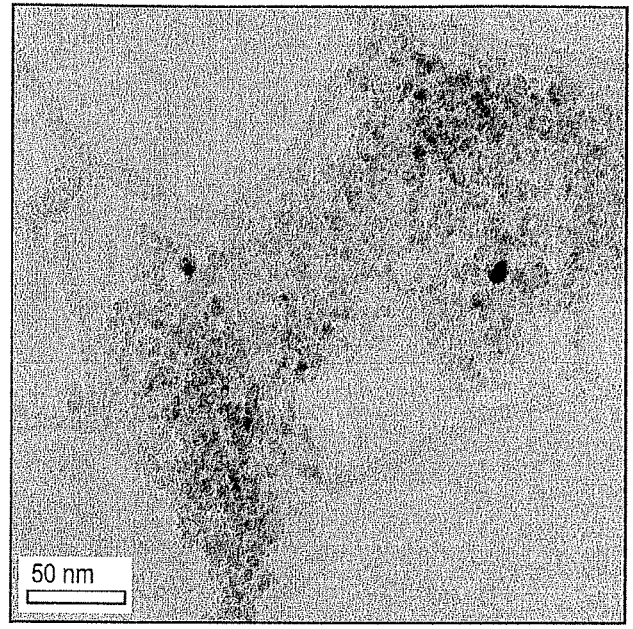
FIG. 18 is a TEM micrograph of silicon particles comprising about 2.3 at % to about 2.7 at % phosphorous dopant taken at a first magnification.
Figure 19:
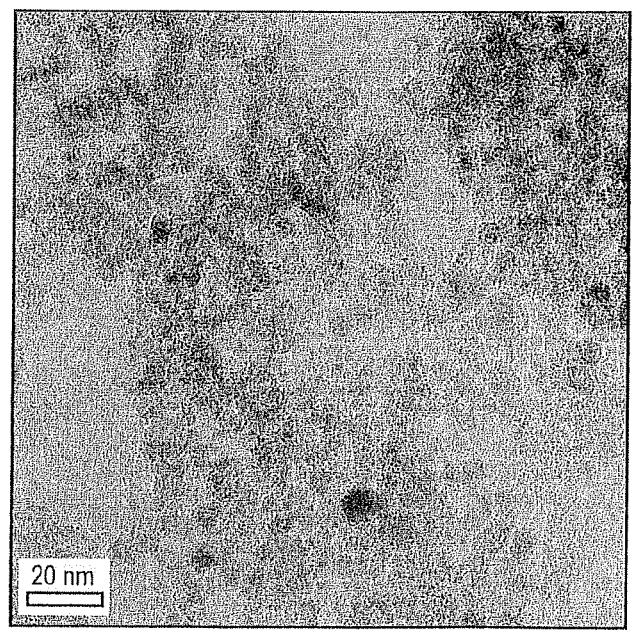
FIG. 19 is a TEM micrograph of silicon particles comprising about 2.3 at % to about 2.7 at % phosphorous dopant taken at a second magnification.
Figure 20:
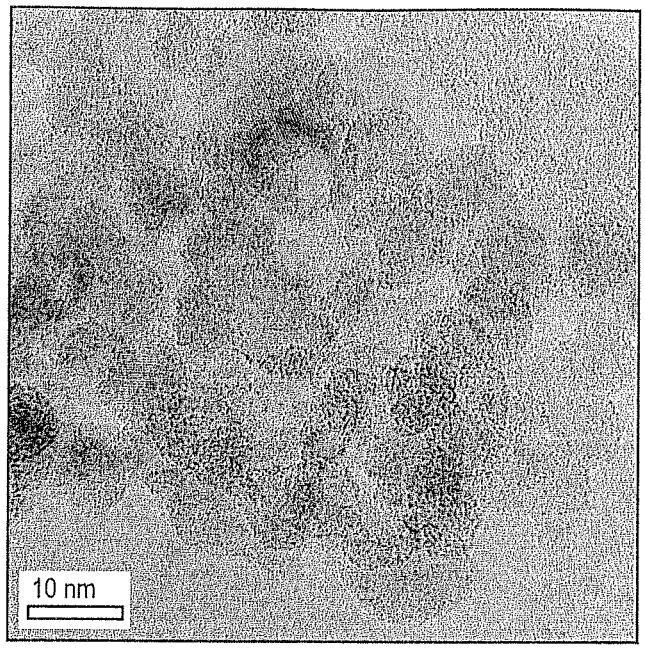
FIG. 20 is a TEM micrograph of silicon particles comprising about 2.3 at % to about 2.7 at % phosphorous dopant taken at a third magnification.

TEM micrographs of the particles generated under the conditions shown in Table 2 are shown in FIGS. 14-17. FIGS. 14 and 15 show particles produced under the conditions of particle sample 3 at two magnifications, and FIGS. 16 and 17 show particles produced under the conditions of particle sample 4 at two magnifications. FIGS. 18-20 show particles produced under conditions of particle sample 6 at different magnifications. The particles are relatively uniform with respect to particle size. The particles produced under conditions specified for samples 3-5 had average primary particle diameters from about 22 nm to about 25 nm, while particles produced under the conditions of sample 6 had average primary particle diameters of about 7 nm.

The BET surface areas were measured for sample 5 and 6, and average particle sizes obtained from the surface area measurements assuming unagglomerated, non-porous spherical particles were 26 nm and 7 nm, respectively.

Example 3

Synthesis of Boron Doped Si Nanoparticles Using Laser Pyrolysis with Annular Nozzle This example demonstrates the ability to synthesize p-doped silicon nanoparticles with high uniformity using laser pyrolysis.

The laser pyrolysis was performed with an apparatus equipped with a nozzle essentially as shown in FIGS. 3-6. Inert shielding gas was flowed through the inner tube and the central annular passage, and the silicon precursor (SiH$_4$) and dopant precursor were flowed through the inner annular passage. Inert gas as an entrainment gas was flowed through the outer annular passage. Experiments were performed targeting different dopant levels with one sample having a high boron dopant level and another sample having a low boron dopant level.

Diborane (B$_2$H$_6$) was used as the borane dopant source, and the diborane gas was mixed with inert argon at a selected mole ratio as indicated in the table below. The silane precursor was mixed with the blend of Ar and diborane precursor for delivery to the nozzle. A reactant delivery system similar to the system shown in FIG. 2 was used. The parameters for the synthesis of particles are summarized in Table 3, where slm is standard liters per minute.

TABLE 3

| Particle Sample | 1 | 2 |
|---|---|---|
| SiH$_4$ (slm) | 1-5 | 0.5-2.5 |
| 1% B$_2$H$_6$ + 99% Ar (slm) | | 1-3 |
| 0.005% B$_2$H$_6$ + 99.995% Ar (slm) | 0.01-0.04 | |
| Pressure (Torr) | 500-700 | 500-700 |
| Argon -Inner Shielding (slm) | 5-12 | 5-12 |
| Argon - Dilution (slm) | 5-10 | 5-10 |
| Argon - Outer Shielding (slm) | 20-40 | 20-40 |
| Argon -Entrainment (slm) | 100-200 | 100-200 |
| Laser Input (Watts) | 2000 | 2000 |
| Measured Dopant (atomic percent) | $3 \times 10^{-4}$ | 39 |

Figure 21:
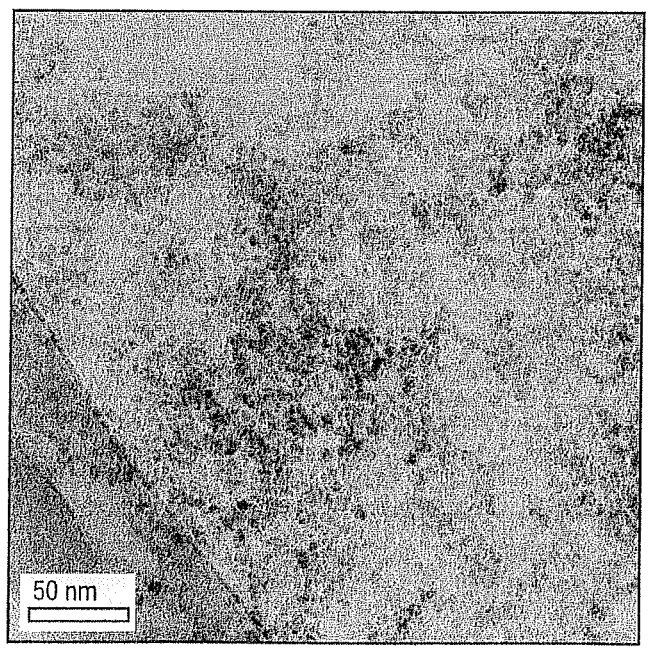
FIG. 21 is a TEM micrograph of silicon particles comprising about 39 at % boron dopant taken at a first magnification.
Figure 22:
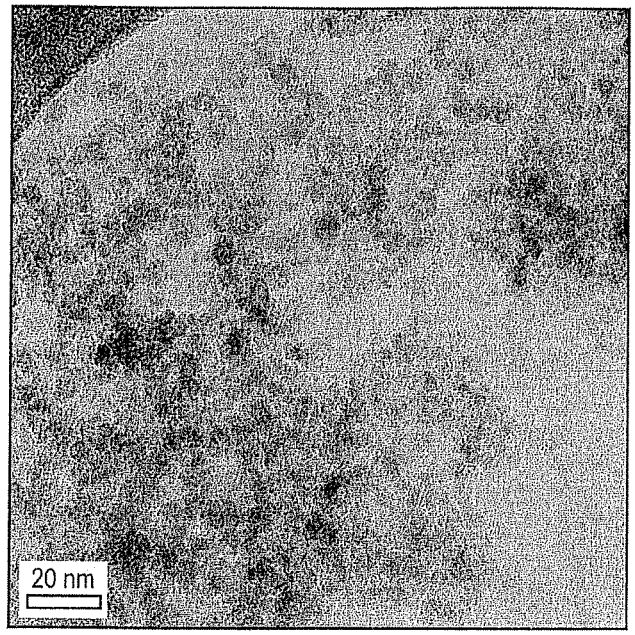
FIG. 22 is a TEM micrograph of silicon particles comprising about 39 at % boron dopant taken at a second magnification.
Figure 23:
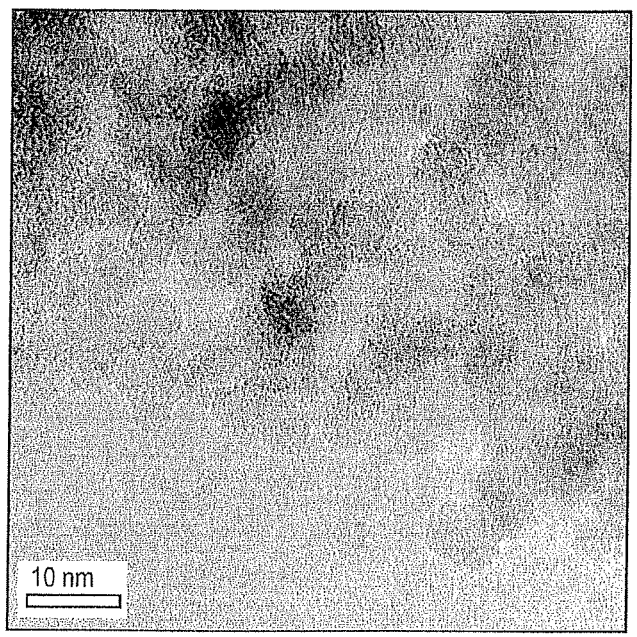
FIG. 23 is a TEM micrograph of silicon particles comprising about 39 at % boron dopant taken at a third magnification.

TEM micrographs of particles of generated under the conditions of sample 2 in Table 3 are displayed in FIGS. 21-23 at various magnifications. The particles produced under the conditions of Table 3 had particle size estimates from BET surface areas of 7 m (sample 1) and 20 nm (sample 2).

Metal contamination results for particles generated under the conditions of sample 1 in Table 3 are displayed in Table 4. The presence of metals in the synthesized silicon particles was analyzed by first forming a slurry comprising 18 g of isopropyl alcohol and 2 g of silicon particles. In contrast with the contamination measurements presented in Example 7 below, the slurry was not centrifuged. The amount of metals present in the slurry was then measured using ICP-MS. The amount of metals present in the dry silicon particles was then estimated by multiplying the metal concentrations obtained in the slurry by a factor of 10 (the slurry was 10 wt % silicon nanoparticles).

TABLE 4

| | Detection Limits (ppb by wt) | Concentration in Slurry (ppb by wt) | Concentration in Particles (ppb by wt) |
|---|---|---|---|
| Aluminum | 0.5 | 21 | 210.0 |
| Antimony | 0.5 | <0.5 | <5 |
| Arsenic | 1 | <1 | <10 |
| Barium | 0.1 | 0.38 | 3.8 |
| Beryllium | 0.5 | <0.5 | <5 |
| Bismuth | 0.5 | <0.5 | <5 |
| Boron | 1 | 120 | 1200.0 |
| Cadmium | 0.1 | <0.1 | <1 |
| Calcium | 1 | 190 | 1900.0 |
| Chromium | 0.5 | 14 | 140.0 |
| Cobalt | 0.1 | 0.14 | 1.4 |
| Copper | 0.5 | 4.4 | 44.0 |
| Gallium | 0.1 | 1.9 | 19.0 |
| Germanium | 0.5 | <0.5 | <5 |
| Gold | 1 | <1 | <10 |
| Iron | 1 | 66 | 660.0 |
| Lead | 0.5 | <0.5 | <5 |
| Lithium | 0.5 | <0.5 | <5 |
| Magnesium | 0.5 | 19 | 190.0 |
| Manganese | 0.5 | 1.5 | 15.3 |
| Molybdenum | 0.5 | 0.94 | 9.4 |
| Nickel | 0.5 | 8.5 | 85.0 |
| Niobium | 0.5 | <0.5 | <5 |
| Potassium | 1 | 18 | 180.0 |
| Silver | 0.5 | <0.5 | <5 |
| Sodium | 1 | 12 | 120.0 |

TABLE 4-continued

| | Detection Limits (ppb by wt) | Concentration in Slurry (ppb by wt) | Concentration in Particles (ppb by wt) |
|---|---|---|---|
| Strontium | 0.1 | 0.19 | 1.9 |
| Tantalum | 0.5 | <0.5 | <5 |
| Thallium | 0.5 | <0.5 | <5 |
| Tin | 0.5 | <0.5 | <5 |
| Titanium | 0.5 | 7.7 | 77.0 |
| Vanadium | 0.5 | <0.5 | <5 |
| Zinc | 0.5 | 19 | 190.0 |
| Zirconium | 0.1 | 0.15 | 1.5 |

Most metals were present in only very low concentrations in the dispersion. Of the transition metals, only iron was present in amounts greater than 200 ppb.

Example 4

Dispersions of Si Nanoparticles

This example demonstrates the ability to form well dispersed silicon nanoparticles at high concentrations without surface modification of the particles.

Dispersions have been formed with silicon nanoparticles having different average primary particle sizes. The crystalline silicon particles were formed as described in Example 2 with high levels of doping. Concentrated solutions were formed that are suitable for ink applications, and the solvent is also selected for the particular printing application. For secondary particle size measurements, the solutions were diluted so that reasonable measurements could be made since concentrated solutions scatter too much light to allow secondary particle size measurements.

Figure 24:
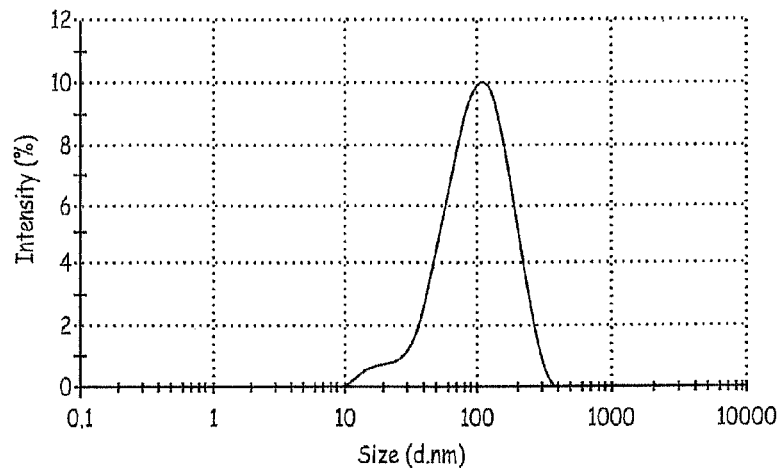
FIG. 24 is a plot of secondary particle size versus intensity obtained from DLS measurements on a dispersion of silicon particles with an average primary particle size of 25 nm.
Figure 25:
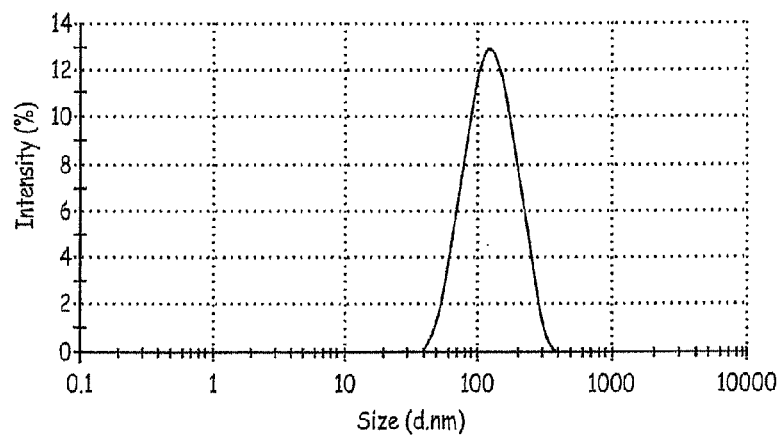
FIG. 25 is a plot of secondary particle size versus intensity obtained from DLS measurements on a dispersion comprising and silicon particles with an average primary particle size of 9 nm.

The particles were mixed with the solvent and sonicated to form the dispersion. The dispersions were formed at concentrations of 3-7 weight percent particles. The samples were diluted to 0.4 weight percent particles for the secondary particle size measurements, and the measurements were made using differential light scattering (DLS). Referring to FIGS. 24 and 25, the secondary particle sizes were measured in isopropyl alcohol for particles with average primary particle sizes of 25 nm (FIG. 24) and 9 nm (FIG. 25). The Z-average secondary particle sizes were similar for the two sets of Si particles with the Z-average particles sizes being slightly larger for the particles with about 9 nm average primary particle size. These results suggest greater agglomeration for the particles having a 9 nm average particle diameter. A close examination of the 9 nm particles by transmission electron microscopy yielded a view of more agglomerated non-spherical particles, which is consistent with the secondary particle size measurements.

Figure 26:
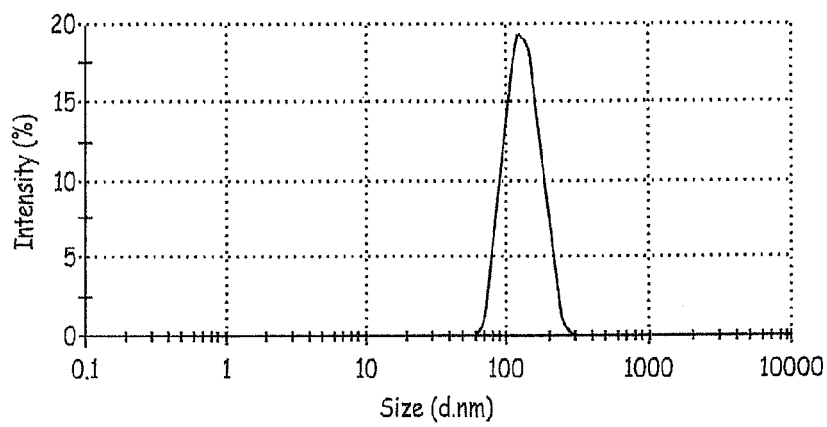
FIG. 26 is a plot of secondary particle size versus intensity obtained from DLS measurements on a dispersion comprising ethylene glycol.
Figure 27:
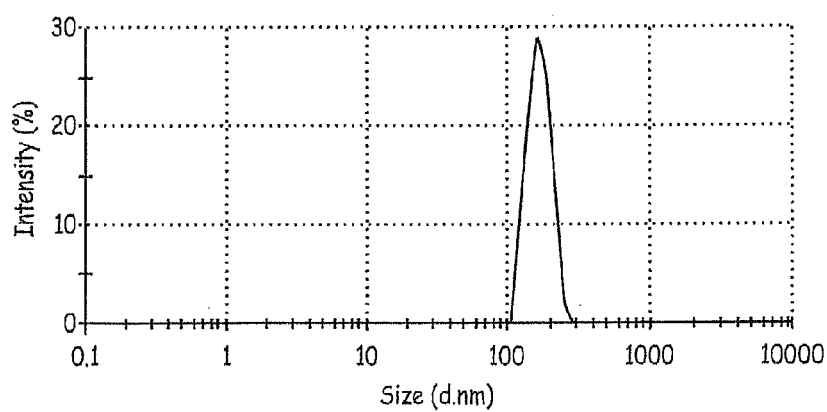
FIG. 27 is a plot of secondary particle size versus intensity obtained from DLS measurements on a dispersion comprising terpineol and silicon particles.

Dispersions were also formed in other solvent systems suitable for other printing approaches. Specifically, a dispersion was formed in ethylene glycol. The solution was formed at a concentration of silicon particles of 3-7 weight percent. For the measurement of the secondary particle size by DLS, the dispersion was diluted to 0.5 weight percent Si nanoparticles. The DLS results are shown in FIG. 26. Also, a dispersion was formed in terpineol. Again, the dispersion was diluted to a concentration of 0.5 weight percent particles for measurement of the secondary particle size by DLS as shown in FIG. 27. The secondary particle size measurements for the terpineol based solvent system were similar to the particle size measurements in the ethylene glycol based solvent system.

As discussed further in the following examples, these secondary particles sizes were suitable for forming inks with good performance for inkjet printing, spin coating and screen printing.

Example 5

Inkjet Ink and Printing

This example demonstrates the suspension of doped silicon nanoparticles in a solvent suitable for inkjet printing as well as the demonstration of successful inkjet printing of the resulting ink using a commercial inkjet head.

Figure 28:
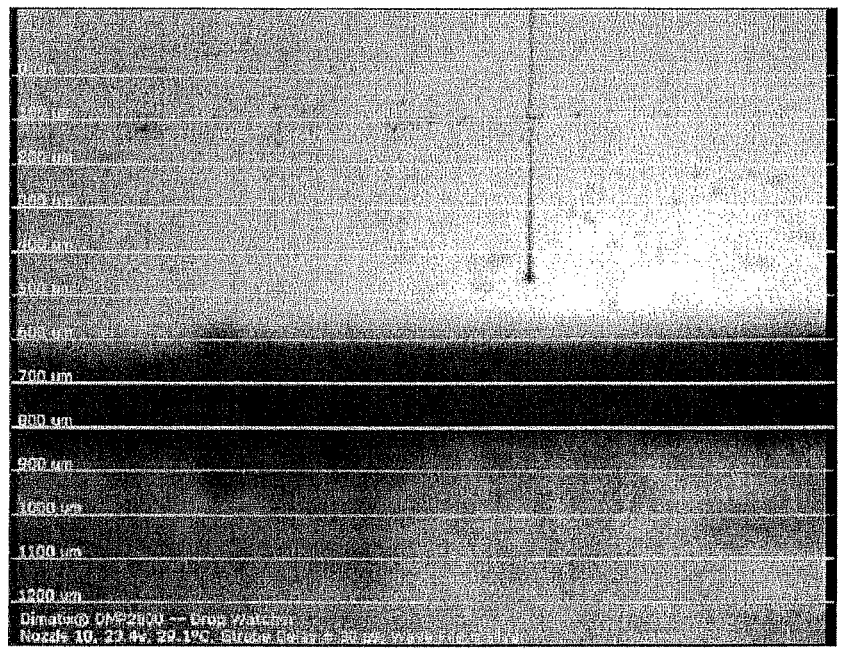
FIG. 28 is a stroboscopic image of inkjetting of a first ink from one nozzle.
Figure 29:
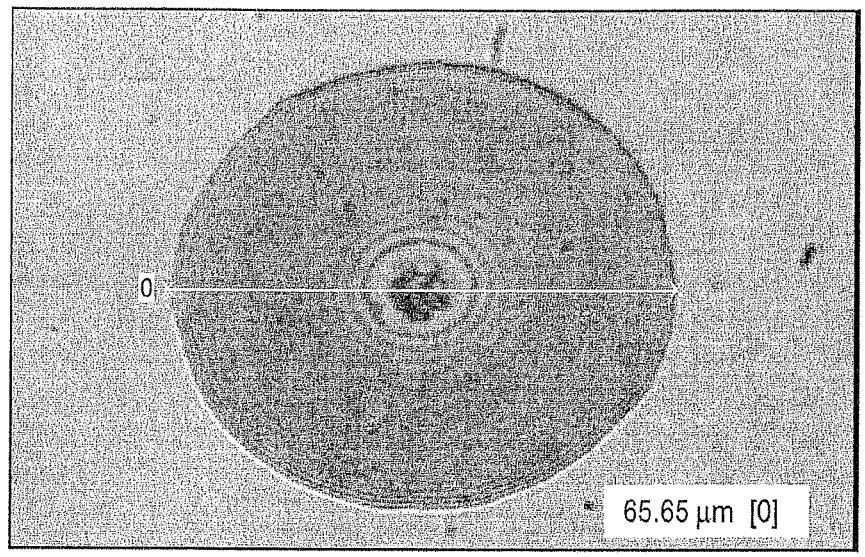
FIG. 29 is a photographic image a cured printed ink drop.

In a set of experiments, a silicon ink was formed with undoped Si particles formed as described in Example 1 having an average particle size of about 26 nm. The particles had a BET surface area corresponding to 28 nm particles. The ink was formulated with a concentration of 12 weight percent particles in a solvent of 1 part by weight propylene glycol and 7 parts by weight N-methylpyrrolidone. The ink had a viscosity ($\eta$) of 13.7 cP and a surface tension ($\gamma$) of about 44 D/cm. The inkjet printing properties of the ink were evaluated with a Dimatix DMP-2800 inkjet printer with 16 nozzles. 15 of the 16 nozzles printed successfully after one initial purge. No clogging was observed with reasonably stable ejection over 1.5 hours. The stability of the printed line is shown in FIG. 28. A printed drop had a spot size of 60 microns as printed and 65 microns after baking, as shown in FIG. 29. Acceptable printing results were obtained, and the inkjets did not clog.

Figure 30:
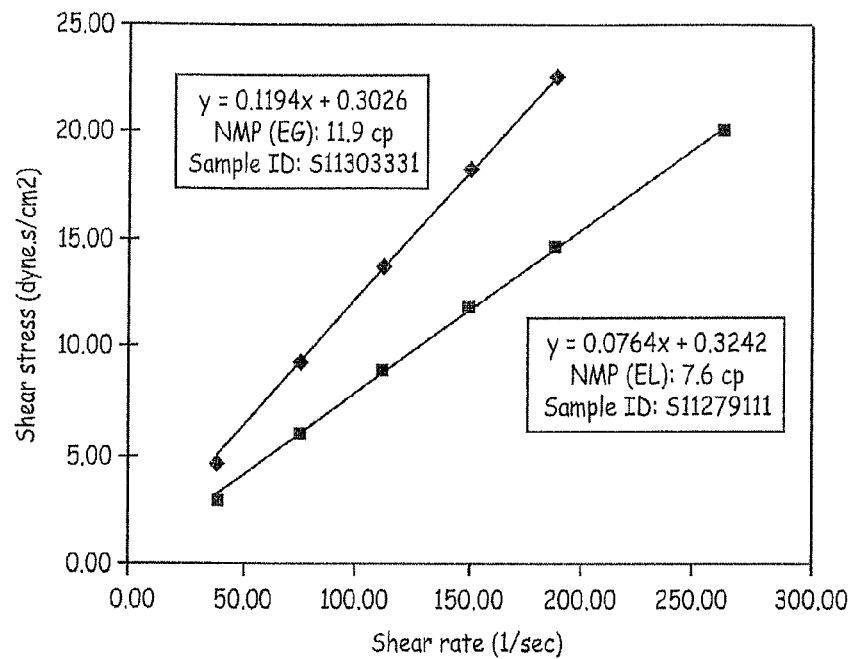
FIG. 30 is a graph containing plots of shear rate versus shear stress for inks comprising different solvent blends.
Figure 31A:
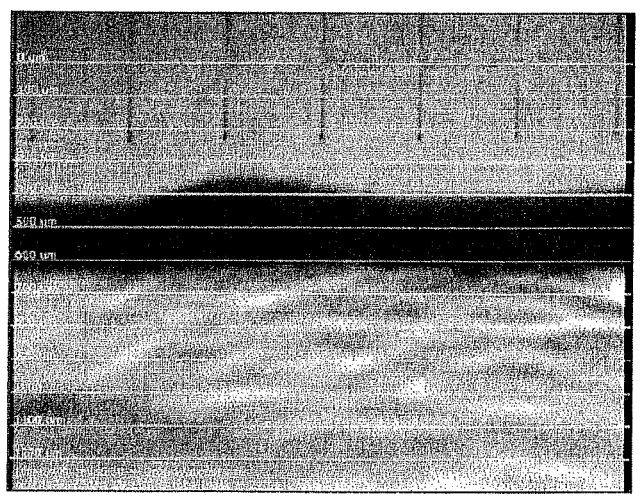
FIG. 31(*a*) is a stroboscopic image of a second ink.
Figure 31B:
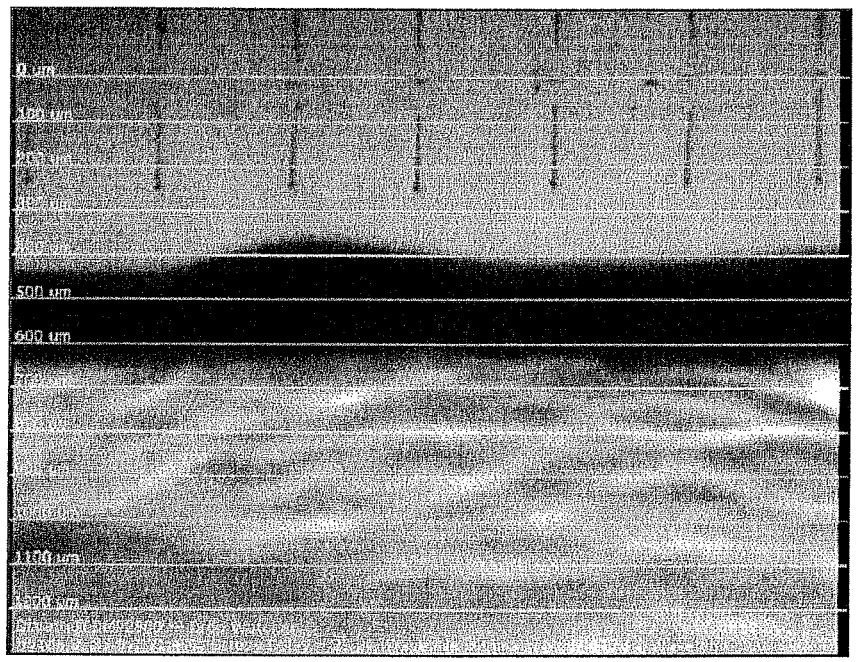

Inkjet tests were also performed with dispersions comprising doped Si particles formed as described in Example 2. The particles had an average primary particle size of 35 nm. A shear test was performed with dispersions in solvent blends of NMP with ethyl lactate (EL) at a ratio of 9:1 by weight and of NMP with ethylene glycol (EG) at a ratio from 9:1 to 7:3 by weight. The shear stress as a function of shear rate is plotted in FIG. 30 for these two dispersions. The dispersion with the NMP/EL solvent blend had a viscosity of 7.6 cP, and the dispersion with the NMP/EG solvent blend had a viscosity of 11.9 cP. Inkjet printing was tested for the dispersions with the NMP/EG blend. Prior to printing, the dispersions were filtered through a filter with a pore size of 450 nm to remove any large particulates. The drop watcher test results are shown in FIG. 31 at the start of the test (a), after 1 hour (b) and after 1 hour with a purge to clean the nozzle (c). Acceptable printing results were observed.

Example 6

Viscosity Measurements on Inks

This example demonstrates concentrated suspensions of doped silicon nanoparticles in a solvent suitable for screen printing.

For screen printing, the dispersions are desired to have a greater viscosity and a greater concentration. Various solvent mixtures were tested with respect to viscosity. Dispersions of silicon nanoparticles were formed in solvent mixtures of NPM and PG at various particle concentrations. The undoped silicon nanoparticles had an average primary particle diameter of about 30 nm. Ultrasound was used to facilitate the dispersion. The rheology of the resulting dispersions was studied. Some of the dispersions solidified so that fluid measurements could not be performed. The results are presented in Table 5.

TABLE 5

| Sample | Solvent ID | Si wt % | Viscosity (cP) | YS (D/cm²) | Rheology |
|---|---|---|---|---|---|
| 1 | 1 | 17.0 | 16.88 | 0 | N |
| 2 | 2 | 15.4 | 12.99 | 4.3 | NN |
| 3 | 3 | 15.3 | 31.70 | 6.3 | NN |
| 4 | 4 | 15.5 | — | ∞ | — |
| 5 | 5 | 14.4 | — | ∞ | — |
| 6 | 6 | 13.2 | — | ∞ | — |
| 7 | 1 | 14.1 | 5.83 | 3.4 | NN |
| 8 | 2 | 16.1 | 10.03 | 0.0 | N |
| 9 | 3 | 14.6 | 10.58 | 0.0 | N |
| 10 | 4 | 14.1 | 22.89 | 3.3 | NN |
| 11 | 5 | 14.8 | — | ∞ | — |
| 12 | 6 | 13.1 | — | ∞ | — |
| 13 | 1 | 11.7 | 1.81 | 0.0 | N |
| 14 | 2 | 14.0 | 11.51 | 0.0 | N |
| 15 | 3 | 11.4 | 7.29 | 0.0 | N |
| 16 | 4 | 10.9 | 13.60 | 1.7 | NN |
| 17 | 5 | 12.3 | 15.18 | 2.3 | NN |
| 18 | 6 | 11.9 | — | ∞ | — |

In Table 5, YS refers to yield stress in dynes per square centimeter. Yield stress is proportional to a force exerted to initiate flow of the non-Newtonian fluid in a tube. The shear stresses as a function of the shear rates were fit to a straight line by least squares, and the slope corresponds to the viscosity and the y-intercept corresponds to the yield stress. By increasing the particle concentration in a good dispersing solvent, non-Newtonian properties can be obtained that are expected for proper inkjet ink. From the results above, yield stress increased with an increase in Si particle concentration and an increase in propylene glycol concentration.

The solvents listed in Table 5 were various blends of propylene glycol and N-methylpyrrolidone (NMP). All of the blends had Newtonian rheology. The compositions and viscosities for these solvent blends are summarized in TABLE 6.

TABLE 6

| Solvent ID | Wt % PG | Viscosity (cP) |
|---|---|---|
| 1 | 12.6 | 2.47 |
| 2 | 25.1 | 3.59 |
| 3 | 37.1 | 5.06 |
| 4 | 50.0 | 7.51 |
| 5 | 62.6 | 11.33 |
| 6 | 74.8 | 16.64 |

The dispersions that did not solidify were also diluted to an approximate 1 weight percent concentration. Light scattering was used to evaluate the properties of the dispersion based on the diluted samples. The results are summarized in Table 7. No measurements were possible for the samples that solidified. Samples 10 and 17 formed gels, but measurements were still possible for these samples.

TABLE 7

| Sample | Z-average (nm) | Distribution Peak (nm) | PDI |
|---|---|---|---|
| 1 | 273 | 331 | 0.24 |
| 2 | 99 | 123 | 0.22 |
| 3 | 57 | 71 | 0.22 |
| 7 | 298 | 390 | 0.23 |
| 8 | 106 | 139 | 0.22 |
| 9 | 80 | 102 | 0.22 |
| 10 | 54 | 69 | 0.22 |
| 13 | 309 | 404 | 0.24 |
| 14 | 103 | 123 | 0.25 |
| 15 | 75 | 95 | 0.21 |
| 16 | 60 | 75 | 0.19 |
| 17 | 44 | 57 | 0.23 |

As seen in Table 7, the dispersion size decreased with increasing amounts of PG in the solvent blend.

Example 7

Impurities in Si Inks

This example demonstrates the range and quantities of impurities in Si inks.

To test the range and quantities of impurities in Si inks, two slurries and two spin coating inks were formed, all from phosphorous doped silicon particles formed as described in Example 2 similar to sample 4. The silicon particles had an average primary particle diameter of about 7 nm. The slurries comprised a 5 weight percent mixture of n++ doped silicon nanoparticles in isopropyl alcohol. The spin coating inks were formed from a 6.3 weight percent dispersion of phosphorous doped silicon particles in a blend of isopropyl alcohol and ethylene glycol. The dispersion was sonicated and centrifuged and the ink was subsequently decanted from the processed dispersion. The composition and corresponding amount of impurities in the slurries and the inks were measured using ICP-MS. The results of the ICP-MS analysis are displayed in Table 8.

TABLE 8

| | Concentration in Slurry (ppb by wt) | | Concentration in Ink (ppb by wt) | |
|---|---|---|---|---|
| | Sample 1 | Sample 2 | Sample 1 | Sample 2 |
| Aluminum | 25 | 2.6 | <0.5 | 0.59 |
| Chromium | 10 | 9.1 | 0.5 | 0.62 |
| Copper | 2.7 | 2.7 | <0.5 | 0.55 |
| Iron | 62 | 39 | 1.4 | 2.3 |
| Lead | <0.5 | <0.5 | <0.5 | <0.5 |
| Manganese | 1.7 | 2.1 | <0.5 | <0.5 |
| Molybdenum | 1 | 0.87 | <0.5 | <0.5 |
| Nickel | 7.8 | 5.7 | <0.5 | <0.5 |
| Titanium | 3.8 | 2.6 | 0.84 | <0.5 |
| Zinc | 9.5 | 4.4 | 3 | 2.3 |
| Calcium | 74 | 10 | 3.2 | 6.3 |
| Magnesium | 11 | 5 | <0.5 | 12 |
| Potassium | 23 | 7.3 | 2.4 | 1.9 |
| Sodium | 19 | 4.8 | 1.4 | 1.3 |

As seen from Table 8, the relative amount of metallic impurities is generally less in the ink than it is in the slurry. Thus, the centrifugation process is correspondingly seen to be effective at removing impurities with metal elements.

Example 8

Laser Curing of Si Inks

This example demonstrates the laser sintering of the printed silicon nanoparticles to obtain reasonable levels of electrical conductivity for both junction diode type formats and solar cell contacts.

In a first set of experiments, phosphorous-doped particles as described in Example 2 were dispersed in isopropyl alcohol. These were spin coated onto a p-type silicon wafer. The solvent was dried. Then, an infrared laser was scanned to fuse the silicon at selected locations along the substrate. Silicon inks with different phosphorous dopant amounts were printed using notation n+ for 0.2 to 0.4 atomic %, n++ for 2 to 4 atomic % and n+++ for 7-8 atomic percent P.

Several silicon inks were sintered using an infrared laser. Specifically, a thicker layer 0.5-1.0 microns) was formed with silicon particles doped at a lower of phosphorous, and thinner layers (0.25-0.5 micron) were formed with Si particles doped at a greater level of phosphorous. The processing had significant tradeoffs. More intense sintering with the laser can result in damage to the underlying substrate. The printed was done onto a cleaned surface of a p-type silicon wafer having a 200 micro thickness and a 1-5 ohm-cm resistance. The sintered Si ink layer passed a tape peel test. The lowest measured sheet resistances for the different particle doping levels were as follows: n+++ 6-10 $\Omega/cm^2$, n++ 10-30 $\Omega/cm^2$ and n+ 30-40 $\Omega/cm^2$. The sintered Si ink layer had a conductivity that is generally 1.5-3 times lower than that of bulk Si at a given dopant level.

Figure 32:
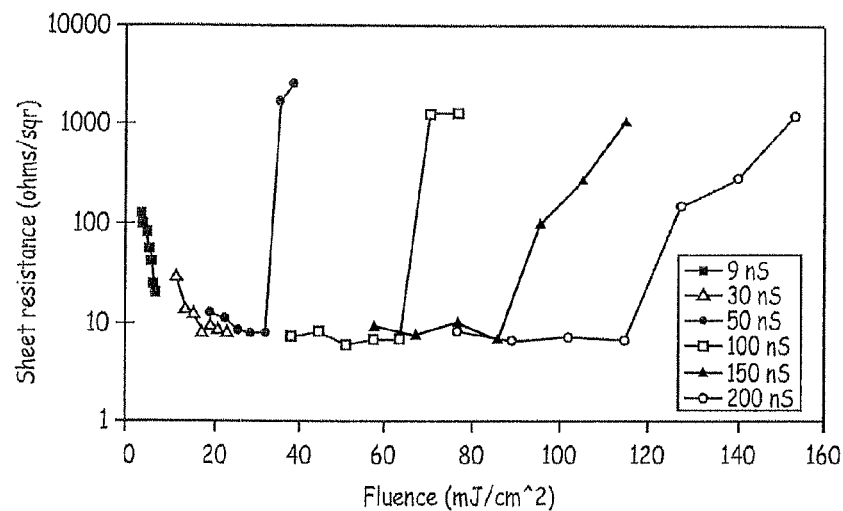
FIG. 32 is a graph containing plots of laser fluence versus sheet resistance at various pulse widths measured on an ink layer.
Figure 33:
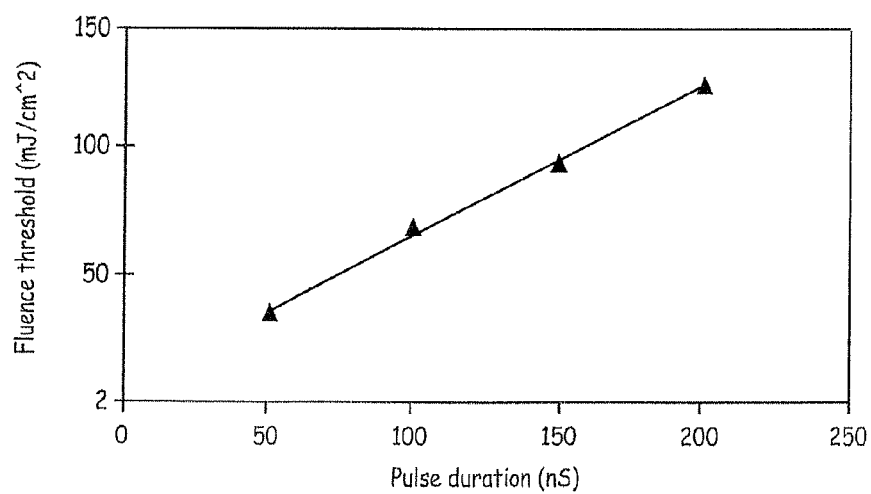
FIG. 33 is a plot of pulse duration versus fluence threshold measured on various sintered ink layers.

FIG. 32 is a plot of sheet resistance as a function of laser fluence for an n++ Si ink layer with a 500 nm thickness for 6 different laser pulse widths. The graph in FIG. 32 shows that the sheet resistance decreases with increasing fluence initially, and then remains relatively constant over a range of fluence. As fluence increases to the threshold value, sheet resistance increases abruptly, indicating laser damage. FIG. 33 shows a linear relationship between the fluence threshold and pulse duration.

Figure 34:
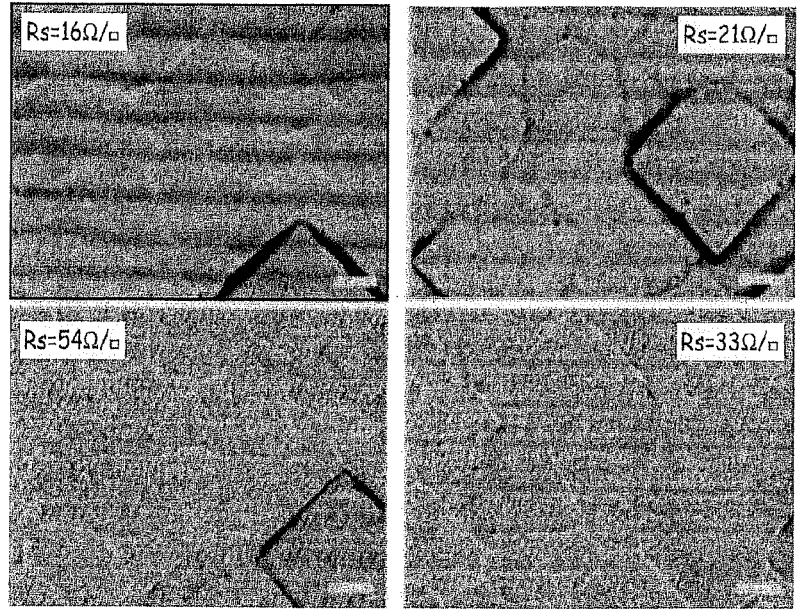
FIG. 34 is a composite of optical micrograph images of various sintered ink layers.
Figure 35:
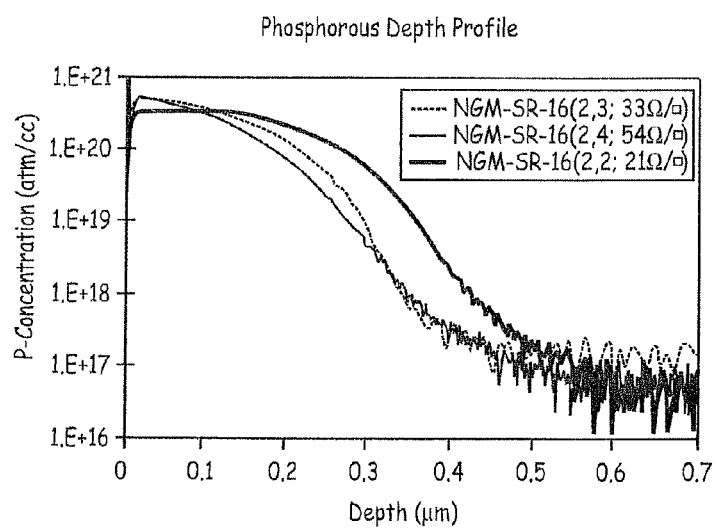
FIG. 35 is a graph containing plots of depth versus phosphorous concentration for various sintered ink layers.
Figure 36:
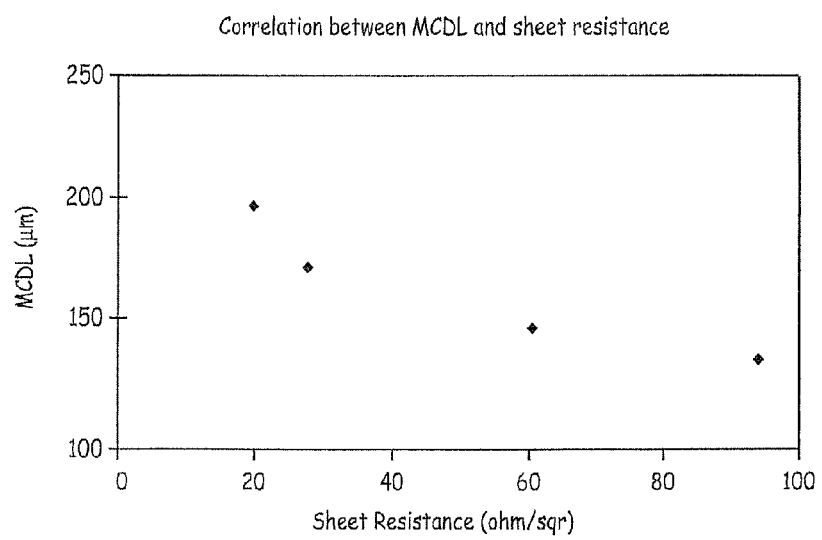
FIG. 36 is a plot of sheet resistance versus minority carrier diffusion length for various sintered ink layers.

The sheet resistance seemed consistent with surface morphology. Optical micrograph pictures are shown for samples with different sheet resistances in FIG. 34. Samples with lower sheet resistances had smoother surfaces. The dopant profile was measured using Secondary Ion Mass Spectrometry (SIMS) to evaluate the elemental composition along with sputtering or other etching to sample different depths from the surface. With a reasonable cutoff based on concentration, the depth of phosphorous was essentially 0.32 microns for a sample with a sheet resistance of 33 Ohm/(square). The depth profile is shown in FIG. 35. Sheets with lower resistance tended to have deeper penetration of P within the layer. The minority carrier diffusion length (MCDL) increased with a decrease in sheet resistance. A plot of MCDL as a function of sheet resistance is found in FIG. 36.

Figure 37:
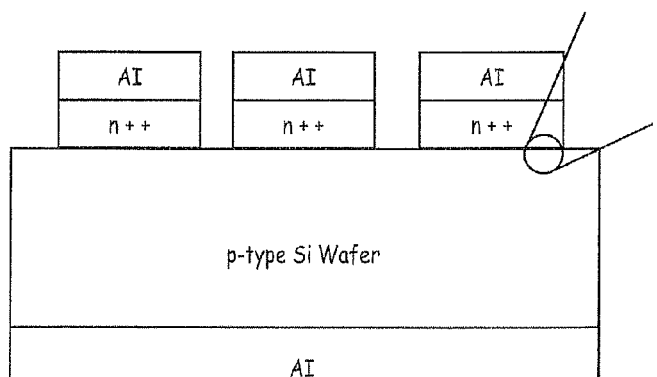
FIG. 37 is a schematic representation of a diode.

A schematic diagram of the diodes is shown in FIG. 37. P-type Si wafers used to fabricate p/n junctions diodes were 100 mm in diameter, 200 microns thick and 1-5 ohm-cm in resistivity. The wafers were etched in 25% KOH at 80° C. for 15 minutes to remove saw damage and then dipped in 2% HF for a few seconds to remove surface oxide. Inks formed from phosphorous doped Si particles were used to form p/n junction diodes. The particles for these inks had BET surface area based average particle sizes of 25 nm. One set of particles had a doping of $2\times10^{20}$ atoms of P per $cm^3$ and another set of particles had a doping of $1.5\times10^{21}$ atoms of P per $cm^3$. The particles were dispersed at 5 weight percent in isopropyl alcohol. The inks were applied by spin coating onto the entire surface of the wafer. The inks layer was dried at 85° C. in a glove box. The dried layers had a thickness from 0.250 to 1 micron.

Figure 38:
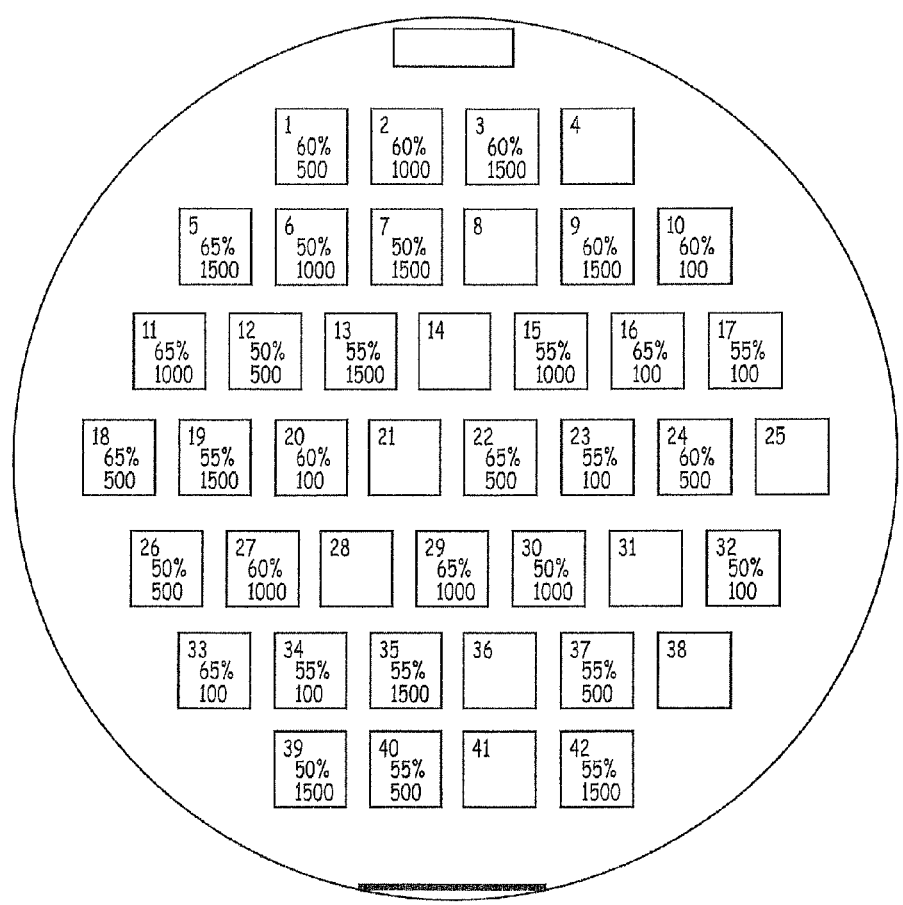
FIG. 38 is a schematic representation of a laser sintering pattern forming individual cells on a spin-coated ink layer.
Figure 39:
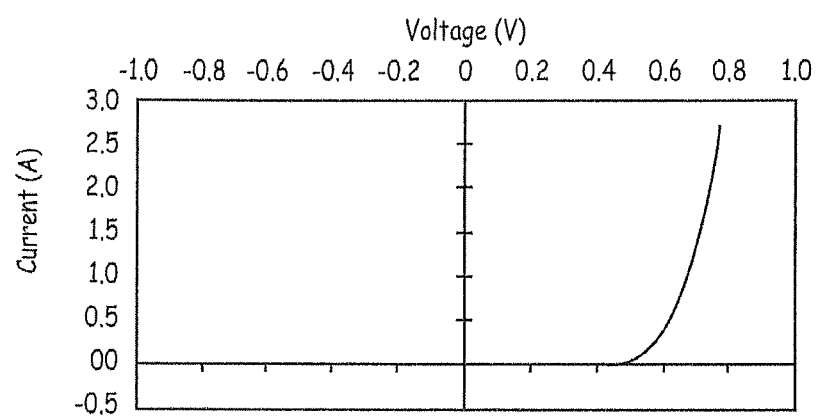
FIG. 39 is a plot of voltage versus current for a cell depicted in FIG. 38.

An infrared fiber laser was used to irradiate 42 1 cm×1 cm squares across the wafer as shown in FIG. 38 where the numbers in each square are the sequential cell number, the percentage of the laser power and scanning speed in mm/s. The laser was operated at a constant repetition rate of 500 kHz and a 16 W average power. After irradiation with the laser, the wafer was then immersed in 1% KOH in IPA till bubbles cease, about 2-3 minutes, at ambient temperature to removed "green" Si ink coating outside of the illuminated squares. Sheet resistances of the irradiated squares were in the range from 10 to ~700 ohms/sqr. Aluminum was deposited on the squares and the backside of the wafer to complete the diodes. Each square was a p/n junction diode. The best performing diode was from cell number 10, which was made from an ink of Si particles with phosphorous at $2\times10^{20}$ atm/$cm^3$ and an ink layer thickness of 500 nm. The sheet resistance of cell number 10 measured before Al deposition was 56.7 ohm/sqr. A plot of current as a function of voltage is shown in FIG. 39.

Example 9

Printing Properties of Si Pastes

This example demonstrates the printing properties of pastes comprising n++ doped silicon particles.

To test the printing properties of pastes, two silicon pastes were formed with silicon particles formed as described in Example 2. A first paste was formed with n++ doped silicon particles and a second paste was formed with p++ doped silicon nanoparticles. The silicon particles had an average primary particle diameter of about 20 nm. The pastes were formulated from dispersions comprising 17 weight percent doped silicon particles in ethylene glycol.

Figure 40:
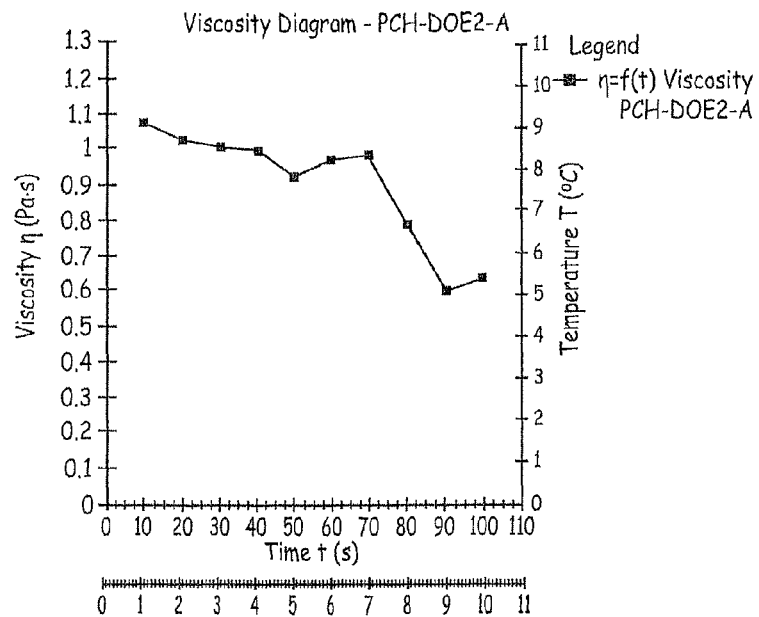
FIG. 40 is a plot of time versus viscosity for a paste comprising silicon particles.
Figure 41:
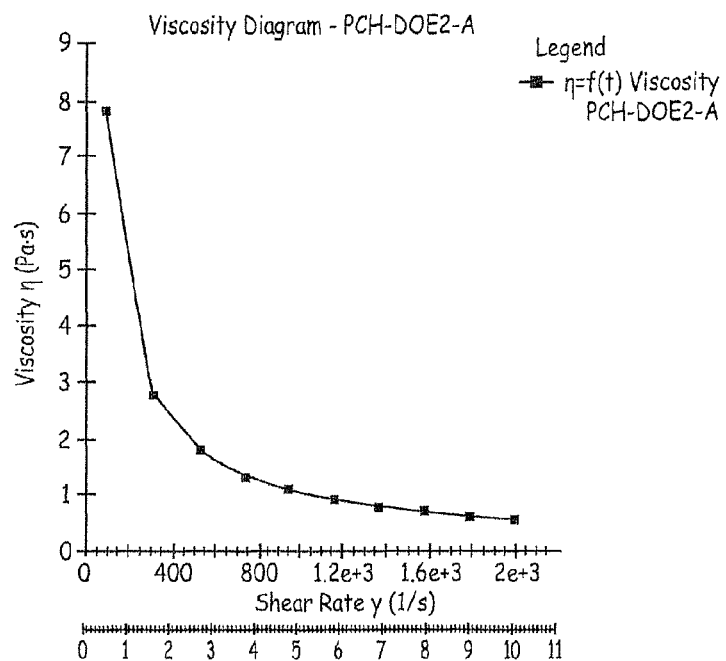
FIG. 41 is a plot of shear rate versus viscosity for a paste comprising silicon particles.

The viscosity of the first paste was shear rate dependant as well as time dependent at high shear. FIG. 40 is a plot of the time dependent viscosity at a constant shear rate of 1000 $s^{-1}$. FIG. 41 is a plot of the shear dependent viscosity over a range of shear rates from 100 $s^{-1}$-2000 $s^{-1}$. The viscosities were measured with a rheometer. Referring to FIG. 40, the viscosity decreased as a function of time over about 100 seconds with a minimum viscosity of about 0.600 PaS (pascal seconds) (1 PaS=1000 cP). Referring to FIG. 41, the viscosity also showed a non-linear dependence on shear rate. In particular, the viscosity decreased with increasing shear rate and had a minimum viscosity of about 0.544 PaS over the range of shear rates. The screen printing properties of the first paste were tested by using a Brookfield R/S-CPS rheometer to simulate screen printing conditions. The simulation comprised a pre-print step, a print, step, and a post-print step. The pre-print step comprised applying a shear rate to the paste at a frequency of 2 $s^{-1}$ in order to simulate the pre-stressed condition of a paste as it rests on a screen, the pre-stressed condition a result of stirring and spreading the paste. The print step comprised applying a shear rate to the paste at a frequency of 1000 $s^{-1}$ in order to simulate the printing step. The post-print step comprised applying a shear rate to the paste to the paste at a frequency of 2 $s^{-1}$ in order to simulate the recovery of the paste after the printing process. A summary of the simulation parameters in displayed in Table 9, below.

TABLE 9

| Simulation Step | Shear Rate ($s^{-1}$) | Time (s) |
| --- | --- | --- |
| Pre-Print | 2 | 60 |
| Print | 1000 | 60 |
| Post-Print | 2 | 180 |

Figure 42:
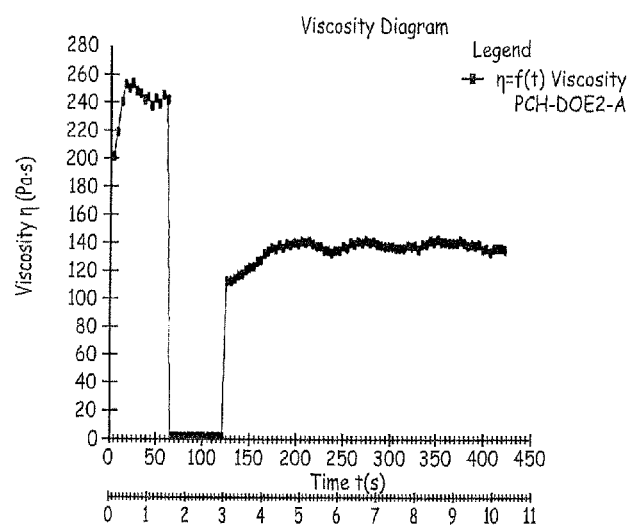
FIG. 42 is a plot of viscosity versus time for a paste over simulated screen printing conditions.

During the screen printing simulation, the viscosity decreased during the print step and increased during the recover step. FIG. 42 is a plot of the time dependent viscosity during the simulation. During the pre-print step, the viscosity increased non-monotonically from about 200 PaS to about 240 PaS. At the beginning the print step, the viscosity decreases to about 0.808 PaS. This result reflects the shear rate dependent viscosity displayed in FIG. 41. At the beginning of the post-print step, the viscosity increases to about 115 PaS and levels out at about 130 PaS after about 75. Notably, there is about a 100 PaS difference between the pre-print viscosity and the post-print viscosity, suggesting an irreversible change in the paste viscosity over the time period of the measurement indicating that the paste has a high thixotrophy.

Figure 43:
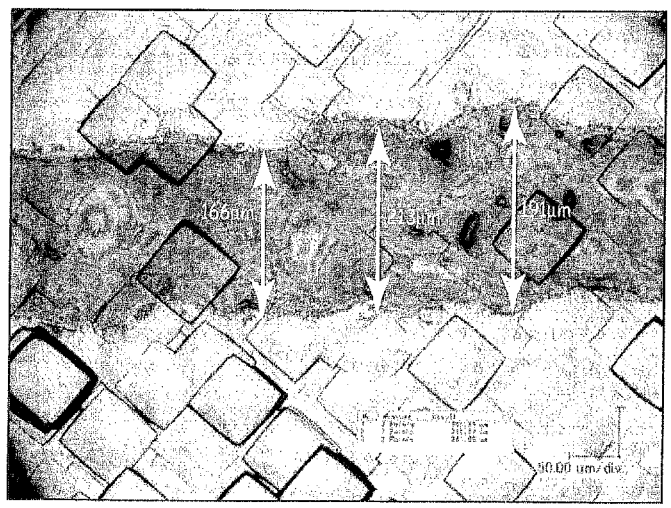
FIG. 43 is an optical microscope image of a line printed with a first width with a paste comprising n++ doped silicon particles.
Figure 44:
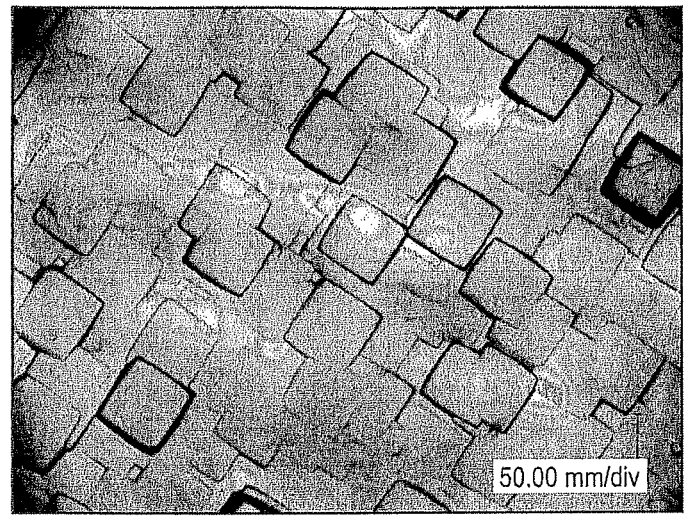
FIG. 44 is an optical microscope image of a broader line printed with a second width with a paste comprising n++ doped silicon particles.
Figure 45:
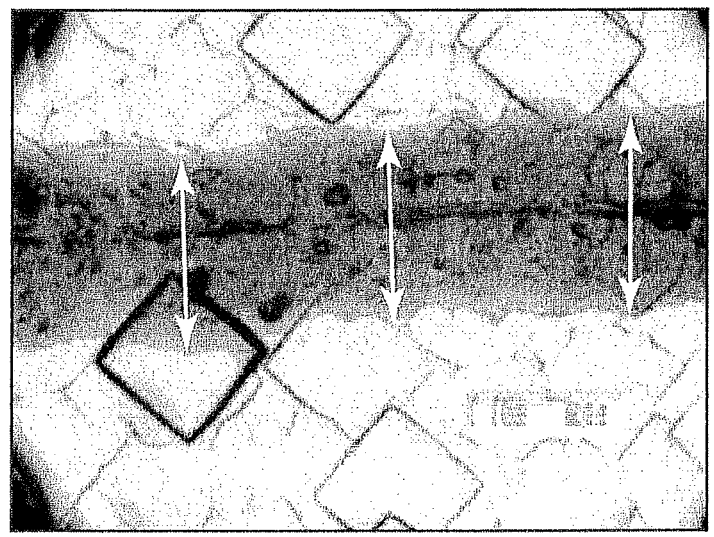
FIG. 45 is an optical microscope image of a line printed with a paste comprising p++ doped silicon particles.

The printing properties of the first and second pastes were tested by printing the pastes on a substrate. Lines were printed on a substrate over 30 minutes using a manual screen printer. The printed lines could be formed with desired printing properties with widths ranging from about 170 µm to about 310 µm and the thicknesses of the printed inks ranging from about 200 nm to about 5 µm. No clogging was observed over 30 minutes of printing. FIGS. 43-45 are optical micrograph images of printed lines. FIGS. 43 and 44 are optical micrograph images of lines printed with the first ink. FIG. 45 is an optical micrograph image of a line printed with the second paste.

Example 10

Impurities in Si Pastes

This example demonstrates the range and quantities of impurities in Si pastes.

To test the range and quantity of impurities in Si pastes, two silicon nanoparticle pastes were formed from n++ doped silicon particles formed as described in Example 2. The silicon particles had an average primary particle diameter of about 7 nm. Two pastes were formulated from a 6.3 weight percent dispersion of n++ doped silicon particles in a solvent comprising isopropyl alcohol. Additional efforts were made in the second sample in processing to further reduce the introduction of contaminants from the process equipment. The dispersion was sonicated and centrifuged. The composition and corresponding amount of impurities in the paste were measured using ICP-MS for the two pastes. The results of the ICP-MS analysis are displayed in Table 10.

TABLE 10

|  | Detection Limits (ppb) | Concentration in Sample 1 (ppb by wt) | Concentration in Sample 2 (ppb by wt) |
| --- | --- | --- | --- |
| Aluminum | 0.5 | 12 | 53 |
| Calcium | 1 | 110 | 380 |
| Chromium | 0.5 | 8.5 | 6 |
| Copper | 0.5 | 3.3 | 1.3 |
| Iron | 1 | 140 | 39 |
| Lead | 0.5 | <0.5 | 0.5 |
| Magnesium | 0.5 | 14 | 110 |
| Molybdenum | 0.5 | <0.5 | <0.5 |
| Nickel | 0.5 | 5.5 | 0.94 |
| Potassium | 1 | 61 | 78 |
| Sodium | 1 | 750 | 92 |
| Titanium | 0.5 | 4.1 | 3.1 |
| Zinc | 0.5 | 12 | 43 |

The samples exhibited very low contaminant levels, especially with respect to transition metal contaminants. Overall the second sample had lower transition metal contamination, although zinc contamination was somewhat higher in the second sample.

Example 10

Viscosity of Silicon Paste

This example demonstrates dependence of silicon paste viscosity on the concentration of silicon particles.

To demonstrate the viscosity dependence, several silicon pastes were formed. The pastes were formed from dispersions comprising n++ doped silicon particles with an average primary particle size of about 20 nm, synthesized as described in Example 2, above. The as synthesized particles were added to ethylene glycol ("EG") to form a dispersion. The resulting mixture was sonicated to form the pastes. Each paste was formulated with a silicon particle concentration of either 10 wt %, 11.5 wt %, 12.5 wt %, 14.5 wt %, 16 wt %, or 18 wt %. The viscosities of the various pastes were measured at shear rates of 2 $s^{-1}$ and 1000 $s^{-1}$ using a Brookfield R/S-CPS rheometer.

Figure 46:
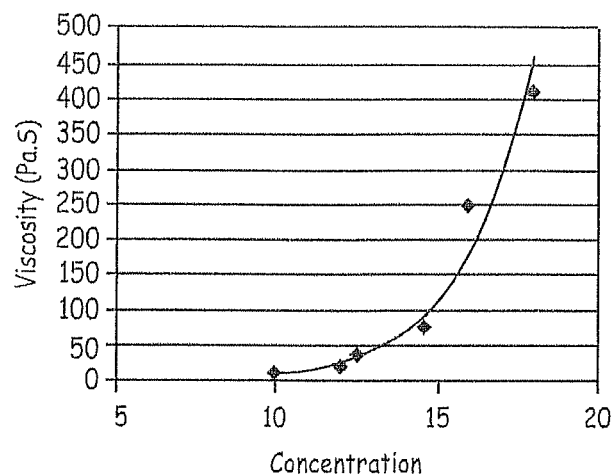
FIG. 46 is a plot of concentration versus viscosity at a shear rate of $2 \, s^{-1}$.
Figure 47:
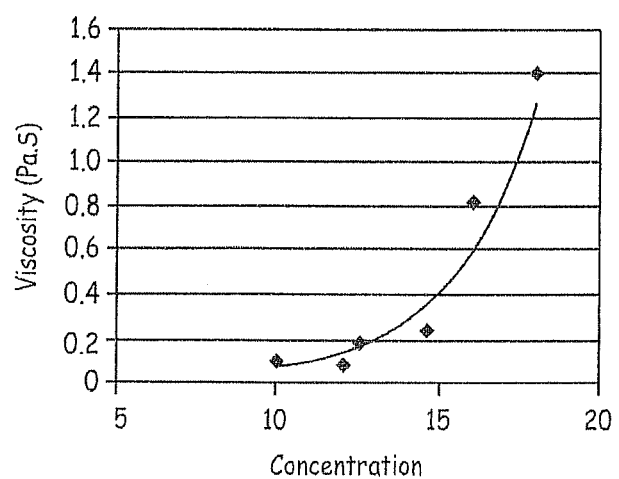
FIG. 47 is a plot of concentration versus viscosity at a shear rate of $1000 \, s^{-1}$.

At constant shear rate, the paste viscosity had a roughly exponential dependence on the silicon particle concentration. FIGS. 46 and 47 are plots of particle concentration versus viscosity for the pastes formed as described above, at shear rates of 2 $s^{-1}$ (FIG. 46) or 1000 $s^{-1}$ (FIG. 47). The points are measured viscosity data and the lines are exponential fits to the data. The viscosities measured at a shear rate of 2 $s^{-1}$ were substantially higher than the corresponding viscosities measure at a shear rate of 1000 $s^{-1}$. These results demonstrate that viscosities of silicon pastes can be selected over a wide range through the corresponding selection of the particle concentration over desirable ranges.

Example 11

Dispersibility of Particles with Various Solvents

This example demonstrates the dispersibility of silicon particles in various ink compositions as well as the effectiveness of various degglomeration processes.

To demonstrate dispersibility, a first set of samples was formed from silicon particles formed as described in Example 2 with about a 7 nm average primary particle size. For each sample, a dispersion was formed by combining an appropriate amount of silicon particle powder to a solvent. To form the first set of samples, one of three solvents were selected: ethylene glycol ("EG"), isopropyl alcohol ("IPA"), or n-methyl pyrrolidone ("NMP"). After combining the particles and the solvent, the resulting mixture was sonicated to disperse the particles. Each sample had a concentration of about 0.5 wt percent silicon particles. All of the samples exhibited some level of sedimentation within about 30 minutes. After this initial settling, stable dispersions were obtained. The dispersibility of silicon particles in each sample was then evaluated by measuring the Z-average particle size, i.e. secondary average particle size, of particles using DLS.

Figure 48:
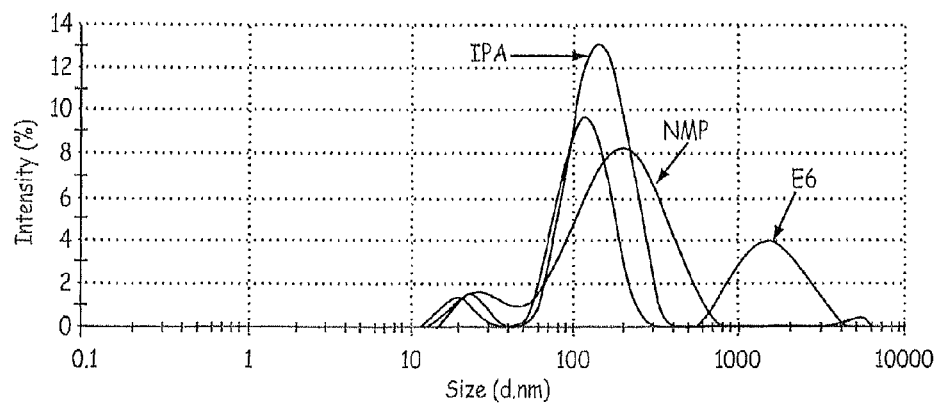
FIG. 48 is a graph containing plots of particle size versus relative intensity generated by DLS analysis on ink samples that were not centrifuged.

FIG. 48 is a graph containing plots of relative intensity versus particle size obtained from DLS analysis of these three samples. Based on these results, the sample comprising IPA had improved dispersibility relative to the samples that comprised other solvents, and NMP provided better dispersibility of the silicon particles than ethylene glycol. Referring to FIG. 48, the distributions of secondary particle sizes in all samples were multimodal, i.e. each distribution has a plurality of identifiable distinct peaks. Keeping in mind that the scattering intensity is a weighted distribution in which larger particles are weighted more than smaller particles, the number of particles that gave rise to the modes near about 20 nm was significant relative to the number of particles that gave rise to the modes near about 105 nm.

Figure 49:
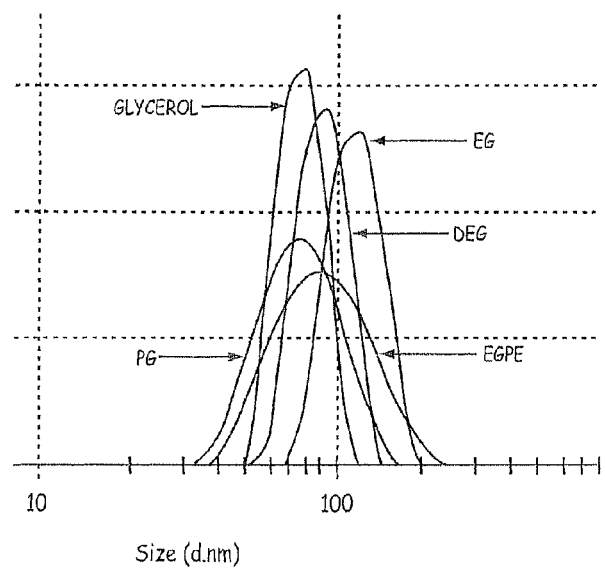
FIG. 49 is a graph containing plots of particle size versus relative intensity generated by DLS analysis on ink samples that were centrifuged.

Another set of samples were prepared with 5 different solvents to demonstrate the respective dispersability with these five solvents. The five solvents were ethylene glycol (EG), diethylene glycol (DEG), propylene glycol (PG), and ethylene glycol phenyl ether (EGPE). FIG. 49 is a graph containing plots of relative intensity versus particle size obtained from DLS analysis of the samples for these five solvents. Based on these results, the sample with the PG solvent had improved dispersibility relative to samples comprising other solvents. In particular, the characteristics of the distribution can be examined using the Z-average particle size and the distribution can be characterized. Specifically, the distribution width is reported as the polydispersity index (PDI). The PDI is a parameter that results from the light scattering calculations. Table 11 displays the Z-average particle size and polydispersity index for the samples, both calculated from the intensity distributions shown in FIG. 49. Table 11 reveals that silicon particles had the smallest Z-average particle size when dispersed with PG and had the most uniform distribution of secondary particles size when dispersed with DEG. On the other hand, silicon particles had the largest Z-average particle size and the least uniform distribution of secondary particle size when dispersed with glycerol. Based upon the data in FIG. 49 and Table 11, the degree of dispersibility of the silicon particles in the various solvents, ordered starting with better dispersability, was PG>DEG>EG>EGPE>glycerol.

TABLE 11

| Sample | Z-Average Particle Size (nm) | PDI |
| --- | --- | --- |
| EG | 111.3 | 0.089 |
| DEG | 89.7 | 0.07 |
| PG | 70.8 | 0.077 |
| EGPE | 82.2 | 0.153 |
| Glycerol | 128.9 | 1 |

Figure 50:
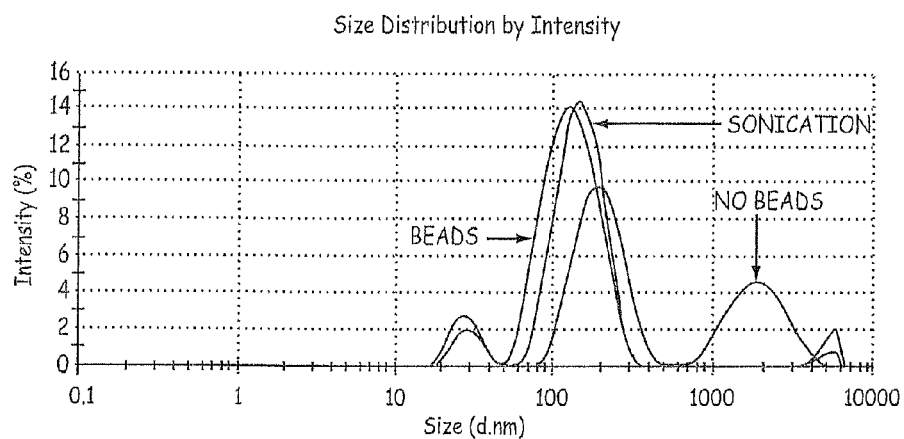
FIG. 50 is a graph containing plots of particle size versus relative intensity generated by DLS analysis on inks that were processed with planetary milling or bath sonication.

To demonstrate the effectiveness of deagglomeration processes, three additional sets of samples were prepared by forming dispersions and subsequently processing the dispersions to deagglomerate the silicon particles therein. In particular, a first set of three samples were prepared at 0.5 wt percent in ethylene glycol. One sample was deagglomerated using test bath sonication, a second sample was processed with centrifugal planetary milling without beads, and a third sample was processed with centrifugal planetary milling with fused zirconia beads having a diameter between about 100 μm to about 200 μm. Test bath sonication was done for about 3 hours. Centrifugal planetary milling was done for about 10 minutes at about 2000 rpm using a Thinky ARE-250 Planetary Mixer. The dispersibility of silicon particles in each sample was then assessed by measuring the Z-average particle size of particles in the various samples using DLS. FIG. 50 is a graph containing plots of relative intensity versus particle size obtained from DLS analysis of the three samples. The sample prepared with centrifugal planetary milling with beads had a Z-average particle size of 109 nm, while the sample prepared with centrifugal planetary milling without milling beads had a Z-average particle size of 192 nm. The sample sonicated with test bath sonication had a Z-average particle size of 116 nm, which is close to the value obtained with centrifugal planetary milling with beads.

Figure 51:
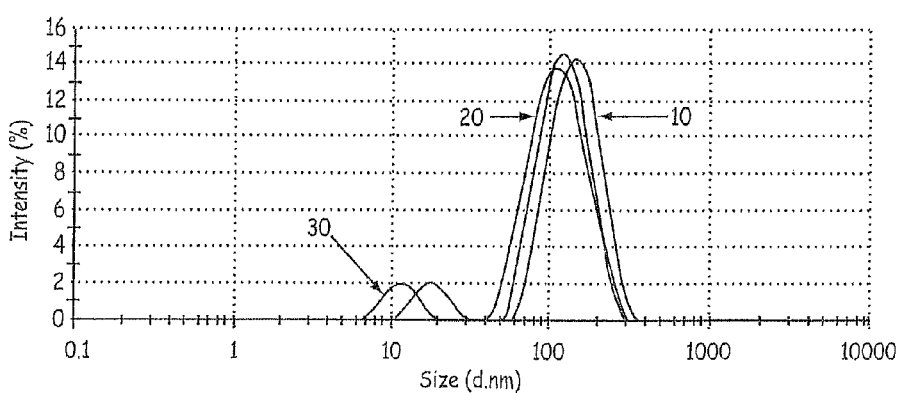
FIG. 51 is a graph containing plots of particle size versus relative intensity generated by DLS analysis on inks that were processed with probe sonication for various time periods.

Another set of samples was processed with varying times of probe sonication. The dispersability of silicon particles in each sample was then measured by measuring the Z-average particle size of particles in the various samples using DLS. The samples were prepared with non-doped silicon particles with an average primary particle size of about 7 nm at 2.5 wt. percent in ethylene glycol. After performing the probe sonication, the samples were diluted to 0.5 wt. percent to perform the DLS measurements. FIG. 51 is a graph containing plots of relative intensity versus particle size obtained from DLS analysis of samples processed with varying lengths of sonication times. Increased probe sonication times increased the effectiveness of the process as a deagglomeration process. Specifically, the Z-average particle sizes decreased with increasing sonication times with samples processed with sonication times of 10 minutes, 20 minutes and 30 minutes having respective Z-average particle sizes of 98 nm, 88 nm and 77 nm. Based on these results, probe sonication was a more effective deagglomeration process relative to planetary milling and bath sonication since probe sonication achieved smaller Z-average particle sizes, with values below 100 nm.

The specific embodiments above are intended to be illustrative and not limiting. Additional embodiments are within the broad concepts described herein. In addition, although the present invention has been described with reference to particular embodiments, those skilled in the art will recognize that changes can be made in form and detail without departing from the spirit and scope of the invention. Any incorporation by reference of documents above is limited such that no subject matter is incorporated that is contrary to the explicit disclosure herein.

What is claimed is:

1. A dispersion comprising at least about 0.05 weight percent elemental silicon/germanium nanoparticles having an average primary particle diameter of no more than about 250 nanometers, wherein the nanoparticles comprise no more than about 200 parts per billion of iron by weight.

2. The dispersion of claim 1 having at least about 1 weight percent elemental silicon/germanium nanoparticles.

3. The dispersion of claim 1 wherein the nanoparticles have an average primary particle diameter of no more than about 50 nm.

4. The dispersion of claim 1 wherein the nanoparticles comprise no more than about 100 parts per billion of iron by weight.

5. The dispersion of claim 1 wherein the dispersion has no more than about 1 part per million by weight metal contamination.

6. The dispersion of claim 1 wherein the nanoparticles comprise a dopant.

7. The dispersion of claim 6 wherein the nanoparticles have a dopant concentration of at least 0.5 atomic percent.

8. The dispersion of claim 6 wherein the nanoparticles have a dopant concentration from about $11.0 \times 10^{-7}$ to about $5.0 \times 10^{-3}$ atomic percent.

9. The dispersion of claim 6 wherein the dopant is phosphorous.

10. The dispersion of claim wherein the dopant is boron.

11. The dispersion of claim 1 having a Z-average secondary particle size of no more than about 200 nm.

12. The dispersion of claim 1 comprising at least about 1 percent by weight elemental silicon nanoparticles, from about 5 weight percent to about 65 weight percent alcohol and from about 10 weight percent to about 85 weight percent of a polar aprotic solvent, wherein the dispersion has a viscosity from about 2 mPa·s to about 25 mPa·s and surface tension from about 20 dynes/cm to about 70 dynes/cm.

13. The dispersion of claim 1 comprising at least about 1 weight percent elemental silicon nanoparticles, from about 025 to about 10 weight percent alcohol having a boiling point of no more than about 160° C., from about 65 weight percent to about 94.75 weight percent of a liquid having a boiling point of at least about 175° C., wherein the dispersion has a viscosity from about 10 Pa·s to about 300 Pa·s.

14. The dispersion of claim 1 comprising an alcohol solvent.

15. The dispersion of claim 1 wherein the dispersion is stable with respect to settling of particles for 1 week without mixing.

16. A collection of silicon/germanium nanoparticles having an average primary particle diameter of no more than about 250 nm and wherein the nanoparticles comprise no more than about 1 part per million of iron.

17. The collection of silicon/germanium nanoparticles of claim 16 wherein the nanoparticles have an average primary particle diameter of no more than about 100 nm.

18. The collection of silicon/germanium nanoparticles of claim 16 wherein the level of total metal contamination is no more than about 5 parts per million.

19. The collection of silicon/germanium nanoparticles of claim 16 wherein the nanoparticles comprise no more than about 200 parts per billion of iron.

20. The collection of silicon/germanium nanoparticles of claim 19 wherein the nanoparticles comprise no more than about 100 parts per billion of iron.

21. The collection of silicon/germanium nanoparticles of claim 16 wherein the nanoparticles comprise a dopant.

22. The collection of silicon/germanium nanoparticles of claim 21 wherein the nanoparticles have a dopant concentration of about $1.0 \times 10^{-7}$ atomic percent to about $5.0 \times 10^{-3}$ atomic percent.

23. The collection of silicon/germanium nanoparticles of claim 21 wherein the nanoparticles have a dopant concentration from about 0.25 atomic percent to about 15 atomic percent.

24. The collection of silicon/germanium nanoparticles of claim 21 wherein the dopant comprises phosphorous.

25. The collection of silicon/germanium nanoparticles of claim 21 wherein the dopant comprises boron.

* * * * *